United States Patent
Park et al.

(10) Patent No.: US 12,221,454 B2
(45) Date of Patent: Feb. 11, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Bumwoo Park, Yongin-si (KR); Ohyun Kwon, Seoul (KR); Virendra Kumar RAI, Hwaseong-si (KR); Sungmin Kim, Incheon (KR); Sunghun Lee, Hwaseong-si (KR); Hwayoung Cho, Hwaseong-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 457 days.

(21) Appl. No.: 17/217,638

(22) Filed: Mar. 30, 2021

(65) Prior Publication Data
US 2022/0127287 A1    Apr. 28, 2022

(30) Foreign Application Priority Data
Oct. 28, 2020    (KR) ........................ 10-2020-0141569

(51) Int. Cl.
*H01L 51/00*    (2006.01)
*C07F 15/00*    (2006.01)
(Continued)

(52) U.S. Cl.
CPC ....... *C07F 15/0033* (2013.01); *H10K 85/342* (2023.02); *H10K 50/15* (2023.02); *H10K 50/16* (2023.02); *H10K 50/18* (2023.02)

(58) Field of Classification Search
CPC .............. C07F 15/0033; H10K 85/342; C09K 2211/185
See application file for complete search history.

(56) References Cited

U.S. PATENT DOCUMENTS 7,279,704 B2 * 10/2007 Walters ................. H05B 33/14
257/40
8,492,007 B2    7/2013 Kobayashi et al.
(Continued)

FOREIGN PATENT DOCUMENTS

CN    102659846 A    9/2012
JP    2004002344 A    1/2004
(Continued)

OTHER PUBLICATIONS

Hui-Ting Mao et al., "Achieving High Performances of Nondoped OLEDs Using Carbazole and Diphenylphosphoryl-Functionalized Ir(III) Complexes as Active Components," Inorganic Chemistry, Aug. 10, 2017, pp. 9979-9987, vol. 56.
(Continued)

*Primary Examiner* — Alexander C Kollias
(74) *Attorney, Agent, or Firm* — CANTOR COLBURN LLP

(57) ABSTRACT

An organometallic compound represented by Formula 1:

$$M(L_1)_{n1}(L_2)_{n2} \qquad \text{Formula 1}$$

wherein M is a transition metal, $L_1$ is a ligand represented by Formula 2, $L_2$ is a monodentate ligand, a bidentate ligand, a tridentate ligand, or a tetradentate ligand, n1 is 1, 2, or 3, n2 is 0, 1, 2, 3, or 4, and Formula 2 is as described herein.

17 Claims, 1 Drawing Sheet

(51) Int. Cl.
*H10K 85/30* (2023.01)
*H10K 50/15* (2023.01)
*H10K 50/16* (2023.01)
*H10K 50/18* (2023.01)

(56) References Cited

U.S. PATENT DOCUMENTS

| | | |
|---|---|---|
| 2010/0141127 A1 | 6/2010 | Chuanjun et al. |
| 2011/0227050 A1* | 9/2011 | Kobayashi ............. C08G 61/12 257/E51.027 |
| 2012/0292600 A1 | 11/2012 | Kottas et al. |
| 2012/0292601 A1* | 11/2012 | Kottas ................... H05B 33/14 546/4 |
| 2013/0116755 A1 | 5/2013 | Manouk et al. |
| 2013/0181190 A1 | 7/2013 | Ma et al. |
| 2017/0373259 A1* | 12/2017 | Su ........................ H10K 85/654 |

FOREIGN PATENT DOCUMENTS

| | | |
|---|---|---|
| JP | 2010118381 A | 5/2010 |
| KR | 1020090073850 A | 7/2009 |

OTHER PUBLICATIONS

Junqiao Ding et al., "Bifunctional Green Iridium Dendrimers with a "Self-Host" Feature for Highly Efficient Nondoped Electrophosphorescent Devices," Communications, Angew. Chem. Aug. 7, 2009, pp. 6664-6666, vol. 48.
KR Office Action issued Sep. 19, 2024 of KR Patent Application No. 10-2020-0141569.

* cited by examiner

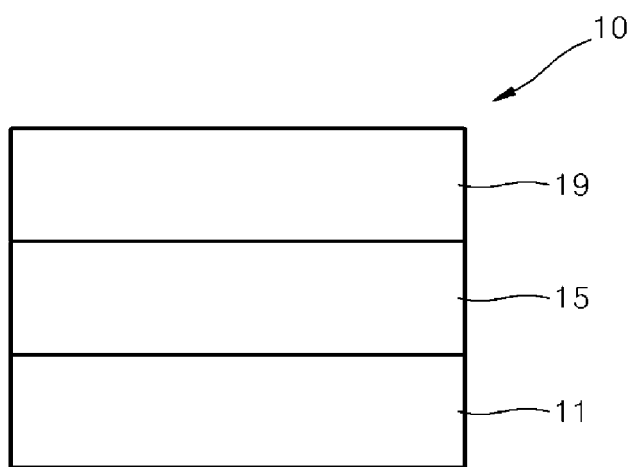

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2020-0141569, filed on Oct. 28, 2020, in the Korean Intellectual Property Office, and all the benefits accruing therefrom under 35 U.S.C. § 119, the content of which is incorporated by reference herein in its entirety.

BACKGROUND

1. Field

One or more embodiments relate to an organometallic compound, an organic light-emitting device including the same, and an electronic apparatus including the organic light-emitting device.

2. Description of Related Art

Organic light-emitting devices (OLEDs) are self-emission devices, which have improved characteristics in terms of viewing angles, response time, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

One or more exemplary embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented exemplary embodiments of the disclosure.

According to an aspect, provided is an organometallic compound represented by Formula 1.

$$M(L_1)_{n1}(L_2)_{n2} \qquad \text{Formula 1}$$

In Formula 1,

M is a transition metal, $L_1$ is a ligand represented by Formula 2, n1 is 1, 2, or 3, and when n1 is 2 or more, two or more of $L_1$(s) are identical to or different from each other, $L_2$ is a monodentate ligand, a bidentate ligand, a tridentate ligand, or a tetradentate ligand, n2 is 0, 1, 2, 3, or 4, and when n2 is 2 or more, two or more of $L_2$(s) are identical to or different from each other, and $L_1$ and $L_2$ are different from each other,

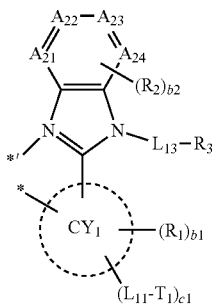

Formula 2

In Formula 2, $A_{21}$ to $A_{24}$ may each independently be N or C, $L_{11}$ and $L_{13}$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, ring $CY_1$ may be a $C_5$-$C_{30}$ carbocyclic group or a $C_1$-$C_{30}$ heterocyclic group, wherein, ring $CY_1$ is not a benzene group when $A_{21}$ to $A_{24}$ are each C and $L_{11}$ is a single bond or a $C_5$-$C_{30}$ carbocyclic group that is unsubstituted or substituted with at least one $R_{10a}$, $R_1$ to $R_3$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), b1 is an integer from 0 to 20, b2 is an integer from 0 to 4, $T_1$ is a carbazole group unsubstituted or substituted with at least one $R_{10a}$, c1 is an integer from 1 to 5, two or more of a plurality of $R_1(s)$ are optionally linked to each other to form a $C_5$-$C_{30}$ carbocyclic group that is unsubstituted or substituted with at least one $R_{10a}$, or two or more of a plurality of $R_2(s)$ are optionally linked to each other to form a $C_1$-$C_{30}$ heterocyclic group that is unsubstituted or substituted with at least one $R_{10a}$, two or more of a plurality of $R_2(s)$ are optionally linked to each other to form a $C_5$-$C_{30}$ carbocyclic group that is unsubstituted or substituted with at least one $R_{10a}$, or two or more of a plurality of $R_2(s)$ are optionally linked to each other to form a $C_1$-$C_{30}$ heterocyclic group that is unsubstituted or substituted with at least one $R_{10a}$, two or more of $R_1$ to $R_3$ may be optionally linked to each other to form a $C_5$-$C_{30}$ carbocyclic group that is unsubstituted or substituted with at least one $R_{10a}$, or two or more of $R_1$ to $R_3$ are optionally linked to each other to form a $C_1$-$C_{30}$ heterocyclic group that is unsubstituted or substituted with at least one $R_{10a}$, $R_{10a}$ is the same as described in connection with $R_1$, and *' each indicate a binding site to M in Formula 1, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, or —$P(Q_{18})(Q_{19})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, or —$P(Q_{28})(Q_{29})$, —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently:

hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer located between the first electrode and the second electrode and including an emission layer, wherein the organic layer includes at least one organometallic compound represented by Formula 1.

The organometallic compound may be included in the emission layer, and the organometallic compound included in the emission layer may act as a dopant.

According to another aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with the accompanying drawing, in which FIGURE shows a schematic cross-sectional view of an organic light-emitting device according to one or more embodiments.

DETAILED DESCRIPTION

Reference will now be made in detail to exemplary embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

According to one or more aspects, the organometallic compound is represented by Formula 1:

$$M(L_1)_{n1}(L_2)_{n2} \qquad \text{Formula 1}$$

wherein M in Formula 1 is a transition metal.

In one or more embodiments, M may be a first-row transition metal of the Periodic Table of Elements, a second-row transition metal of the Periodic Table of Elements, or a third-row transition metal of the Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

$L_1$ in Formula 1 is a ligand represented by Formula 2:

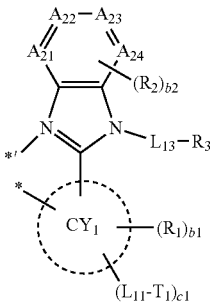

Formula 2

The description of Formula 2 is the same as described in the present specification.

n1 in Formula 1 indicates the number of $L_1(s)$ and is 1, 2, or 3. When n1 is 2 or more, two or more of $L_1(s)$ are identical to or different from each other. In one or more embodiments, n1 may be 1 or 2.

$L_2$ in Formula 1 is a monodentate ligand, a bidentate ligand, a tridentate ligand, or a tetradentate ligand. The description of $L_2$ is the same as described in the present specification.

n2 in Formula 2 indicates the number of $L_2(s)$ and is 0, 1, 2, 3, or 4. When n2 is 2 or more, two or more of $L_2(s)$ are identical to or different from each other. In one or more embodiments, n2 may be 0, 1, or 2.

$L_1$ and $L_2$ in Formula 1 are different from each other.

In one or more embodiments, in Formula 1,

M may be Ir or Os, and the sum of n1 and n2 may be 3 or 4; or

M may be Pt, and the sum of n1 and n2 may be 2.

In one or more embodiments, in Formula 1,

M may be Ir, n1 and n2 may each independently be 1 or 2, and the sum of n1 and n2 may be 3.

In one or more embodiments, in Formula 1,

M may be Ir, n1 may be 3, and n2 may be 0. In this case, three $L_1$(s) may be identical to each other.

$A_{21}$ to $A_{24}$ in Formula 2 are each independently be N or C.

In one or more embodiments, $A_{21}$ to $A_{24}$ may be C.

In one or more embodiments, one or two of $A_{21}$ to $A_{24}$ may be N.

$L_{11}$ and $L_{13}$ in Formula 2 are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In one or more embodiments, $L_{11}$ and $L_{13}$ in Formula 2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$.

In one or more embodiments, $L_{11}$ and $L_{13}$ in Formula 2 may each independently be:

a single bond; or a benzene group, a naphthalene group, a pyridine group, a dibenzofuran group, a dibenzothiophene group, or a carbazole group, each unsubstituted or substituted with at least one $R_{10a}$.

ring $CY_1$ in Formula 2 is a $C_5$-$C_{30}$ carbocyclic group or a $C_1$-$C_{30}$ heterocyclic group, wherein, ring $CY_1$ is not a benzene group when a) $A_{21}$ to $A_{24}$ are each C and b) $L_{11}$ is a single bond or a $C_5$-$C_{30}$ carbocyclic group that is unsubstituted or substituted with at least one $R_{10a}$.

In one or more embodiments, when ring $CY_1$ in Formula 2 is a $C_5$-$C_{30}$ carbocyclic group or a $C_1$-$C_{30}$ heterocyclic group and $A_{21}$ to $A_{24}$ are each C, ring $CY_1$ may not be a benzene group.

In one or more embodiments, when ring $CY_1$ in Formula 2 may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring is a cyclopentane group, a cyclopentadiene group, a furan group, a thiophene group, a pyrrole group, a silole group, a borole group, a germole group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azaborole group, an azagermole group, or an azaphosphole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_1$ in Formula 1 may be i) a first ring or ii) a second ring.

In one or more embodiments, ring $CY_1$ in Formula 2 may not be a benzene group.

In one or more embodiments, ring $CY_1$ in Formula 2 may be a condensed cyclic group in which two or more cyclic groups are condensed with each other.

In one or more embodiments, ring $CY_1$ in Formula may be iii) a condensed cyclic group in which two or more first rings are condensed with each other, iv) a condensed cyclic group in which two or more second rings are condensed with each other, or v) a condensed cyclic ring in which at least one first ring is condensed with at least second ring.

In one or more embodiments, ring $CY_1$ in Formula 2 may be a cyclopentane group, a cyclohexane group, a cycloheptane group, a cyclopentene group, a cyclohexene group, a cycloheptene group, an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a 1,2,3,4-tetrahydronaphthalene group, a benzene group condensed with a norbornane group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, when $A_{21}$ to $A_{24}$ in Formula 2 are each C, i) ring $CY_1$ may be a condensed cyclic group in which two or more cyclic groups are condensed with each other, and/or ii) $L_{11}$ may be a $C_1$-$C_{30}$ heterocyclic group that is unsubstituted or substituted with at least one $R_{10a}$.

In one or more embodiments, ring $CY_1$ in Formula 2 may be a benzene group, a pyridine group, a pyrimidine group, a naphthalene group, an anthracene group, a phenanthrene group, a pyrene group, a chrysene group, a fluorene group, a carbazole group, a dibenzofuran group, a dibenzothiophene group, or dibenzosilole group.

In one or more embodiments, ring $CY_1$ in Formula 2 may be a naphthalene group, an anthracene group, a phenanthrene group, a triphenylene group, a pyrene group, a chrysene group, a fluorene group, a carbazole group, a dibenzofuran group, a dibenzothiophene group, or a dibenzosilole group.

$R_1$ to $R_3$ in Formula 2 are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$). $Q_1$ to $Q_9$ are the same as described in the present specification.

In one or more embodiments, $R_1$ to $R_3$ in Formula 2 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group (a ($C_1$-$C_{20}$ alkyl)bicyclo[2.2.1]heptyl group), a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $Q_1$ to $Q_9$ may each independently be: deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, $C_1$-$C_{10}$ alkyl group, or a phenyl group.

In one or more embodiments, $R_1$ to $R_3$ in Formula 2 may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-236, a group represented by one of Formulae 9-201 to 9-236 in which at least one hydrogen is substituted with deuterium, a group represented by one of Formulae 9-201 to 9-236 in which at least one hydrogen is substituted with —F, a group represented by one of Formulae 10-1 to 10-130, a group represented by one of Formulae 10-1 to 10-130 in which at least one hydrogen is substituted with deuterium, a group represented by one of Formulae 10-1 to 10-130 in which at least one hydrogen is substituted with —F, a group represented by one of Formulae 10-201 to 10-358, a group represented by one of Formulae 10-201 to 10-358 in which at least one hydrogen is substituted with deuterium, a group represented by one of Formulae 10-201 to 10-358 in which at least one hydrogen is substituted with —F, —Si($Q_3$)($Q_4$)($Q_5$), or —Ge($Q_3$)($Q_4$)($Q_5$), wherein the description of $Q_3$ to $Q_5$ are each the same as described in the present specification:

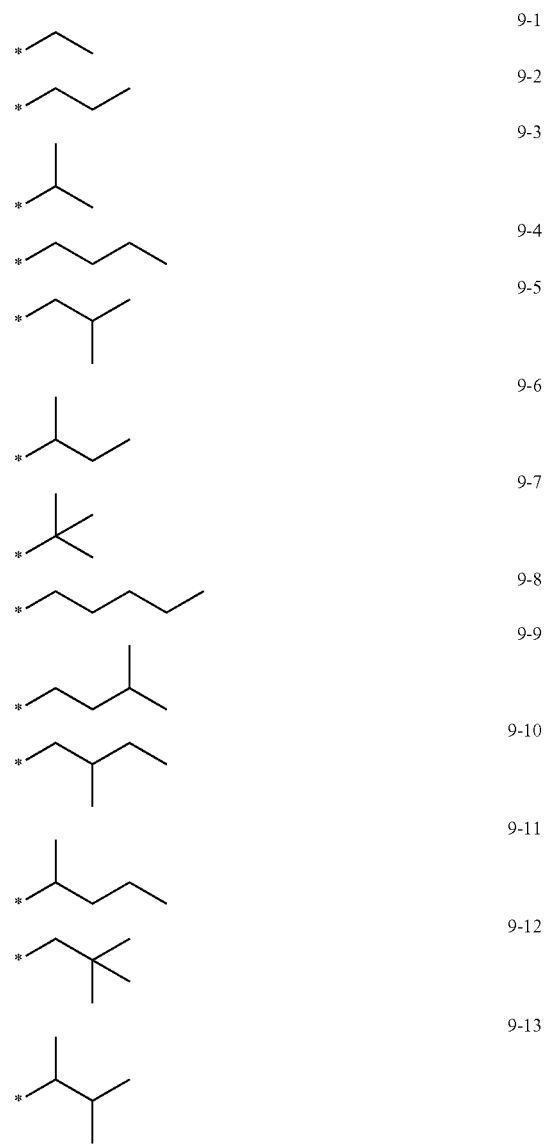

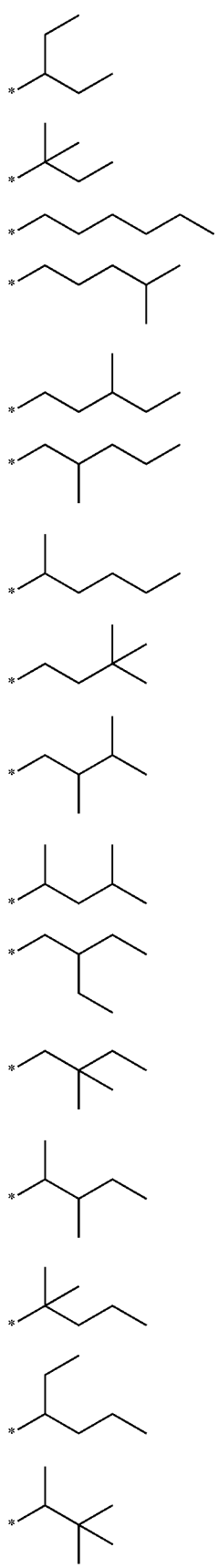
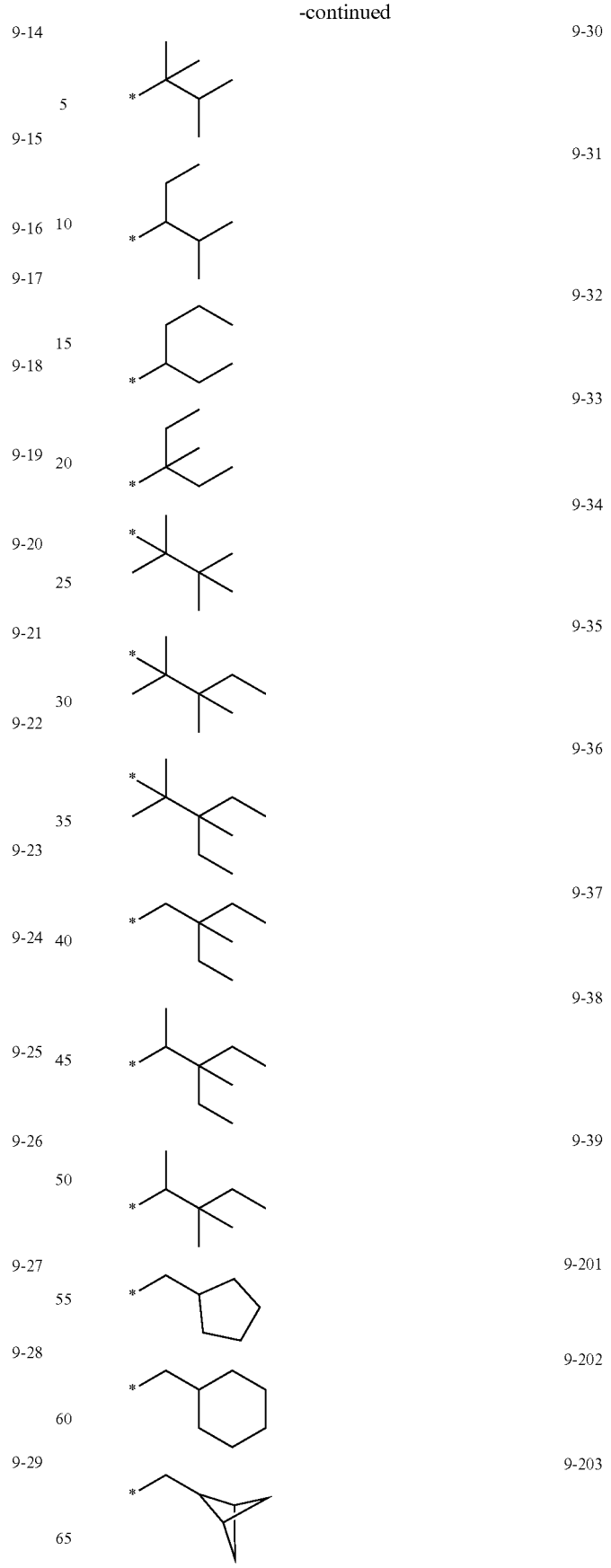

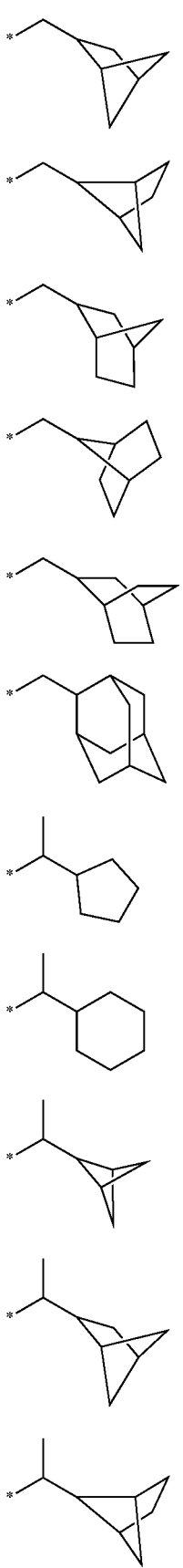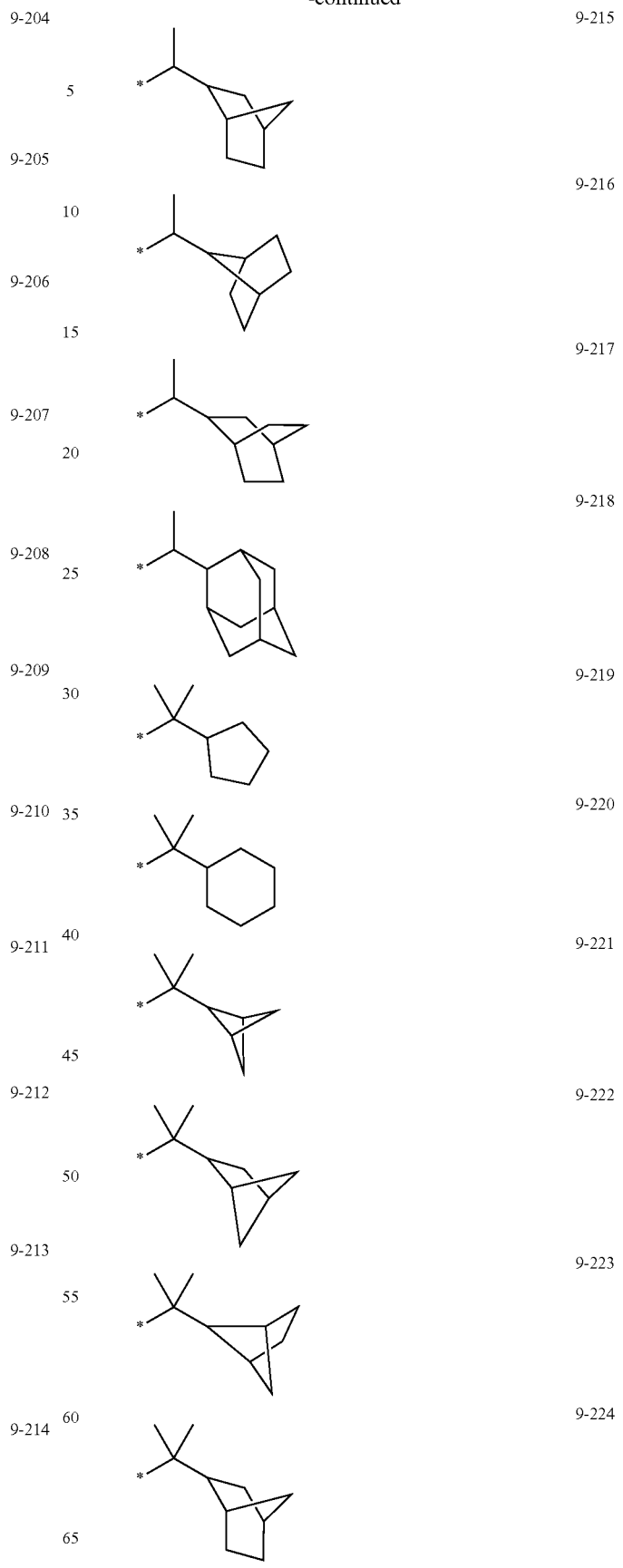

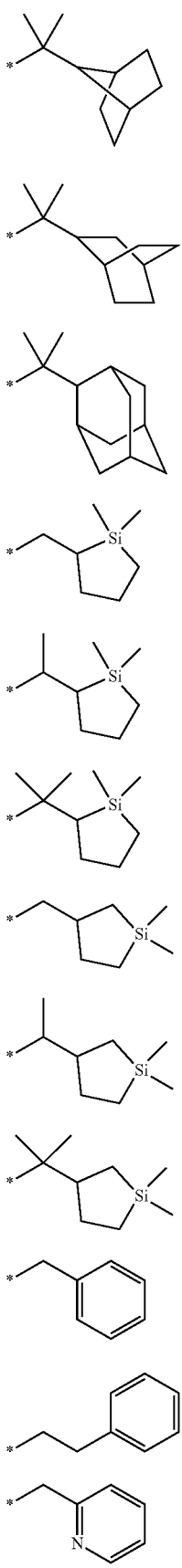
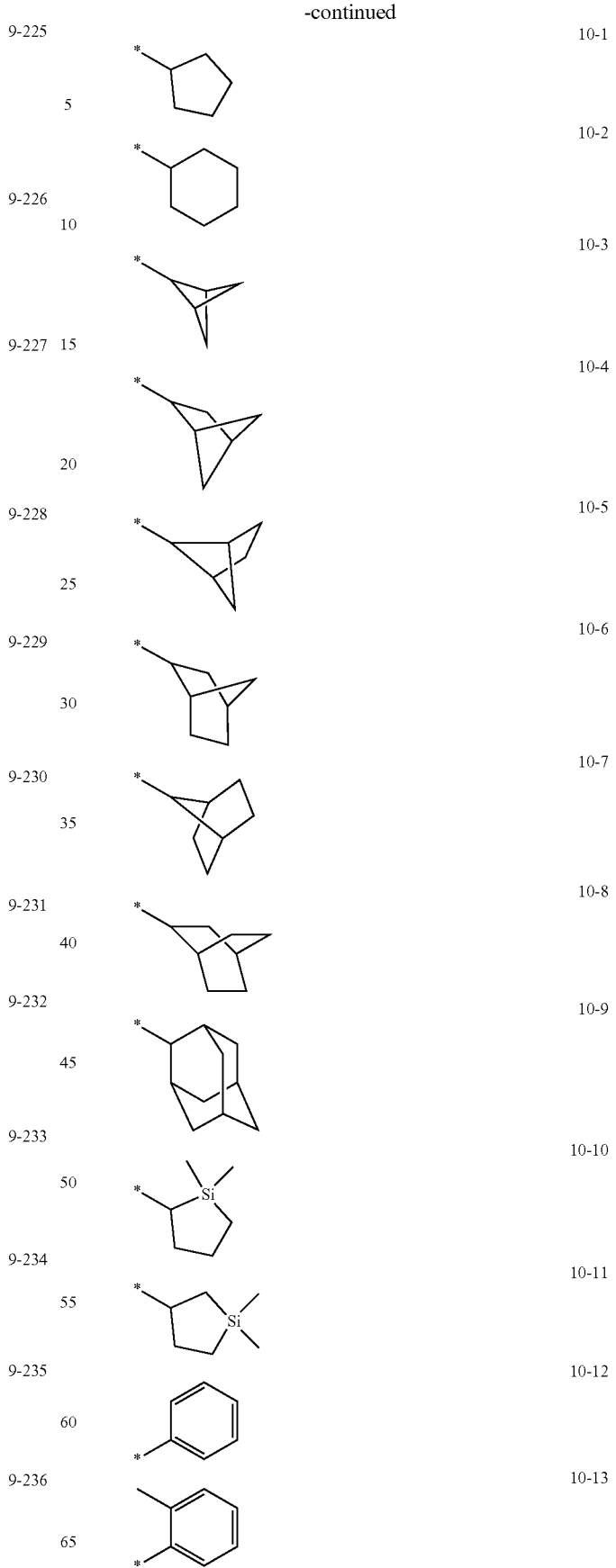

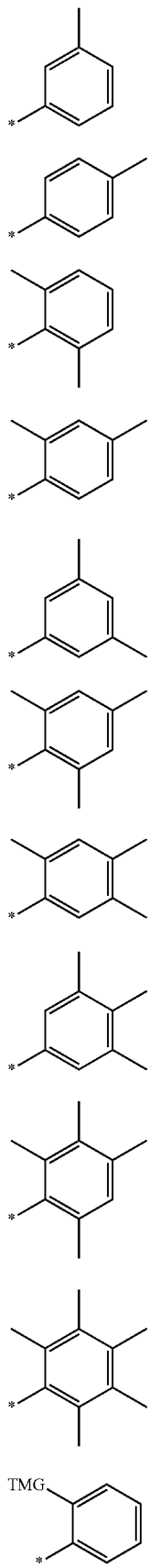
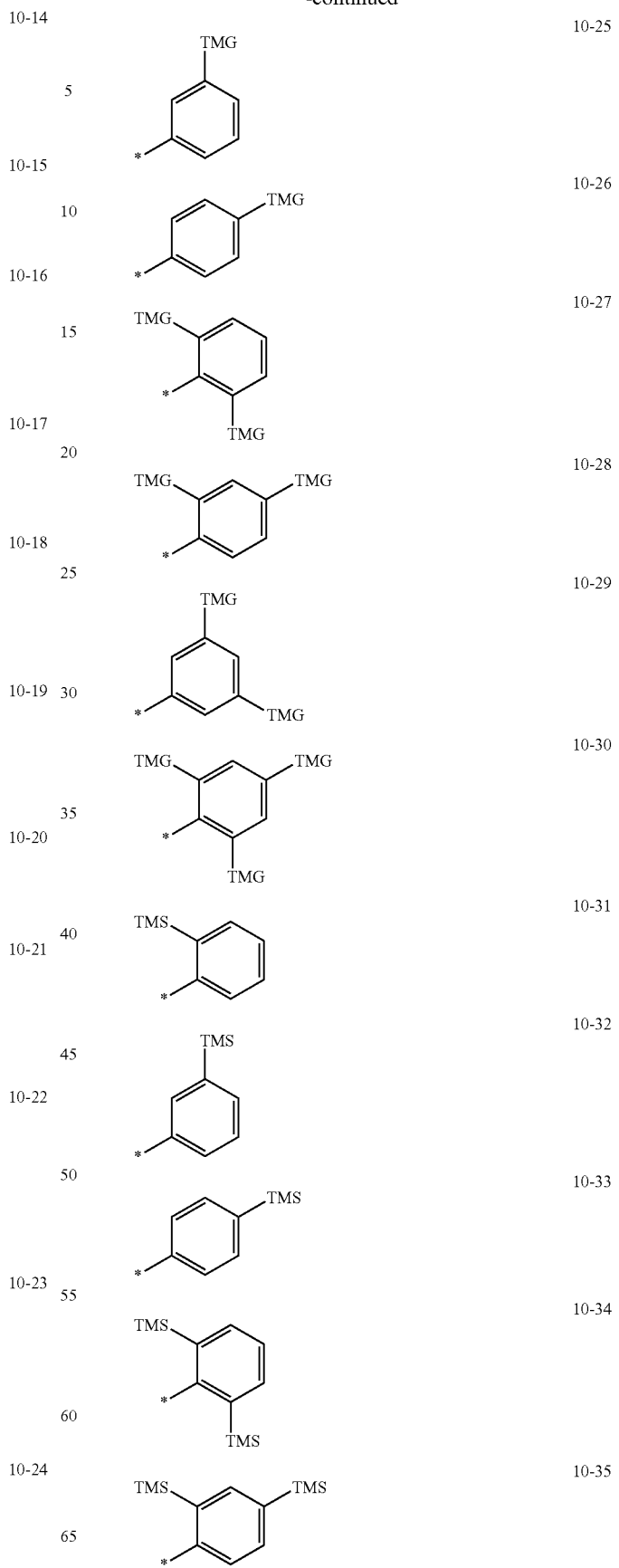

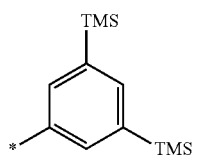
10-36
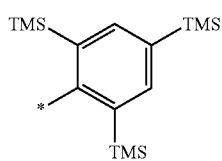
10-37
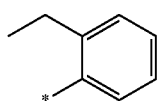
10-38
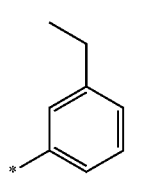
10-39
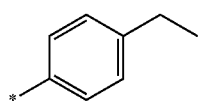
10-40
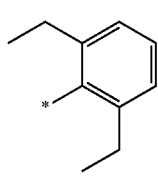
10-41
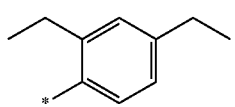
10-42
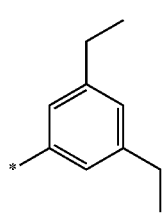
10-43
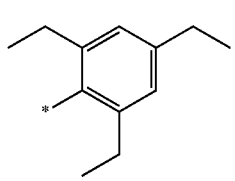
10-44
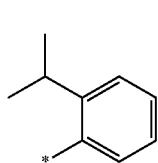
10-45
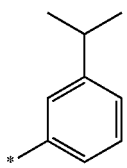
10-46
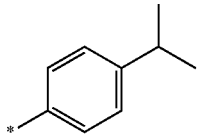
10-47
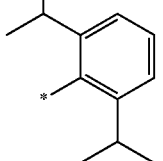
10-48
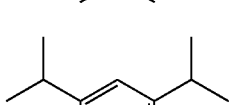
10-49
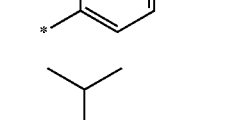
10-50
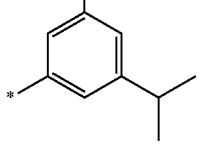
10-51
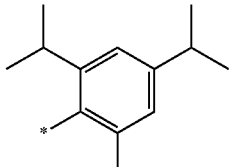
10-52
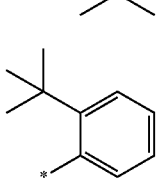
10-53
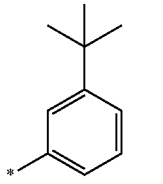
10-54
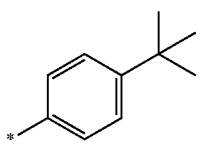

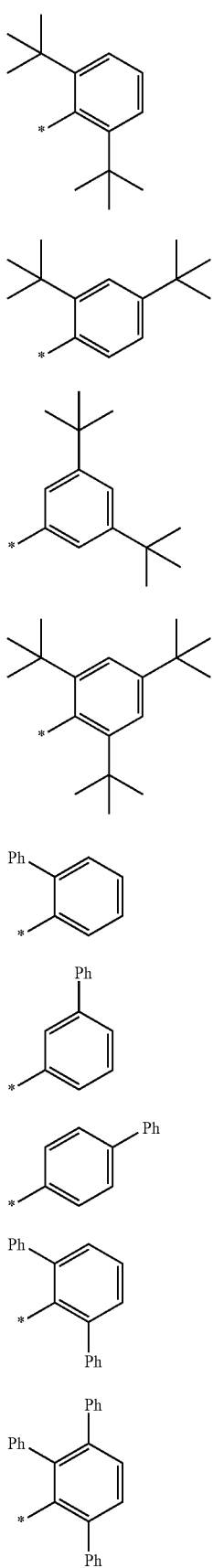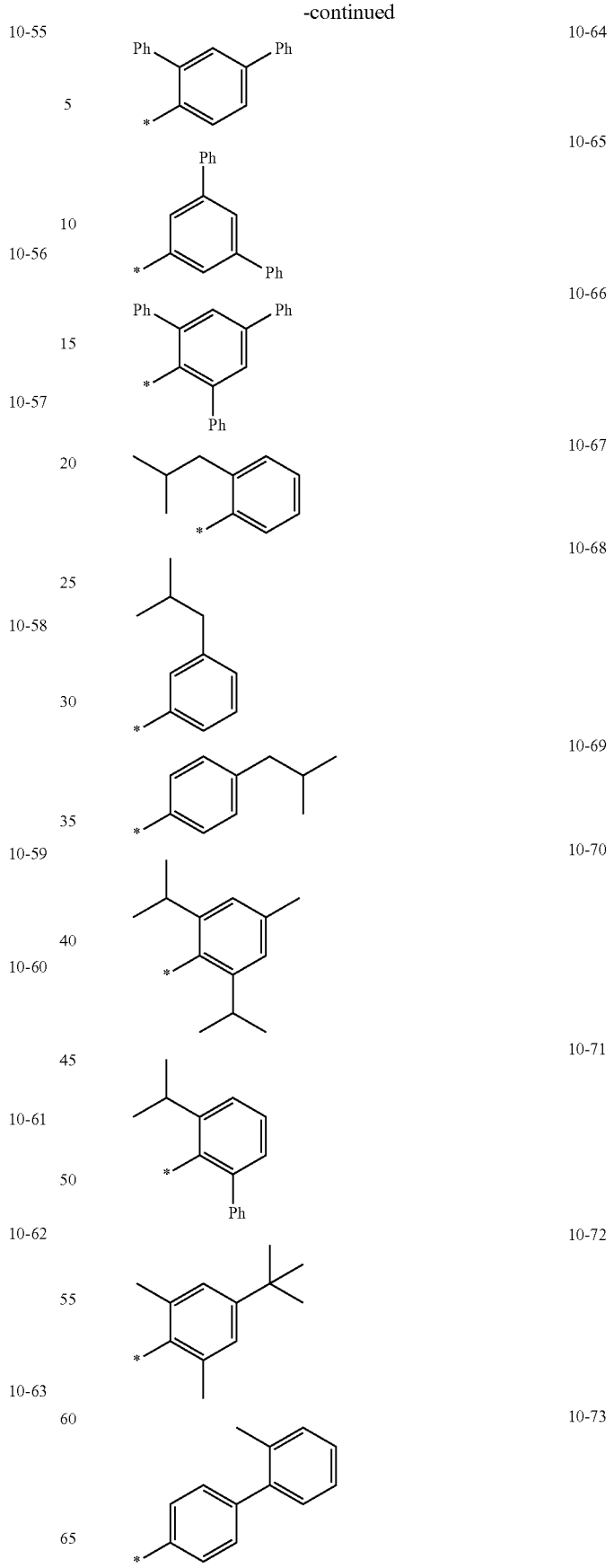

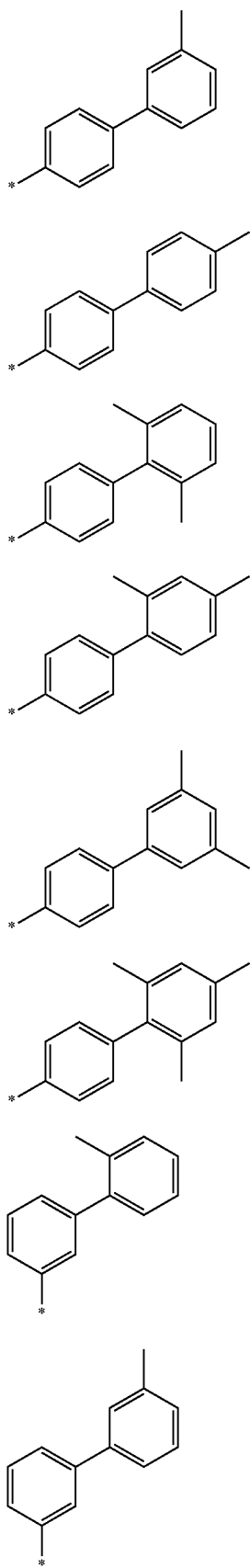
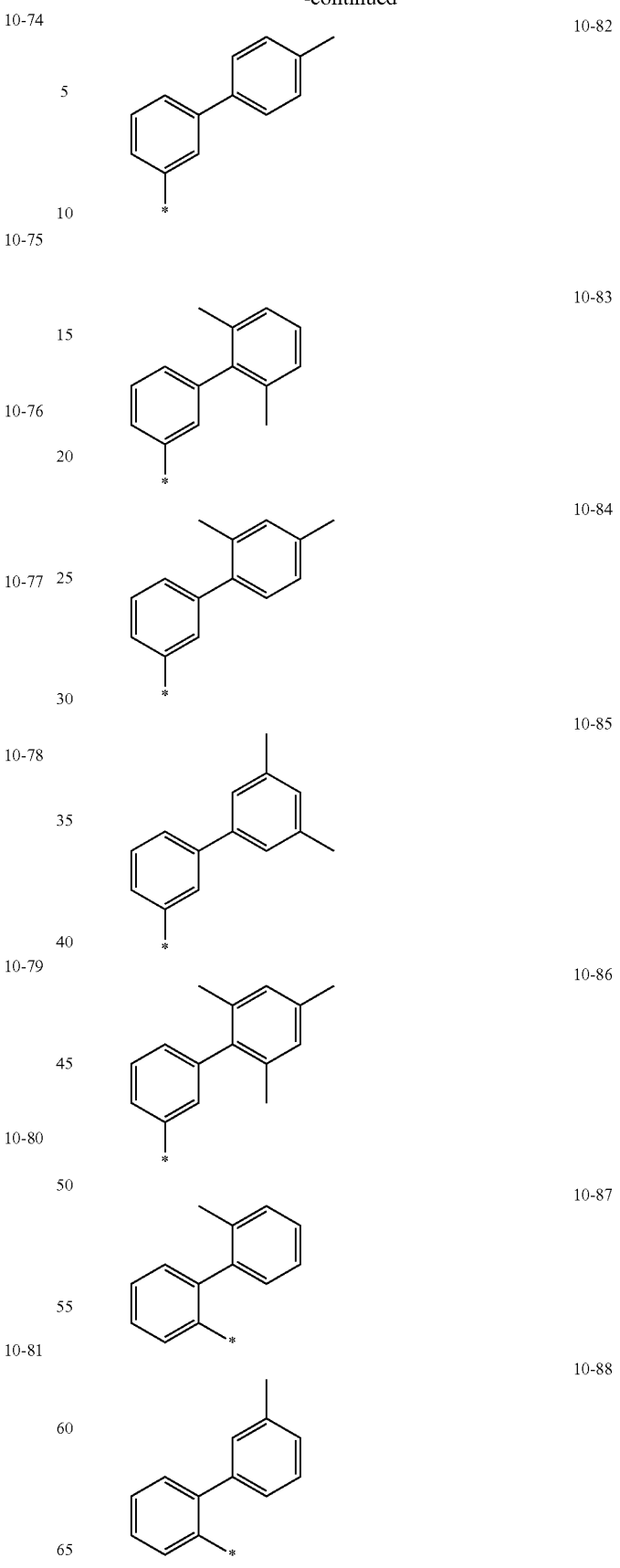

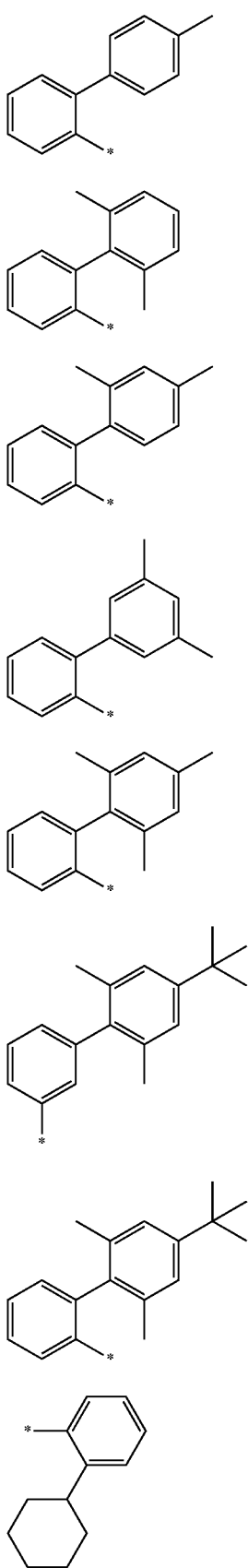
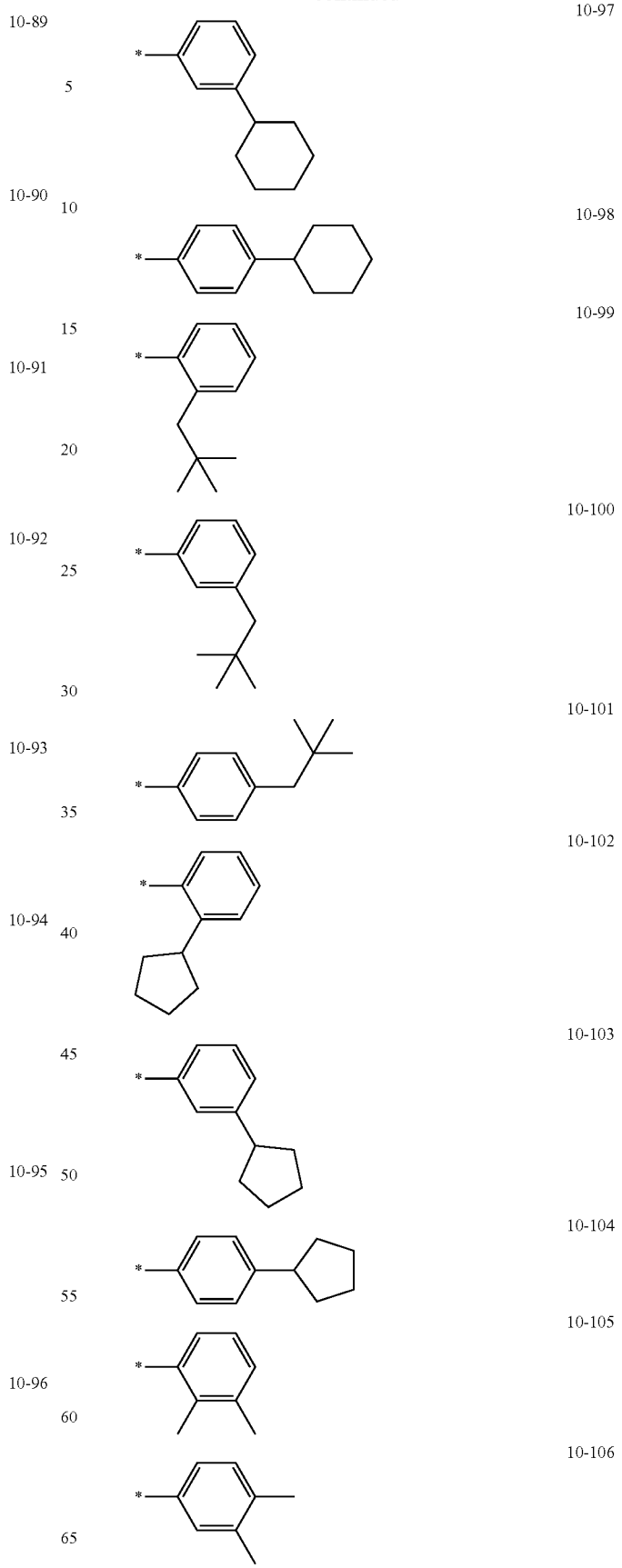

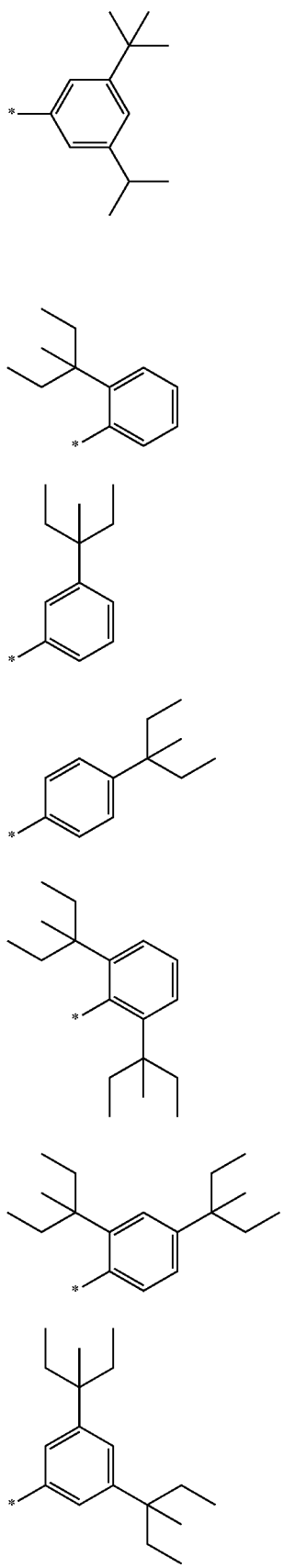
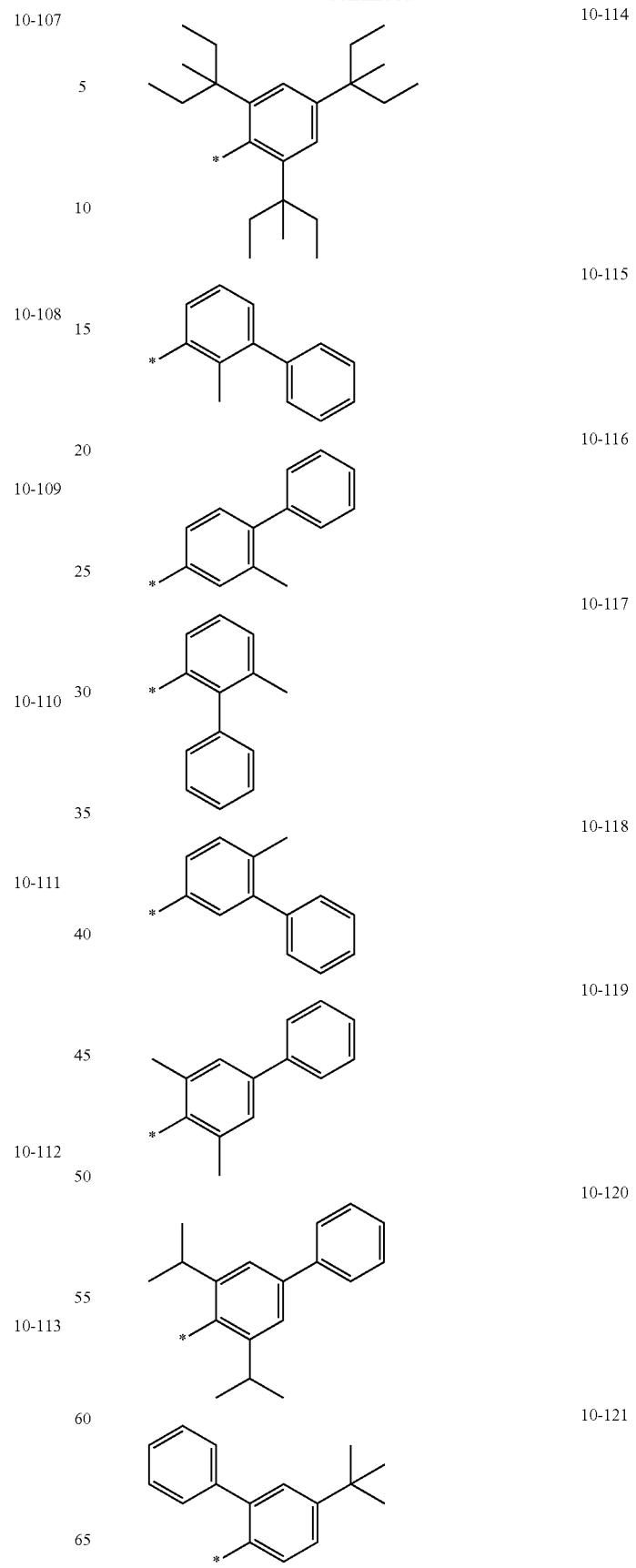

31 | 32
-continued | -continued
10-122 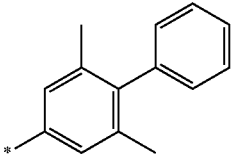 10-128
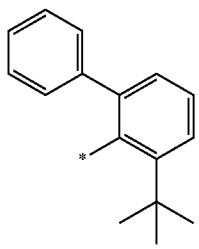
10-123 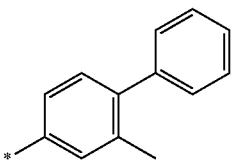 10-129
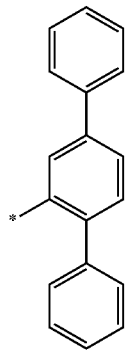
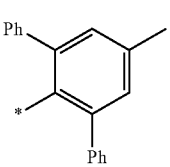 10-130
10-124
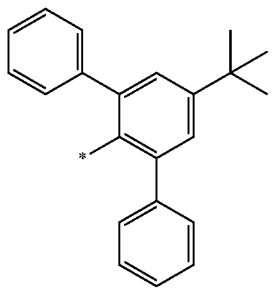
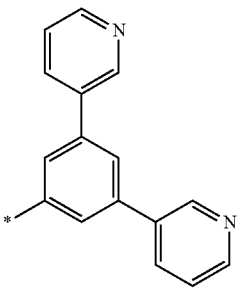 10-201
10-125
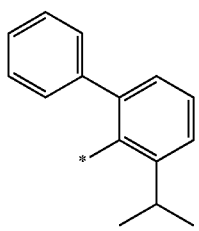
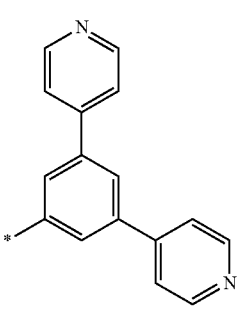 10-202
10-126
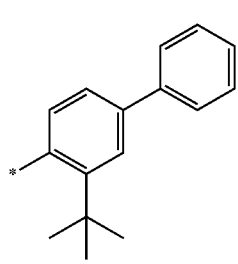
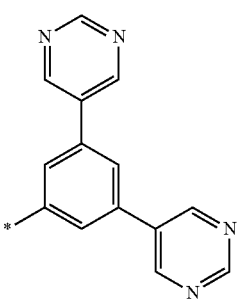 10-203
10-127
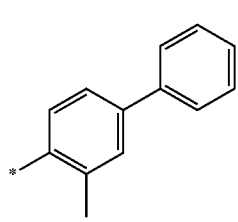

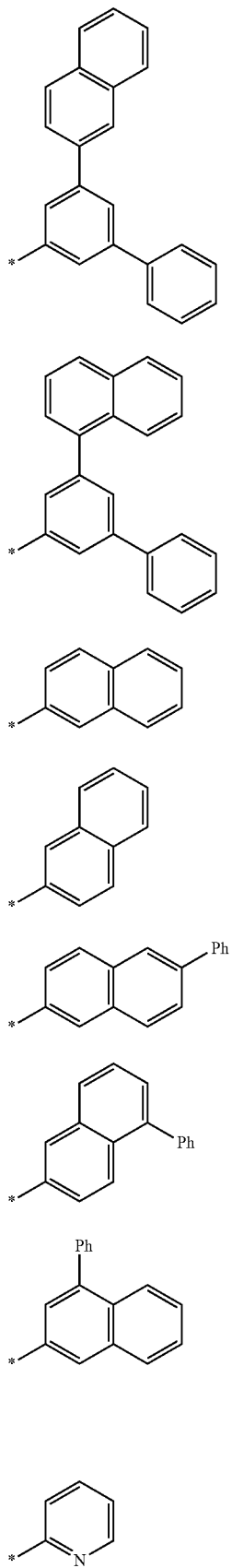
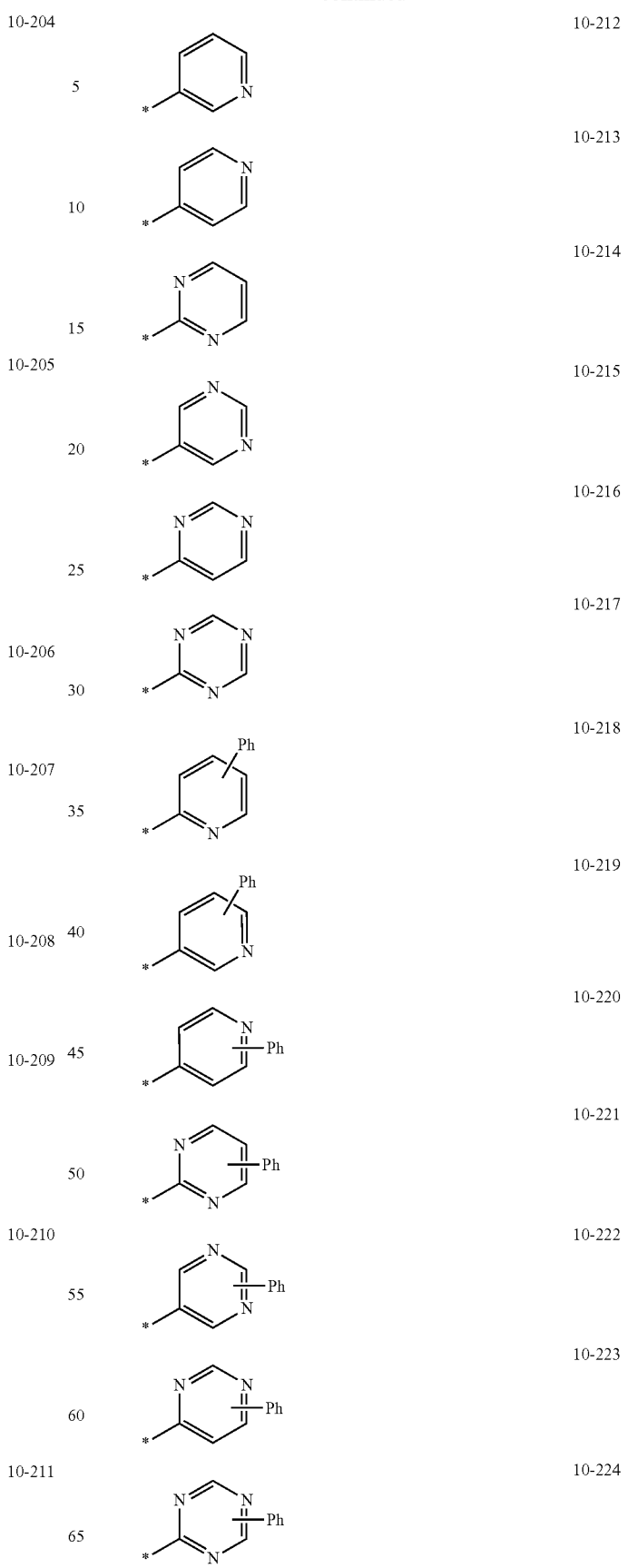

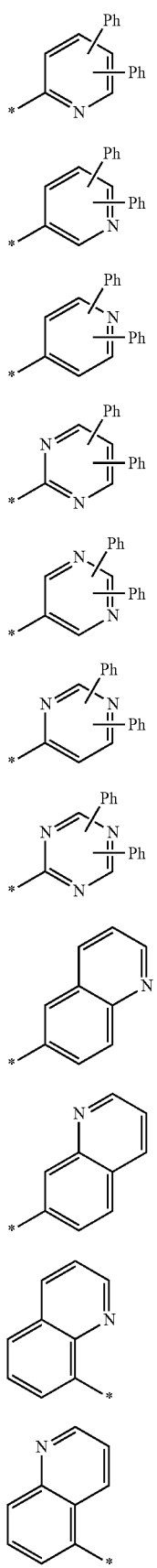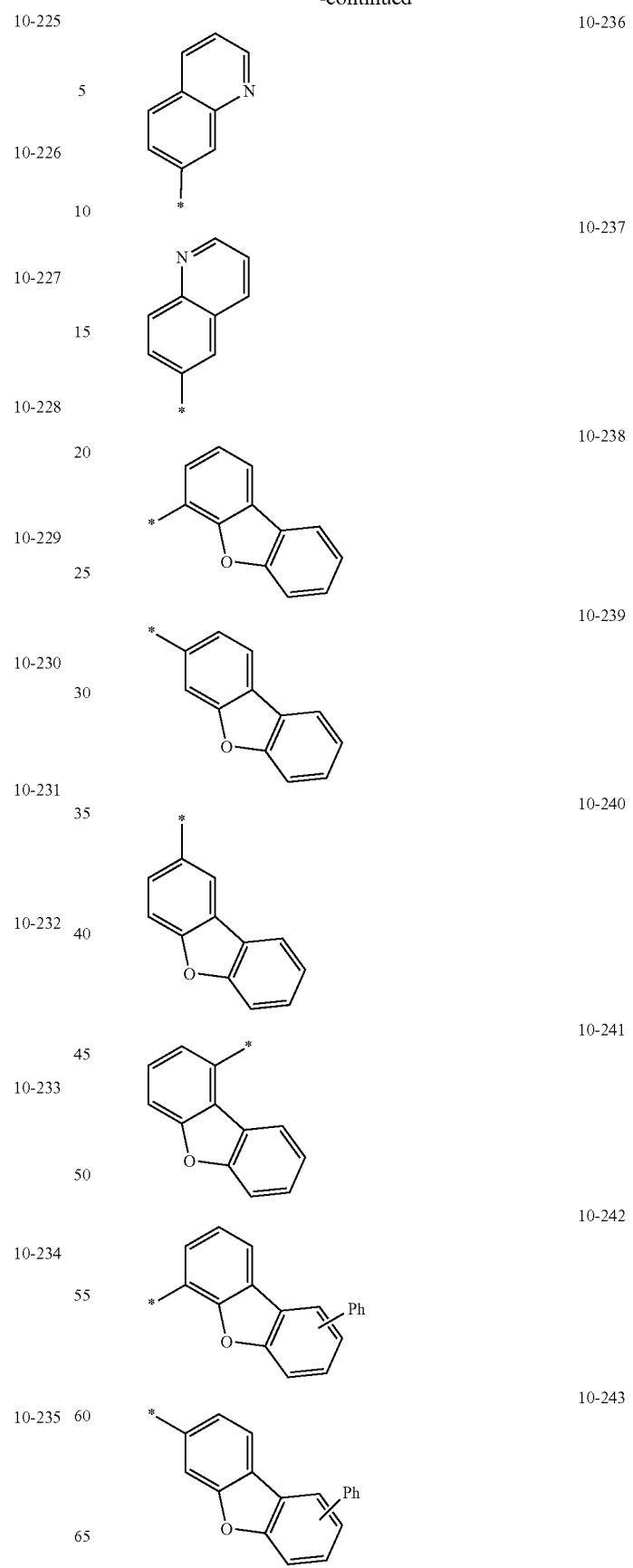

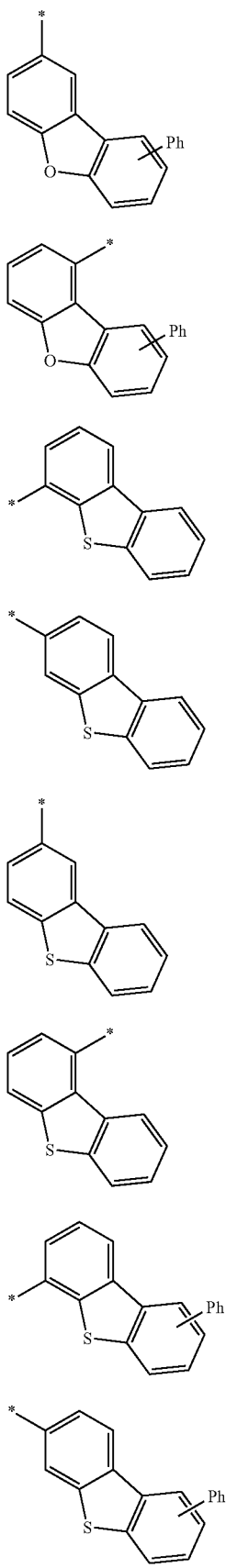
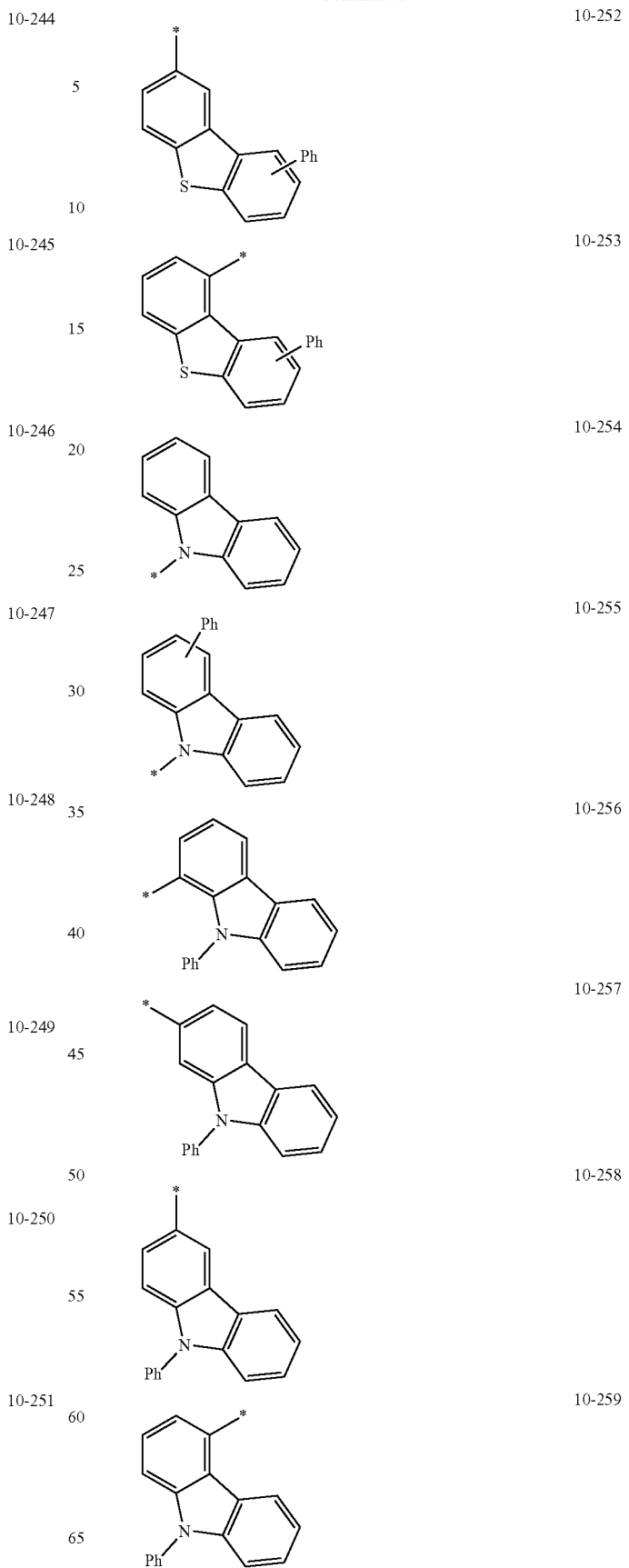

10-260 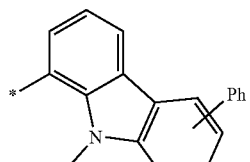
10-261 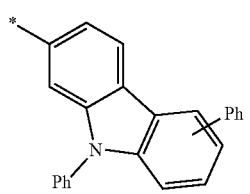
10-262 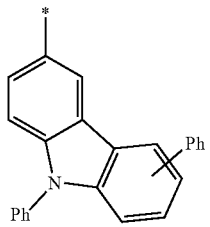
10-263 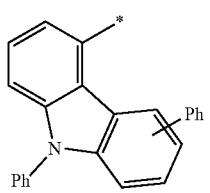
10-264 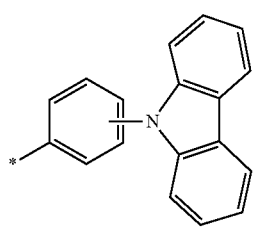
10-265 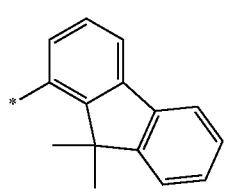
10-266 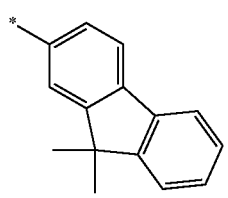
10-267 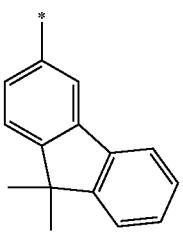
10-268 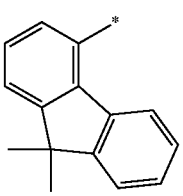
10-269 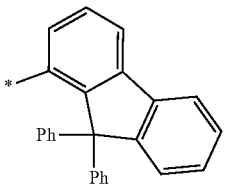
10-270 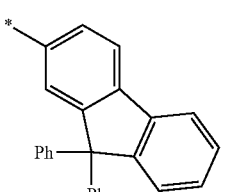
10-271 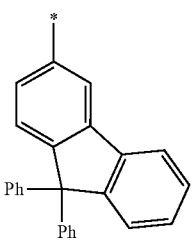
10-272 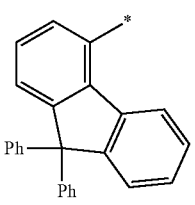
10-273 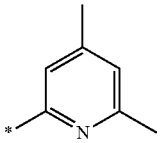
10-274 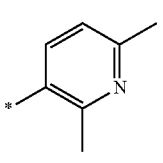

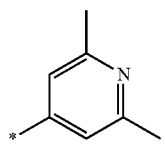
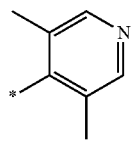
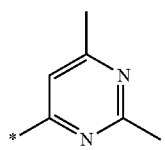
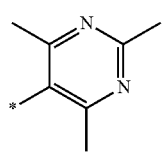
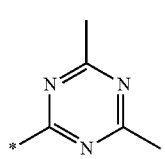
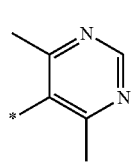
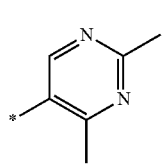
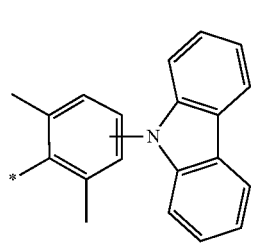
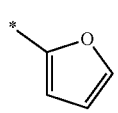
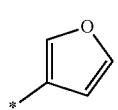
10-275 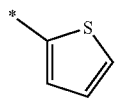
10-276 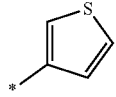
10-277 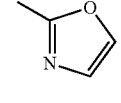
10-278 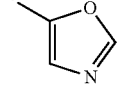
10-279 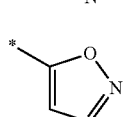
10-280 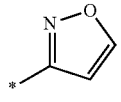
10-281 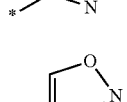
10-282 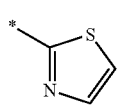
10-283 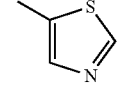
10-284 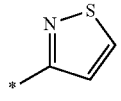
10-285
10-286
10-287
10-288
10-289
10-290
10-291
10-292
10-293
10-294
10-295
10-296
10-297
10-298
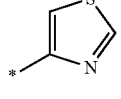

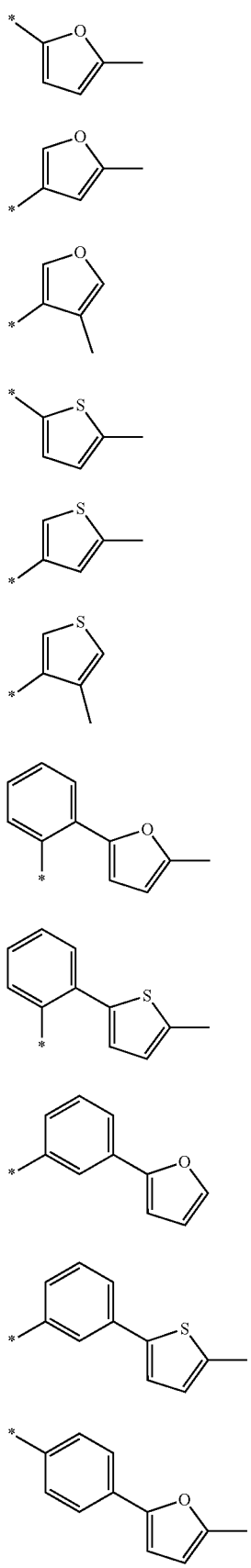
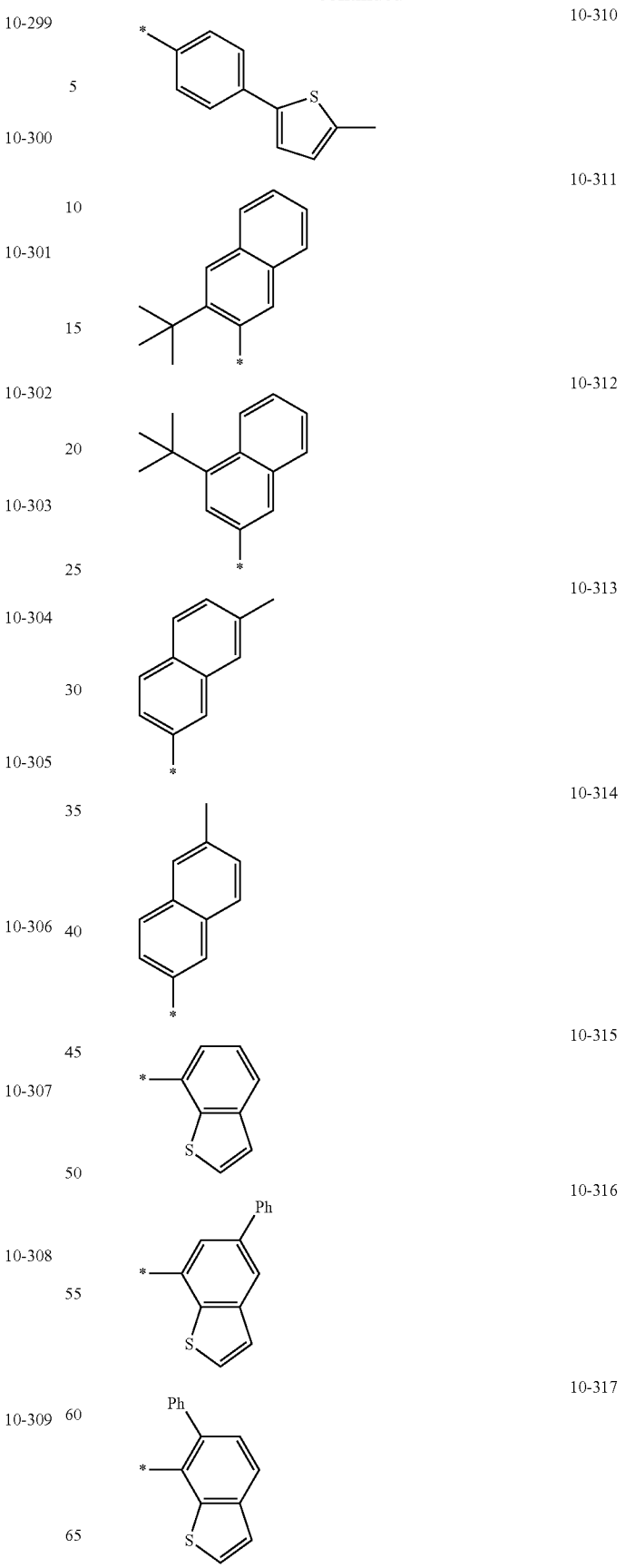

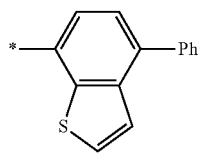
10-318
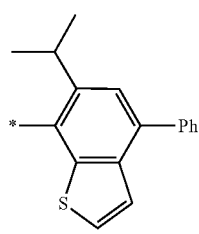
10-319
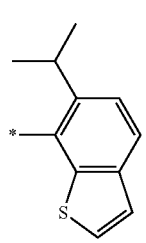
10-320
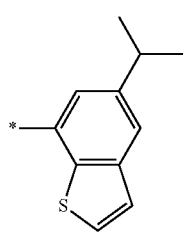
10-321
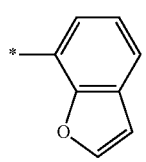
10-322
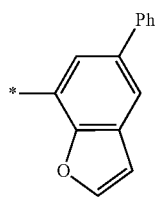
10-323
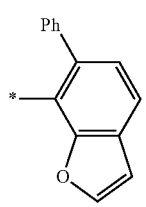
10-324
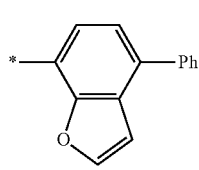
10-325
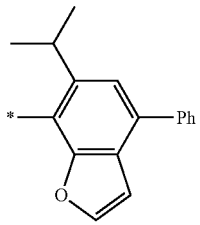
10-326
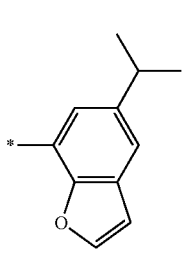
10-327
10-328
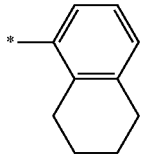
10-329
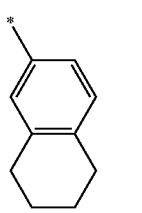
10-330
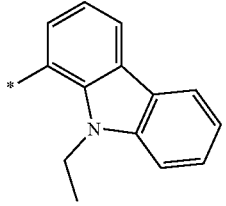
10-331
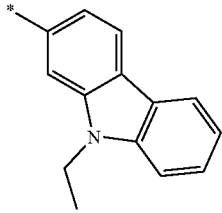
10-332

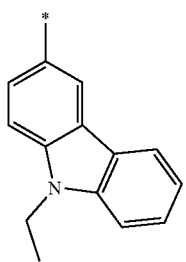
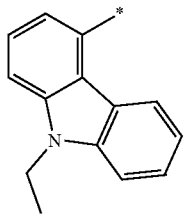
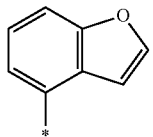
10-333
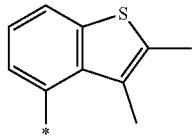
10-334
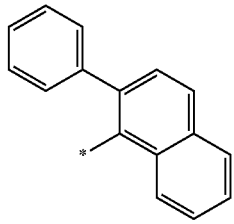
10-335
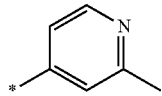
10-336
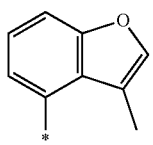
10-337
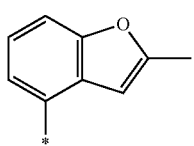
10-338
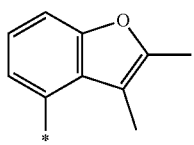
10-339
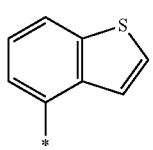
10-340
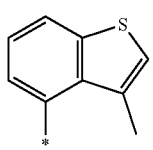
10-341
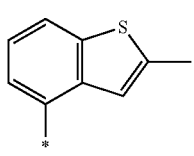
10-342
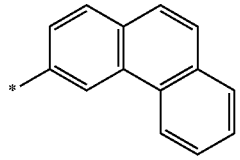
10-343
10-344
10-345
10-346
10-347
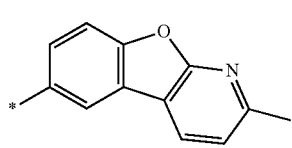
10-348
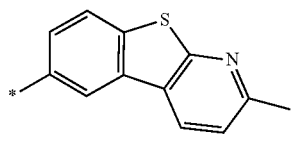
10-349
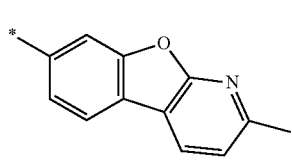
10-350
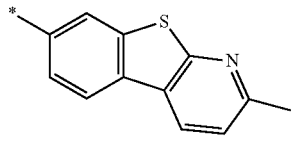
10-351
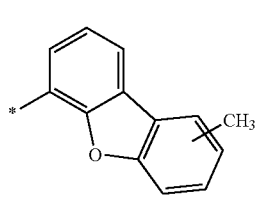

-continued

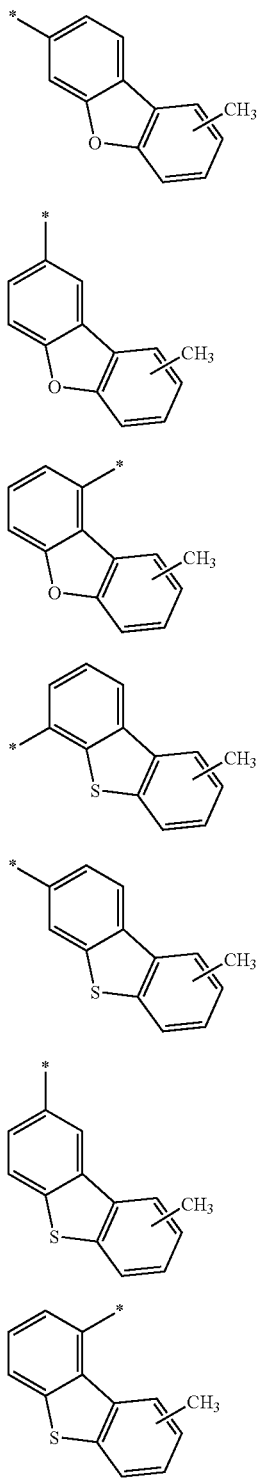

wherein, * in Formulae 9-1 to 9-39, 9-201 to 9-236, 10-1 to 10-130, and 10-201 to 10-358 is a binding site to a neighboring atom, Ph is a phenyl group, TMS and SiMe₃ are each a trimethylsilyl group, and TMG and GeMe₃ are each trimethylgermyl group.

The "group represented by one of Formulae 9-1 to 9-39 in which at least one hydrogen is substituted with deuterium" and the "group represented by one of Formulae 9-201 to 9-236 in which at least one hydrogen is substituted with deuterium" may be, for example, a group represented by one of Formulae 9-501 to 9-514 and 9-601 to 9-636:

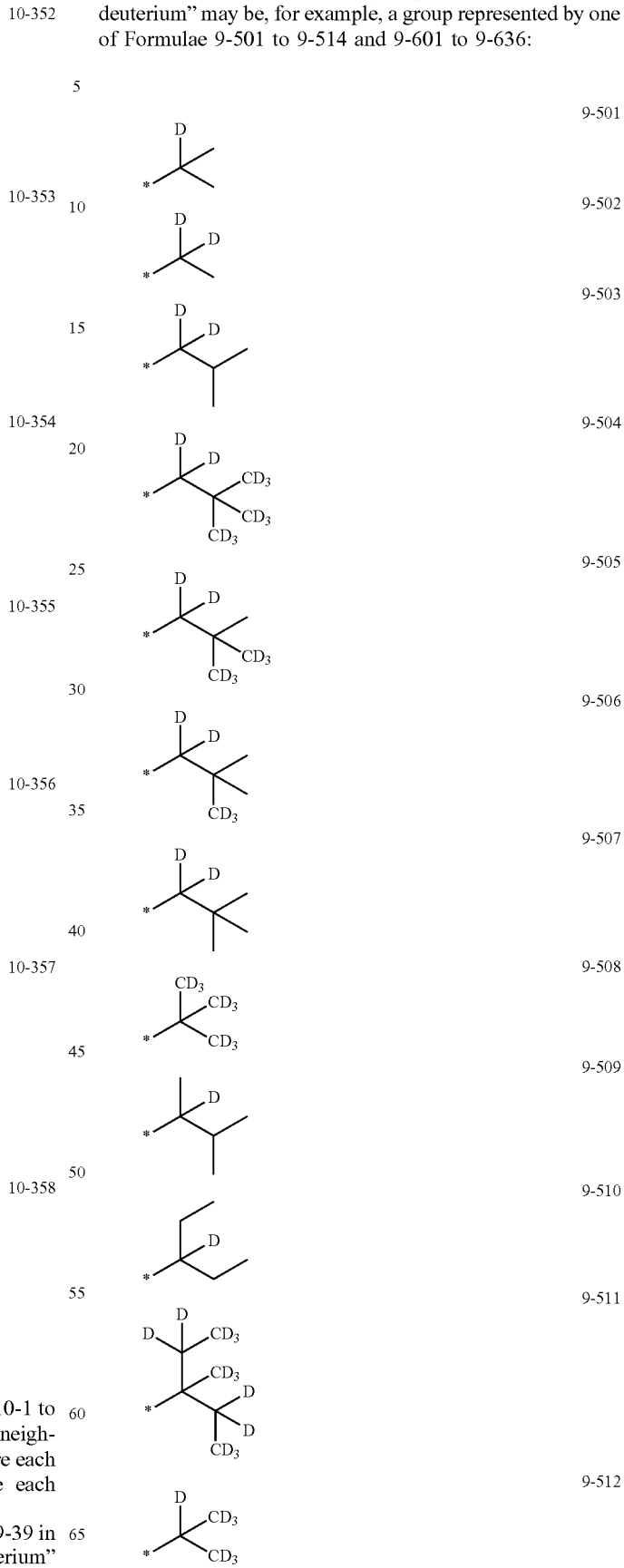

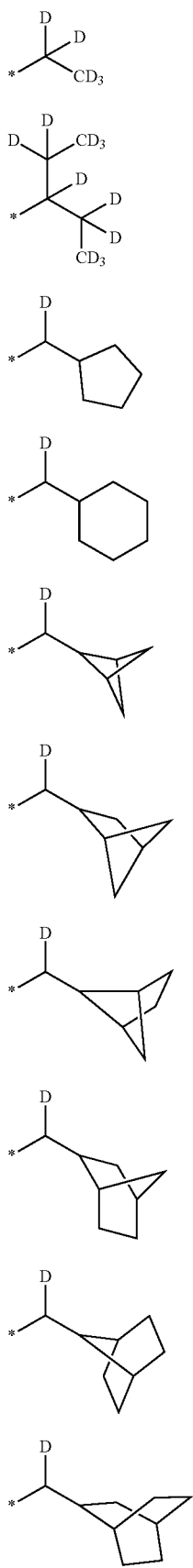
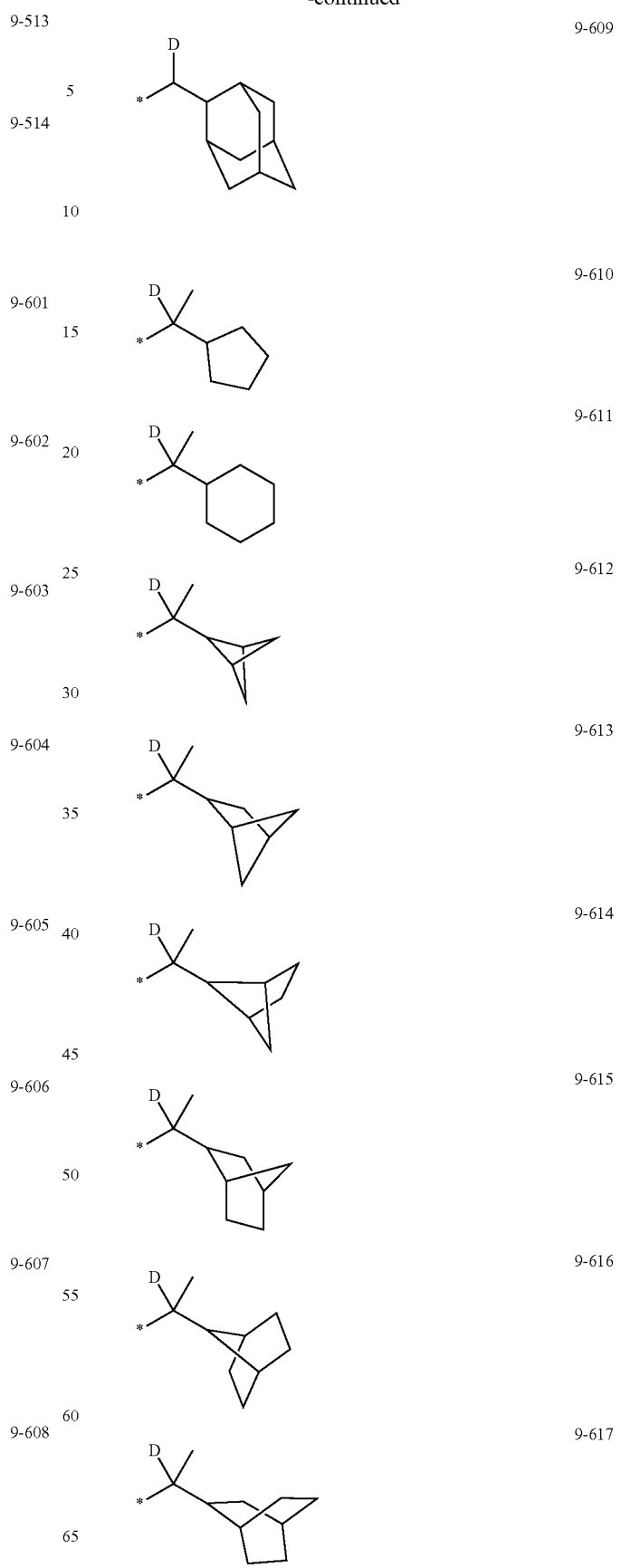

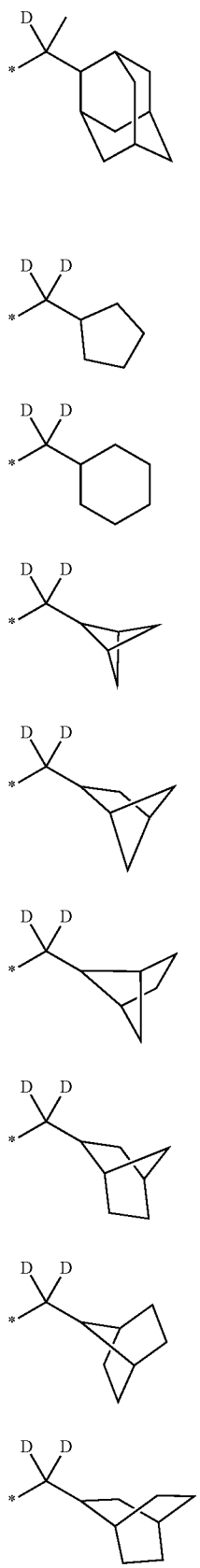
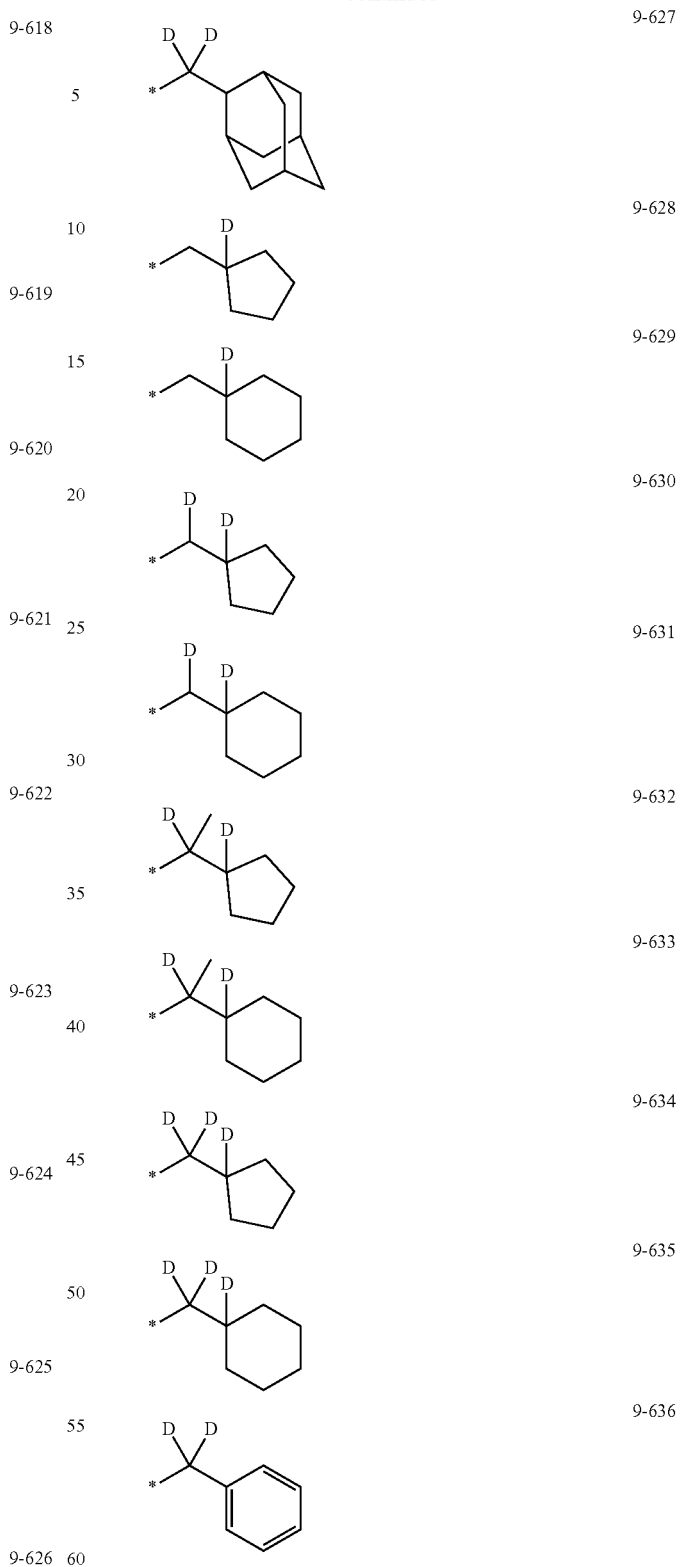
The "group represented by one of Formulae 9-1 to 9-39 in which at least one hydrogen is substituted with —F" and the "group represented by one of Formulae 9-201 to 9-236 in which at least one hydrogen is substituted with —F" may be, for example, a group represented by one of Formulae 9-701 to 9-710:

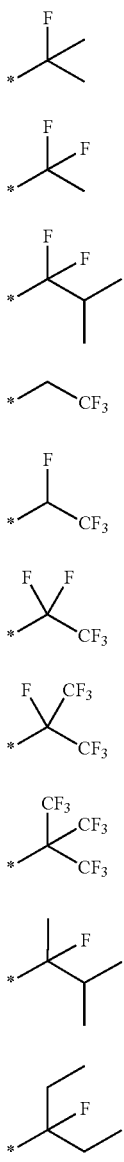
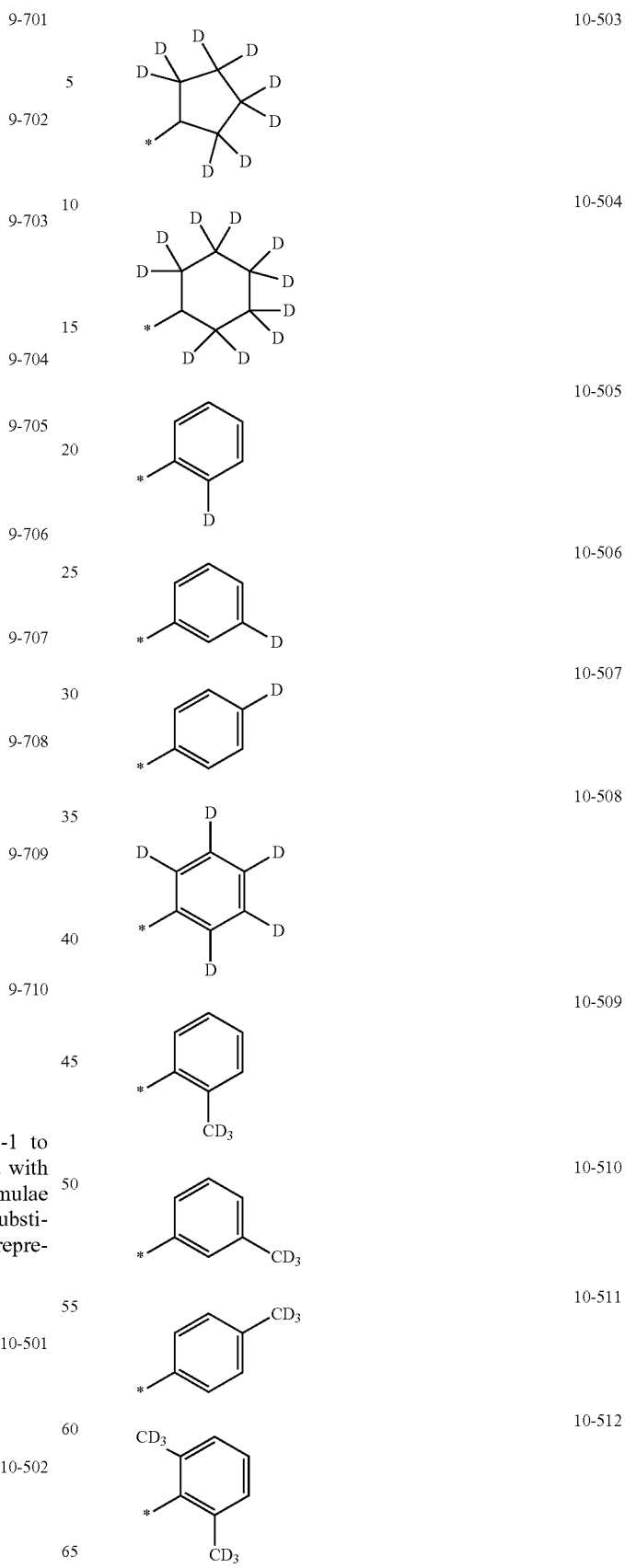
The "group represented by one of Formulae 10-1 to 10-130 in which at least one hydrogen is substituted with deuterium" and the "group represented by one of Formulae 10-201 to 10-358 in which at least one hydrogen is substituted with deuterium" may be, for example, a group represented by one of Formulae 10-501 to 10-553:
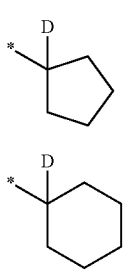

| | |
|---|---|
| 10-513 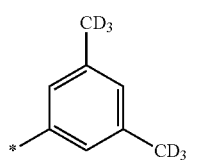 | 10-521 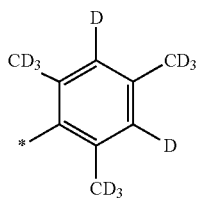 |
| 10-514 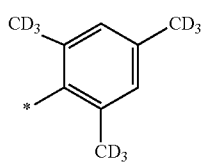 | 10-522 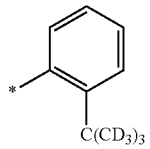 |
| 10-515 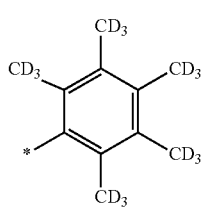 | 10-523 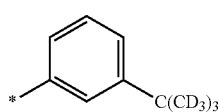 |
| 10-516 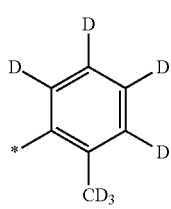 | 10-524 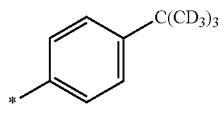 |
| 10-517 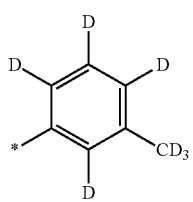 | 10-525 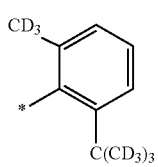 |
| 10-518 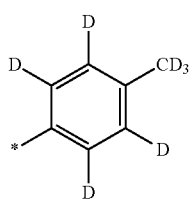 | 10-526 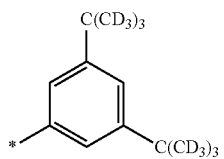 |
| 10-519 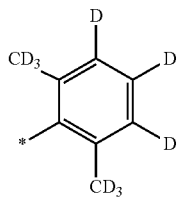 | 10-527 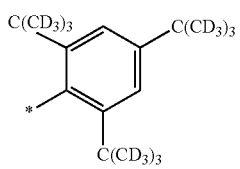 |
| 10-520 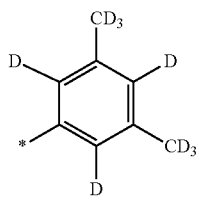 | 10-528 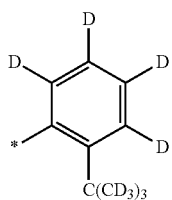 |
| | 10-529 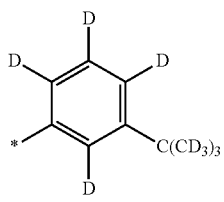 |

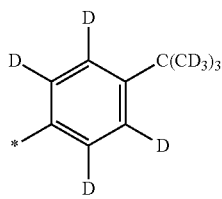
10-530
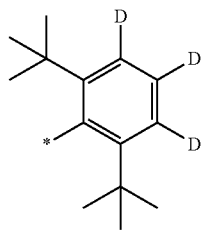
10-537
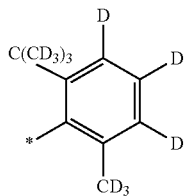
10-531
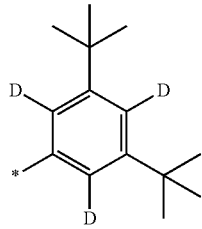
10-538
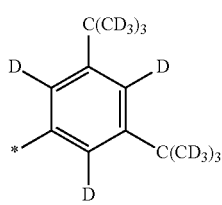
10-532
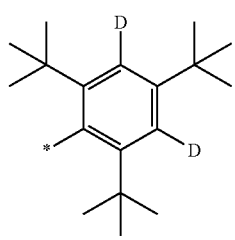
10-540
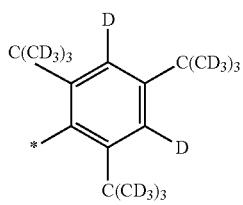
10-533
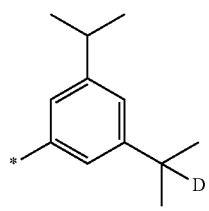
10-541
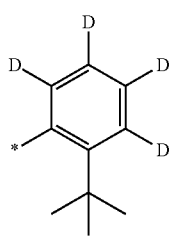
10-534
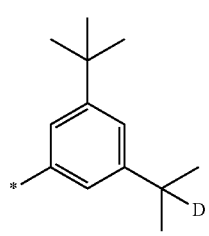
10-542
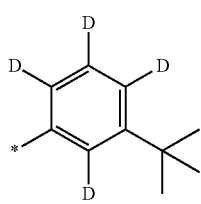
10-535
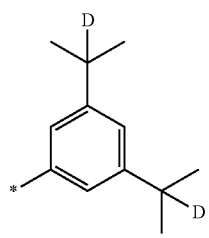
10-543
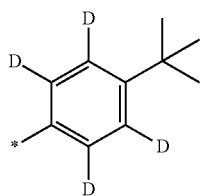
10-536
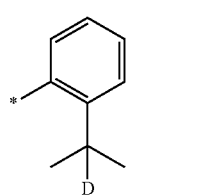
10-544

10-545 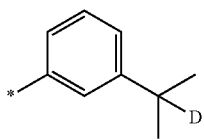
10-546 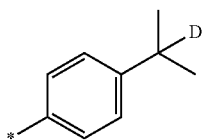
10-547 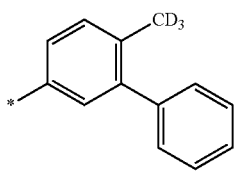
10-548 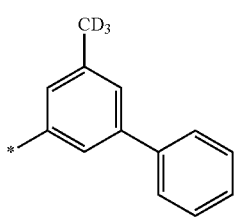
10-549 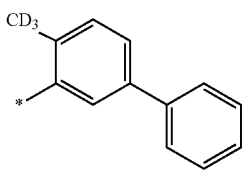
10-550 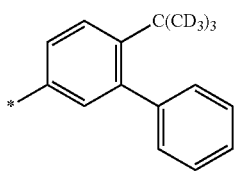
10-551 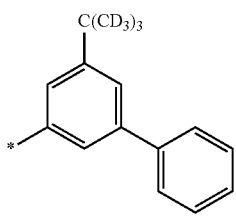
10-552 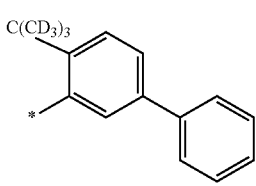
10-553 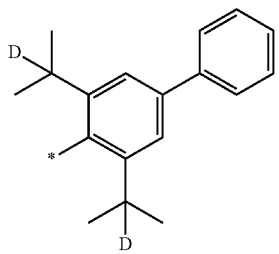
The "group represented by one of Formulae 10-1 to 10-130 in which at least one hydrogen is substituted with —F" and the "group represented by Formulae 10-201 to 10-358 in which at least one hydrogen is substituted with —F" may be, for example, a group represented by one of Formulae 10-601 to 10-617:
10-601 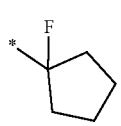
10-602 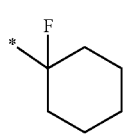
10-603 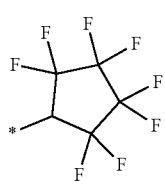
10-604 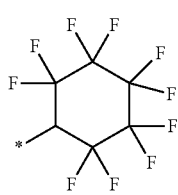
10-605 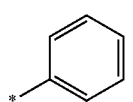
10-606 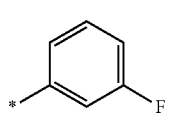
10-607 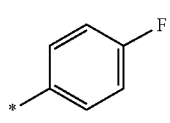

-continued 10-608 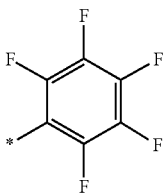

10-609 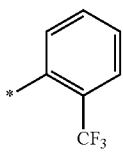

10-610 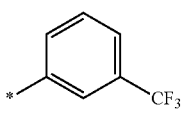

10-611 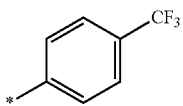

10-612 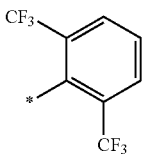

10-613 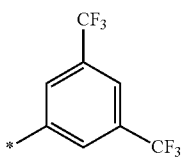

10-614 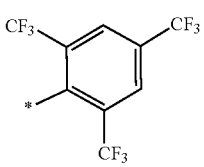

10-615 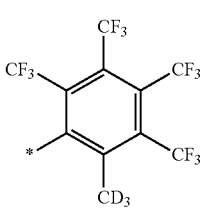

10-616 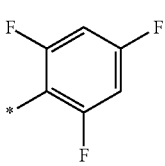

-continued 10-617 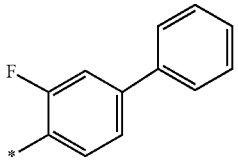

In one or more embodiments, in Formula 2, $R_2$ may be hydrogen, deuterium, —F, a cyano group, a substituted or unsubstituted $C_1$-$C_{60}$ alkyl group, a substituted or unsubstituted $C_3$-$C_{10}$ cycloalkyl group, —Si$(Q_3)(Q_4)(Q_5)$, or —Ge$(Q_3)(Q_4)(Q_5)$, and(or), $R_3$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

In one or more embodiments, in Formula 2, $R_3$ may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

b1 in Formula 2 indicates the number of $R_1$(s) and is an integer from 0 to 20. When b1 is 2 or more, two or more of $R_1$(s) are identical to or different from each other. In one or more embodiments, b1 may be an integer from 0 to 10.

b2 in Formula 2 indicates the number of $R_2$(s) and is an integer from 0 to 4. When b2 is 2 or more, two or more of $R_2$(s) are identical to or different from each other. In one or more embodiments, b2 may be 0, 1, or 2.

$T_1$ in Formula 2 is a carbazole group unsubstituted or substituted with at least one $R_{10a}$.

In one or more embodiments, $T_1$ in Formula 2 may be a group represented by Formula 3:

Formula 3

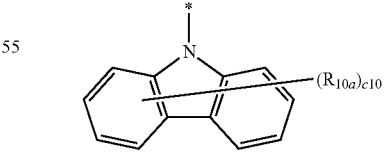

In Formula 3, $R_{10a}$ is the same as described in the present specification, c10 is an integer from 0 to 8, and indicates a binding site to a neighboring atom.

c1 in Formula 2 indicates the number of groups represented by *-$L_{11}$-$T_1$ and is an integer from 1 to 5. In one or more embodiments, c1 may be 1 or 2.

In one or more embodiments, a group represented by:

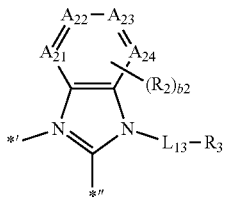

in Formula 2 may be a group represented by one of Formulae CY2-1 to 2-11:

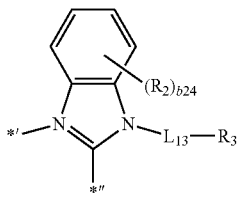

2-1

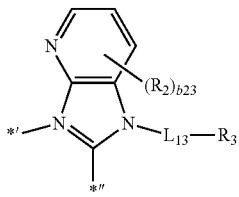

2-2

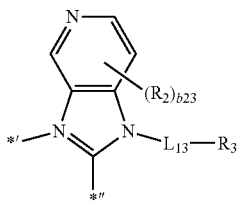

2-3

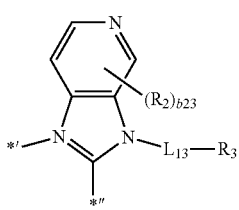

2-4

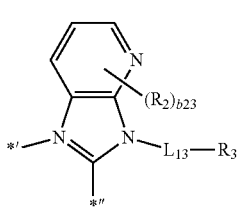

2-5

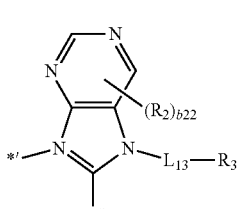

2-6

-continued

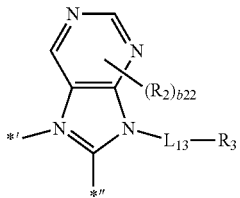

2-7

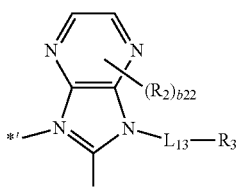

2-8

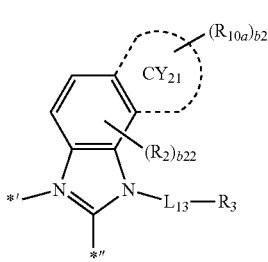

2-9

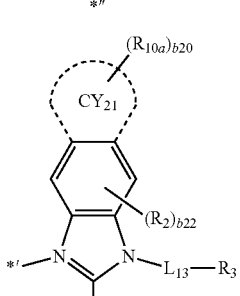

2-10

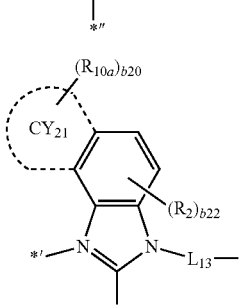

2-11

In Formulae 2-1 to 2-11, $L_{13}$, $R_2$, and $R_3$ are each the same as described in the present specification, ring $CY_{21}$ may be a $C_5$-$C_{30}$ carbocyclic group or a $C_1$-$C_{30}$ heterocyclic group, $R_{10a}$ is the same as described in connection with $R_1$ in the present specification, b24 is an integer from 0 to 4, b23 is an integer from 0 to 3, b22 is an integer from 0 to 2, b20 is an integer from 0 to 20,

*' indicates a binding site to M in Formula 1, and

*" indicates a binding site to a neighboring atom.

ring CY$_{21}$ in Formulae 2-9 to 2-11 may be a C$_5$-C$_{30}$ carbocyclic group or a C$_1$-C$_{30}$ heterocyclic group, each formed by linking two or more of a plurality of R$_2$(s) in Formula 2 to each other.

In one or more embodiments, a ring CY$_{21}$ in Formulae 2-9 to 2-11 may be a cyclohexane group, a norbomane group, a benzene group, a naphthalene group, or a pyridine group.

In one or more embodiments, a group represented by

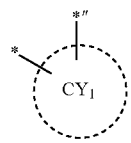

in Formula 2 may be a group represented by one of Formulae CY1(1) to CY1(15):

CY1(1)

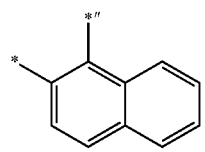

CY1(2)

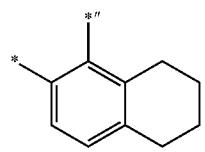

CY1(3)

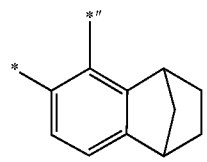

CY1(4)

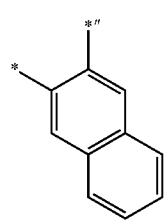

CY1(5)

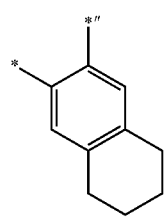

CY1(6)

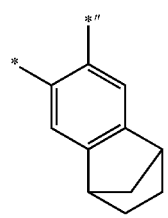

-continued

CY1(7)

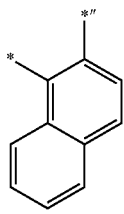

CY1(8)

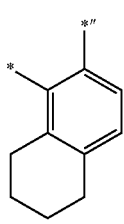

CY1(9)

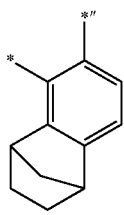

CY1(10)

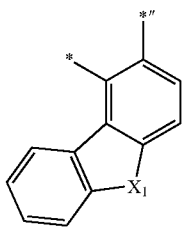

CY1(11)

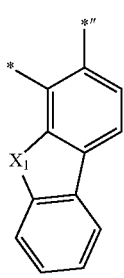

CY1(12)

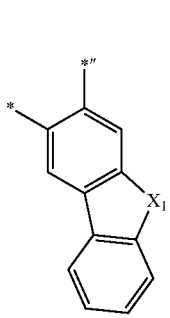

CY1(13)

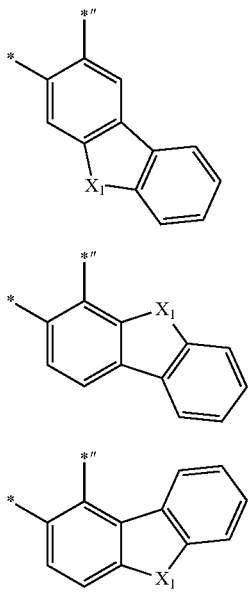

CY1(14)

CY1(15)

In Formulae CY1(1) to CY1(15),
$X_1$ may be O, S, $N(R_{18})$, $C(R_{18})(R_{19})$, or $Si(R_{18})(R_{19})$, and $R_{18}$ and $R_{19}$ are each the same as described in connection with $R_1$ in the present specification,
* indicates a binding site to M in Formula 1, and
*'' indicates a binding site to a neighboring atom.

In one or more embodiments, a group represented by

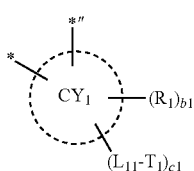

in Formula 2 may be a group represented by one of Formulae CY1-1 to CY1-12:

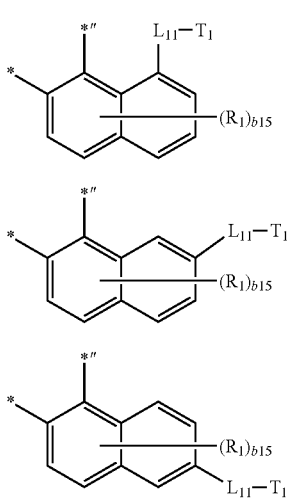

CY1-1

CY1-2

CY1-3

CY1-4

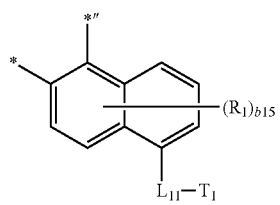

CY1-5

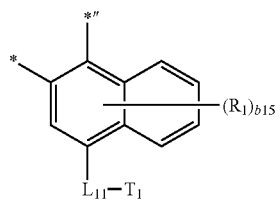

CY1-6

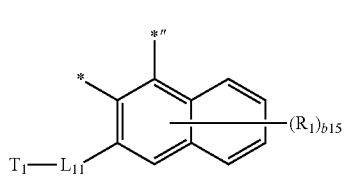

CY1-7

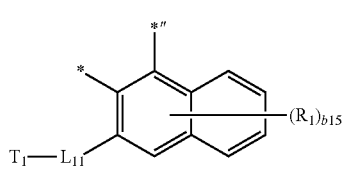

CY1-8

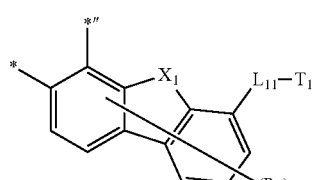

CY1-9

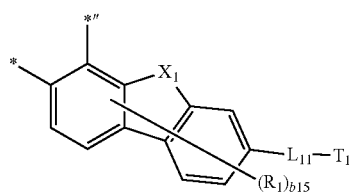

CY1-10

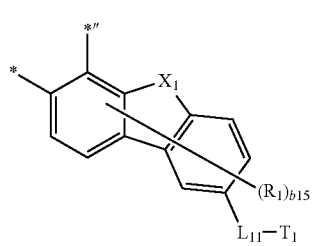

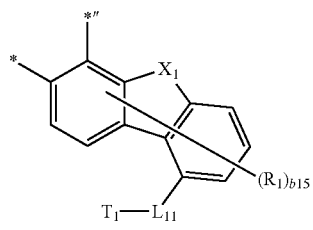

CY1-11

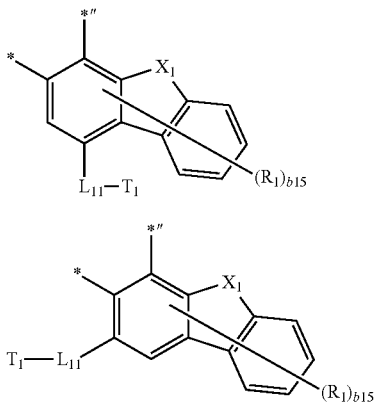

CY1-12

In Formulae CY1-1 to CY1-12,
$L_{11}$, $R_1$, and $T_1$ are each the same as described in the present specification,
$X_1$ is O, S, $N(R_{18})$, $C(R_{18})(R_{19})$, or $Si(R_{18})(R_{19})$, and $R_{18}$ and $R_{19}$ are each the same as described in connection with $R_1$ in the present specification,
* indicates a binding site to M in Formula 1, and
*" indicates a binding site to a neighboring atom.

In one or more embodiments, $L_2$ in Formula 1 may be a bidentate ligand of which two atoms are each bonded with M in Formula 1 via O, S, Se, N, C, P, Si, or As.

In one or more embodiments, $L_2$ in Formula 1 may be a bidentate ligand of which two atoms are each bonded to M in Formula 1 via N and C or a bidentate ligand of which two atoms are each bonded to M in Formula 1 via two O(s).

In one or more embodiments, $L_2$ in Formula 1 may be a group represented by one of Formulae 3A to 3F:

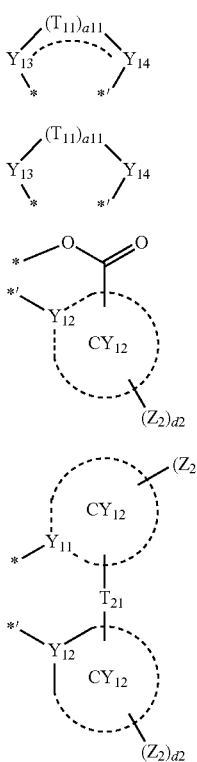

3A

3B

3C

3D

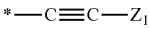  3E

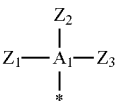  3F

In Formulae 3A to 3F,
$Y_{13}$ is O, N, $N(Z_1)$, $P(Z_1)(Z_2)$, or $As(Z_1)(Z_2)$,
$Y_{14}$ is O, N, $N(Z_3)$, $P(Z_3)(Z_4)$, or $As(Z_3)(Z_4)$,
$T_{11}$ is a single bond, a double bond, $-C(Z_{11})(Z_{12})-$, $-C(Z_{11})=C(Z_{12})-$, $=C(Z_{11})-$, $-C(Z_{11})=$, $=C(Z_{11})-C(Z_{12})=C(Z_{13})-$, $-C(Z_{11})=C(Z_{12})-C(Z_{13})=$, $-N(Z_{11})$, or a $C_5$-$C_{30}$ carbocyclic group unsubstituted or substituted with at least one $Z_{11}$,
a11 is an integer from 1 to 10, and when a11 is 2 or more, two or more of $T_{11}(s)$ are identical to or different from each other,
$Y_{11}$ and $Y_{12}$ are each independently C or N,
$T_{21}$ is a single bond, a double bond, O, S, $C(Z_{11})(Z_{12})$, $Si(Z_{11})(Z_{12})$, or $N(Z_{11})$,
ring $CY_{11}$ and ring $CY_{12}$ are each independently a $C_5$-$C_{30}$ carbocyclic group or a $C_1$-$C_{30}$ heterocyclic group,
$A_1$ is P or As,
$Z_1$ to $Z_4$ and $Z_{11}$ to $Z_{13}$ are the same as described in connection with $R_1$ in the present specification,
d1 and d2 are each independently an integer from 0 to 20, and
and *' each indicate a binding site to M in Formula 1.

In one or more embodiments, a group represented by

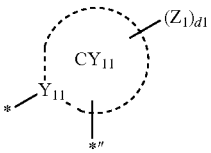

in Formula 3D may be a group represented by one of Formulae CY11-1 to CY11-34 and(or),
a group represented by

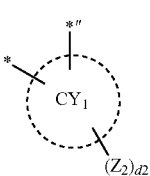

in Formulae 3C and 3D may be a group represented by one of Formulae CY12-1 to CY12-34:

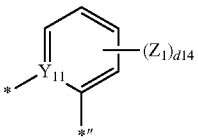

CY11-1

-continued
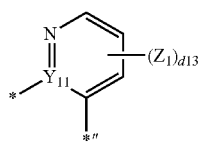 CY11-2
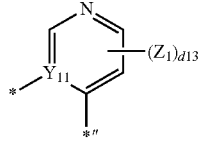 CY11-3
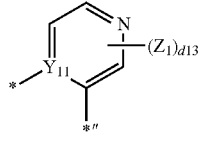 CY11-4
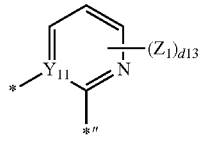 CY11-5
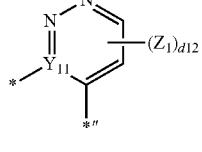 CY11-6
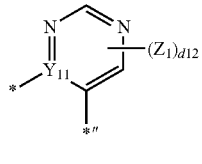 CY11-7
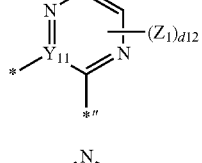 CY11-8
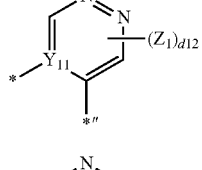 CY11-9
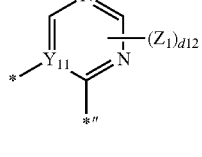 CY11-10
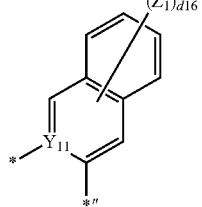 CY11-11
-continued
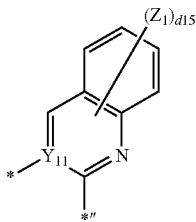 CY11-12
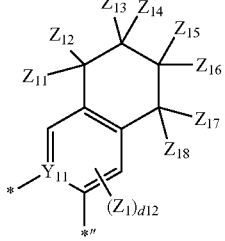 CY11-13
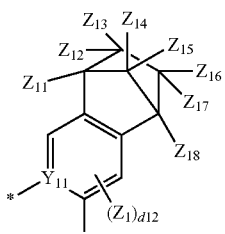 CY11-14
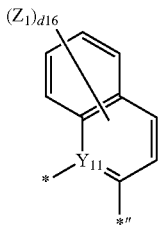 CY11-15
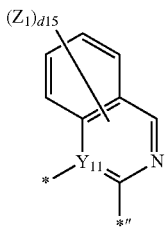 CY11-16
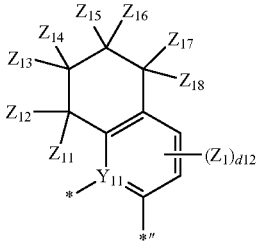 CY11-17

CY11-18 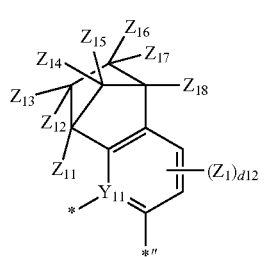
CY11-19 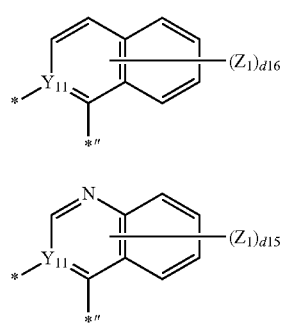
CY11-20
CY11-21 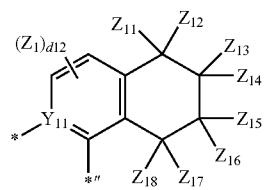
CY11-22 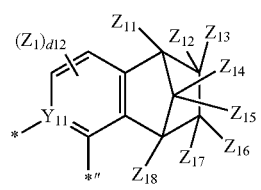
CY11-23 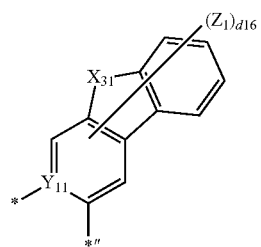
CY11-24 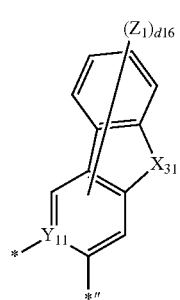
CY11-25 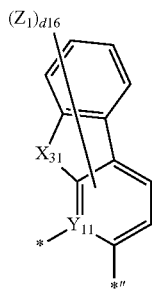
CY11-26 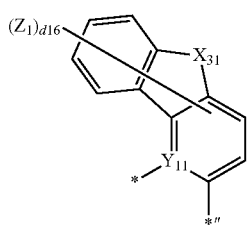
CY11-27 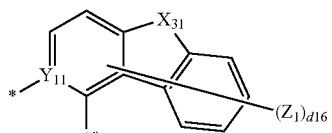
CY11-28 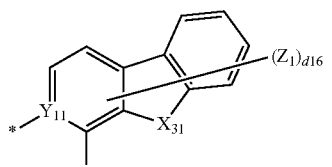
CY11-29 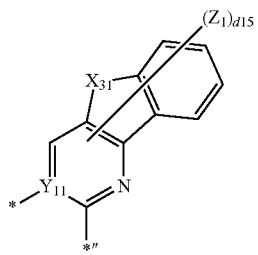
CY11-30 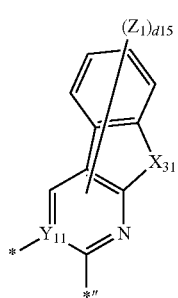

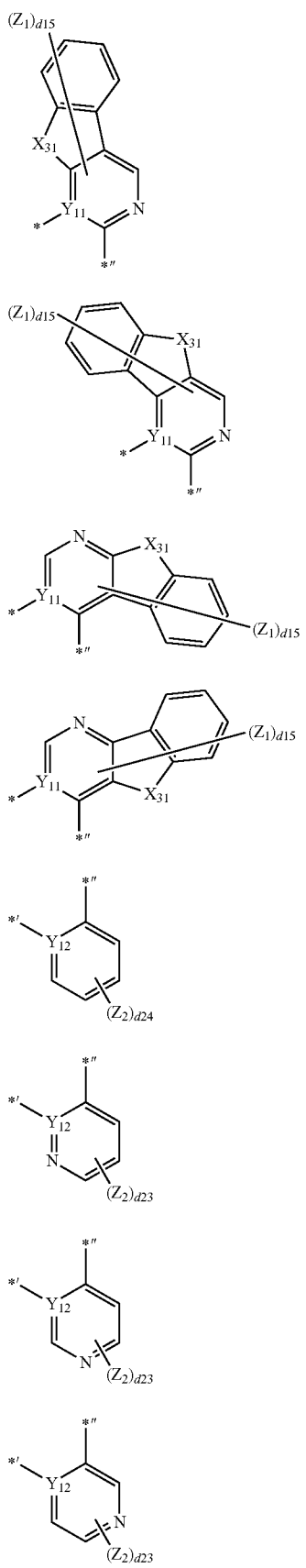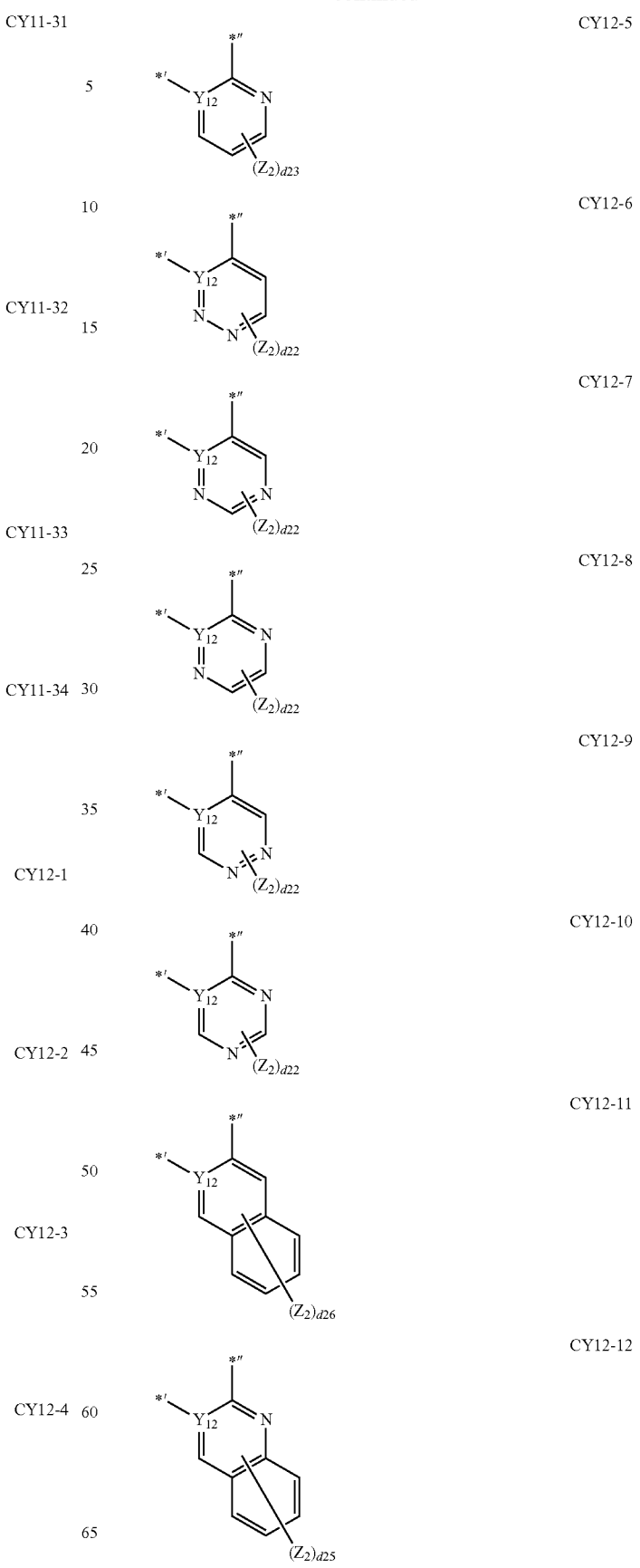

CY12-13
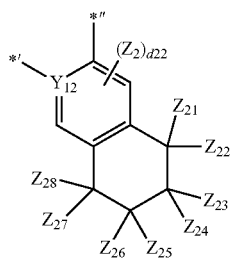
CY12-14
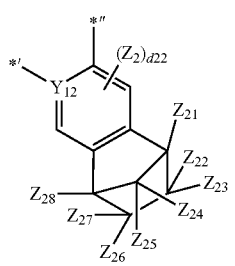
CY12-15
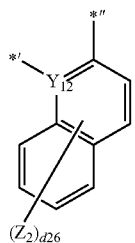
CY12-16
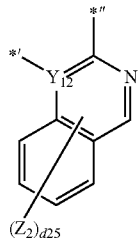
CY12-17
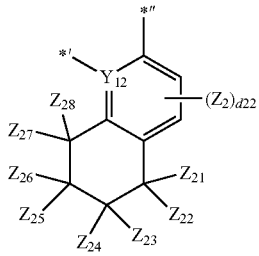
CY12-18
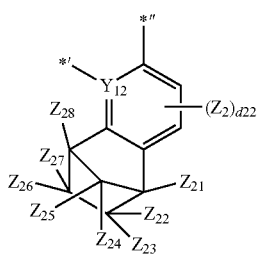
CY12-19
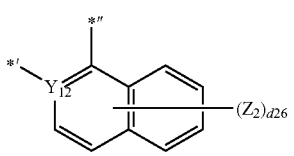
CY12-20
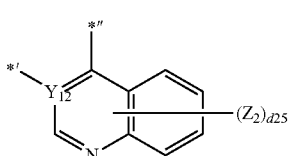
CY12-21
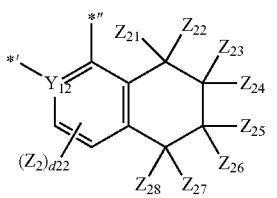
CY12-22
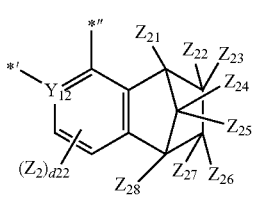
CY12-23
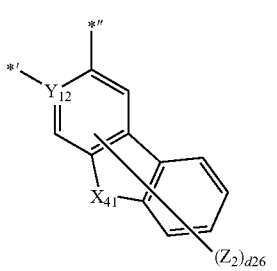
CY12-24
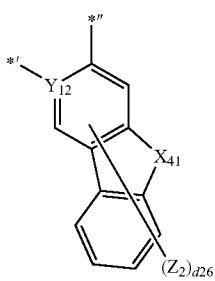
CY12-25
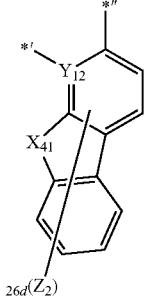

CY12-26
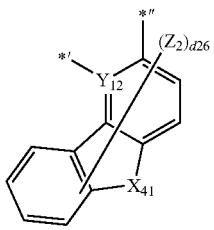

CY12-27
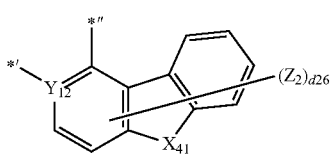

CY12-28
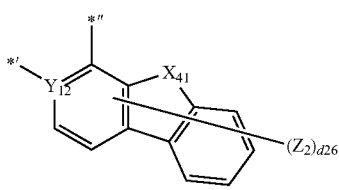

CY12-29
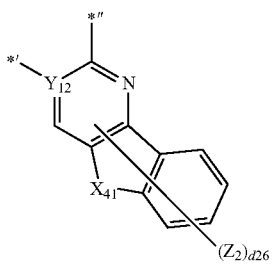

CY12-30
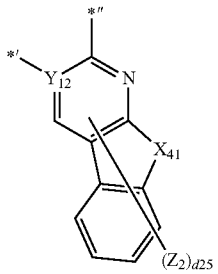

CY12-31
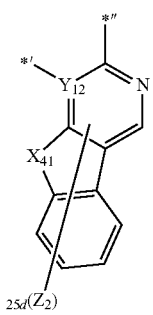

CY12-32
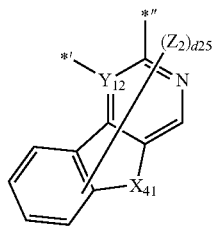

CY12-33
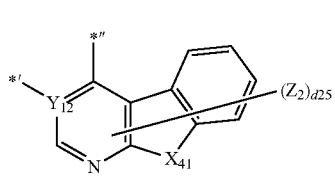

CY12-34
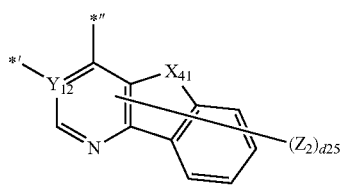

In Formulae CY11-1 to CY11-34 and CY12-1 to CY12-34, $X_{31}$ is O, S, $N(Z_{11})$, $C(Z_{11})(Z_{12})$, or $Si(Z_{11})(Z_{12})$, $X_{41}$ is O, S, $N(Z_{21})$, $C(Z_{21})(Z_{22})$, or $Si(Z_{21})(Z_{22})$, $Y_{11}$, $Y_{12}$, $Z_1$, and $Z_2$ are each the same as described in the present specification, $Z_{11}$ to $Z_{18}$ and $Z_{21}$ to $Z_{28}$ are each the same as described in the present specification, d12 and d22 are each independently an integer from 0 to 2, d13 and d23 are each independently an integer from 0 to 3, d14 and d24 are each independently an integer from 0 to 4, d15 and d25 are each independently an integer from 0 to 5, d16 and d26 are each independently an integer from 0 to 6, and and *' in Formulae CY11-1 to CY11-34 and CY12-1 to CY12-34 each indicate a binding site to M in Formula 1, and *''' is a binding site to a neighboring atom in Formula 3C or $T_{21}$ in Formula 3D.

In one or more embodiments, $L_2$ in Formula 1 may be a ligand represented by Formula 3D, and at least one of $Z_1$ and $Z_2$ in Formula 3D may each independently be: deuterium; —Si($Q_3$)($Q_4$)($Q_5$); —Ge($Q_3$)($Q_4$)($Q_5$); or a $C_1$-$C_{60}$ alkyl group substituted with at least one deuterium.

In one or more embodiments, $L_2$ in Formula 1 may be a ligand represented by one of Formulae 3-1 and 3-101 to 3-112:

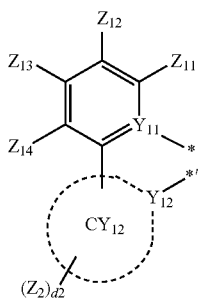
3-1

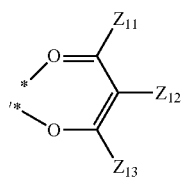
3-101

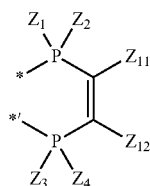
3-102

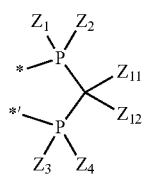
3-103

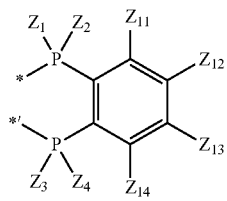
3-104

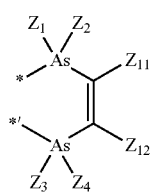
3-105

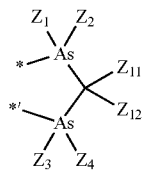
3-106

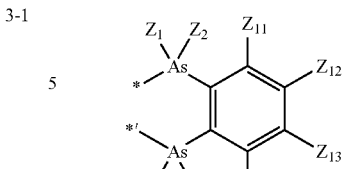
3-107

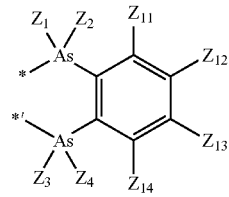
3-108

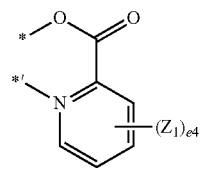
3-109

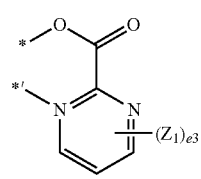
3-110

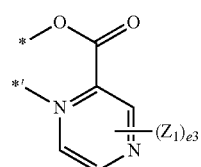
3-111

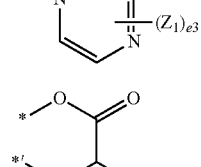
3-112

In Formulae 3-1 and 3-101 to 3-112,
- $Y_{11}$, $Y_{12}$, ring $CY_{12}$, $Z_1$ to $Z_4$, $Z_{11}$ to $Z_{13}$, and d2 are each the same as described in the present specification,
- $Z_{14}$ is the same as described in connection with $Z_1$ in the present specification,
- e2 is an integer from 0 to 2,
- e3 is an integer from 0 to 3,
- e4 is an integer from 0 to 4, and
- * and *' each indicate a binding site to M in Formula 1.

In one or more embodiments, $Y_{11}$ in Formula 3-1 may be N, and $Y_{12}$ may be C.

In one or more embodiments, $Z_{12}$ in Formula 3-1 may be: —Si($Q_3$)($Q_4$)($Q_5$); —Ge($Q_3$)($Q_4$)($Q_5$); or a $C_1$-$C_{60}$ alkyl group substituted with at least one deuterium, wherein $Q_3$ to $Q_5$ are the same as defined herein.

In one or more embodiments, $Z_{12}$ in Formula 3-1 may be —Si($Q_3$)($Q_4$)($Q_5$) or —Ge($Q_3$)($Q_4$)($Q_5$), and $Z_{13}$ may neither be hydrogen nor a methyl group, wherein $Q_3$ to $Q_5$ are the same as defined herein.

In one or more embodiments, a group represented by

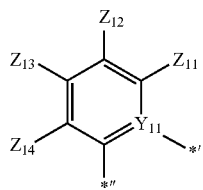
in Formula 3-1 may be a group represented by one of Formulae 3-1-1 to 3-1-16 and(or),
a group represented by
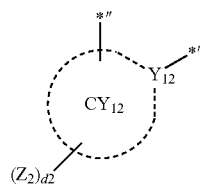
in Formula 3-1 may be a group represented by one of Formulae 3-1(1) to 3-1(16):
3-1-1
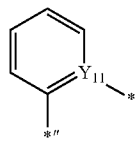
3-1-2
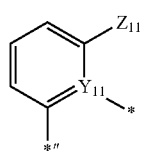
3-1-3
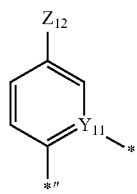
3-1-4
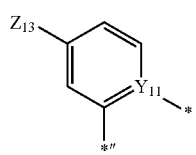
3-1-5
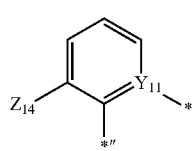
3-1-6
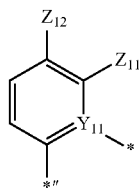
3-1-7
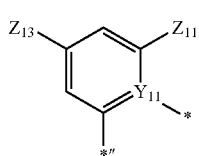
3-1-8
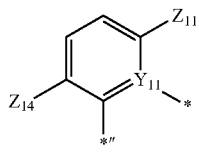
3-1-9
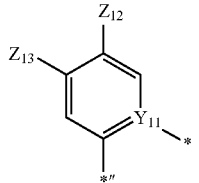
3-1-10
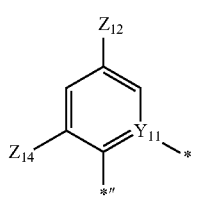
3-1-11
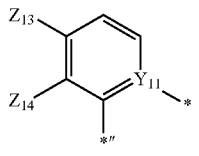
3-1-12
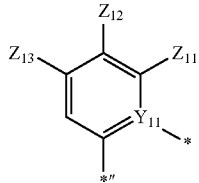
3-1-13
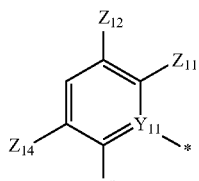
3-1-14
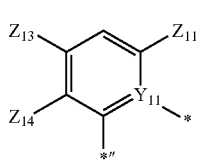

-continued
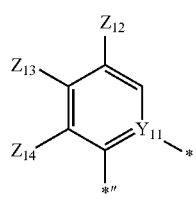
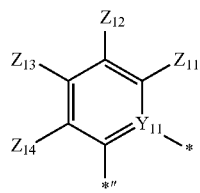
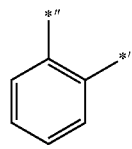
3-1(1)
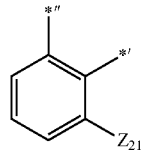
3-1(2)
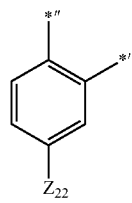
3-1(3)
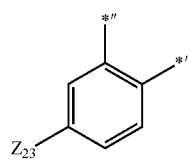
3-1(4)
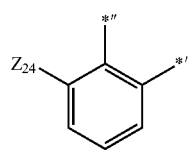
3-1(5)
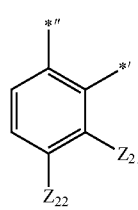
3-1(6)
-continued
3-1-15
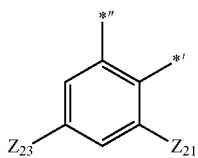
3-1(7)
3-1-16
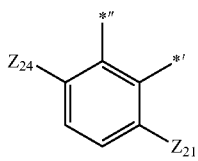
3-1(8)
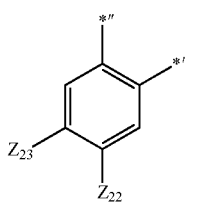
3-1(9)
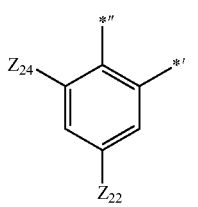
3-1(10)
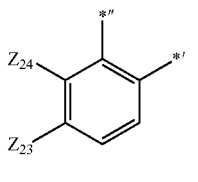
3-1(11)
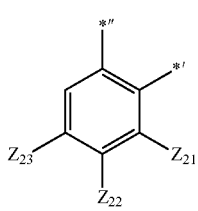
3-1(12)
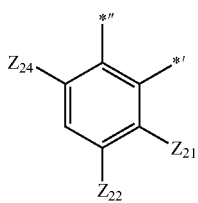
3-1(13)
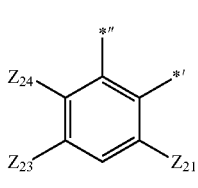
3-1(14)

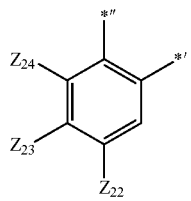

3-1(15)

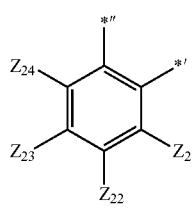

3-1(16)

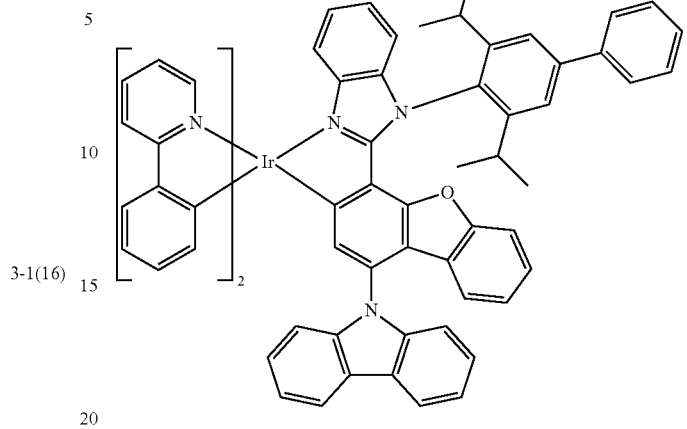

In Formulae 3-1-1 to 3-1-16 and 3-1(1) to 3-1(16), $Z_{11}$ to $Z_{14}$ are each the same as described in the present specification, and $Z_{21}$ to $Z_{24}$ are each the same as respectively in connection with $Z_2$ in the present specification, wherein $Z_{11}$ to $Z_{14}$ and $Z_{21}$ to $Z_{24}$ may not be hydrogen, and *' each indicate a binding site to M in Formula 1, and " indicates a binding site to a neighboring atom.

In Formula 2, i) two or more of a plurality of $R_1(s)$ are optionally linked to each other to form a $C_5$-$C_{30}$ carbocyclic group that is unsubstituted or substituted with at least one $R_{10a}$ or two or more of a plurality of $R_1(s)$ are optionally linked to each other to form a $C_1$-$C_{30}$ heterocyclic group that is unsubstituted or substituted with at least one $R_{10a}$, ii) two or more of a plurality of $R_2(s)$ are optionally linked to each other to form a $C_5$-$C_{30}$ carbocyclic group that is unsubstituted or substituted with at least one $R_{10a}$ or two or more of a plurality of $R_2(s)$ are optionally linked to each other to form a $C_1$-$C_{30}$ heterocyclic group that is unsubstituted or substituted with at least one $R_{10a}$, and iii) two or more of $R_1$ to $R_3$ are optionally linked to each other to form a $C_5$-$C_{30}$ carbocyclic group that is unsubstituted or substituted with at least one $R_{10a}$ or two or more of $R_1$ to $R_3$ are optionally linked to each other to form a $C_1$-$C_{30}$ heterocyclic group that is unsubstituted or substituted with at least one $R_{10a}$.

$R_{10a}$ is the same as described in connection with $R_1$ in the present specification.

* and *' in Formula 2 each indicate a binding site to M in Formula 1.

In one or more embodiments, the organometallic compound represented by Formula 1 may include at least one deuterium.

In one or more embodiments, $L_1$ in Formula 1 may include at least one deuterium.

In one or more embodiments, in Formula 1, n2 may not be 0, and $L_2$ may include at least one deuterium.

In one or more embodiments, the organometallic compound represented by Formula 1 may be one of Compounds 1 to 79:

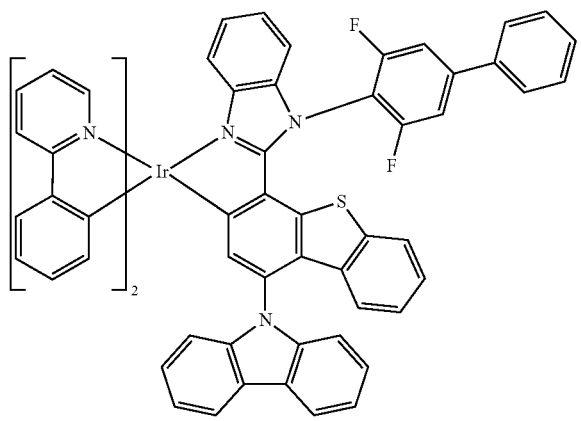
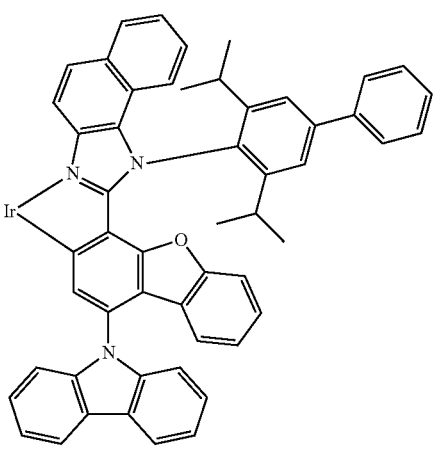
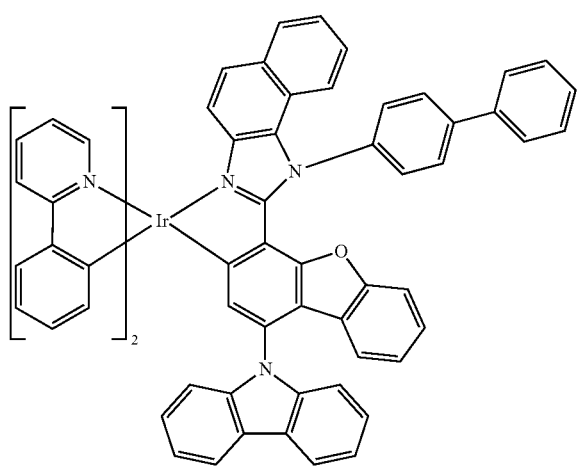
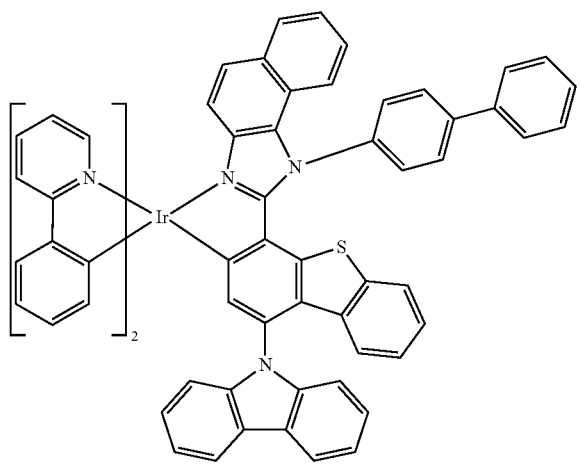
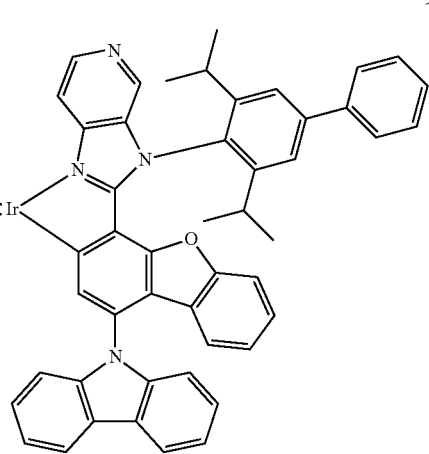

10
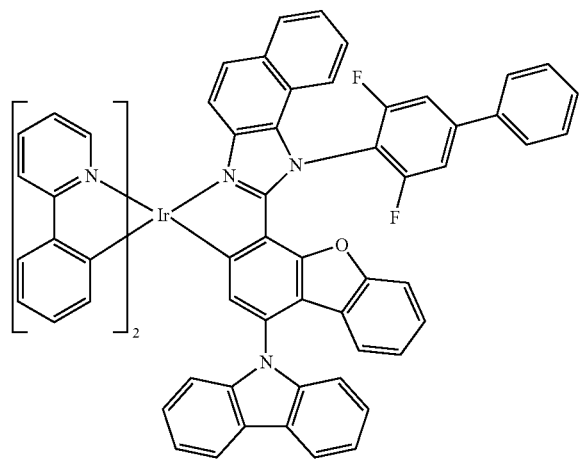
13
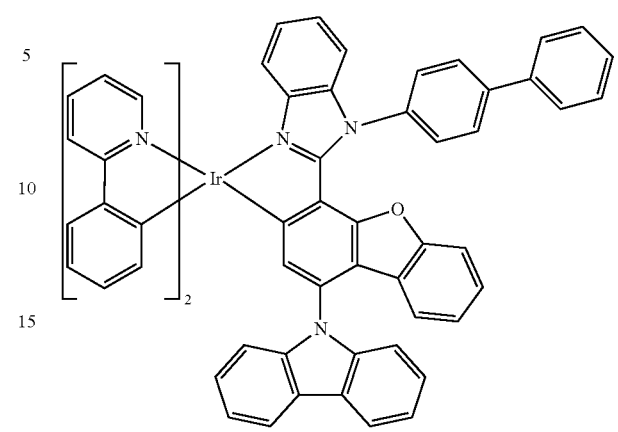
11
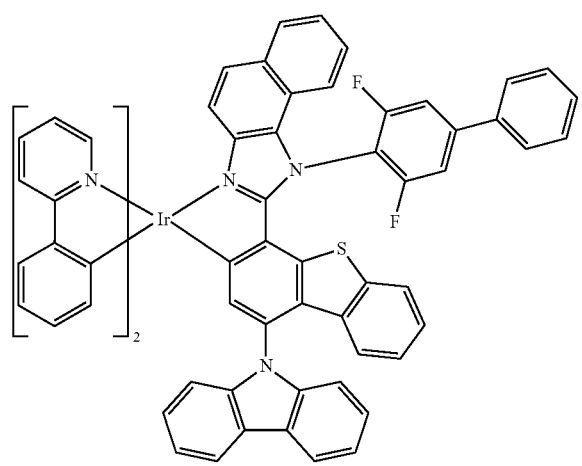
14
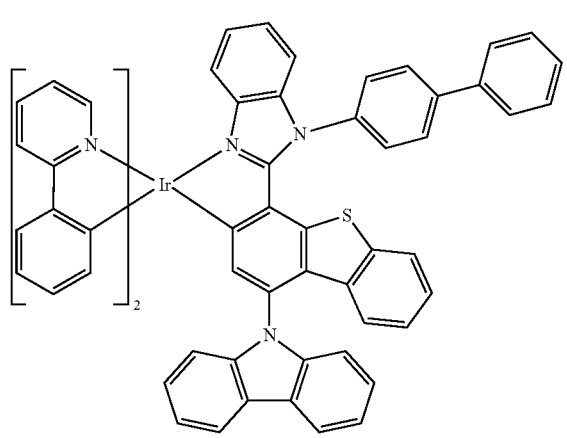
12
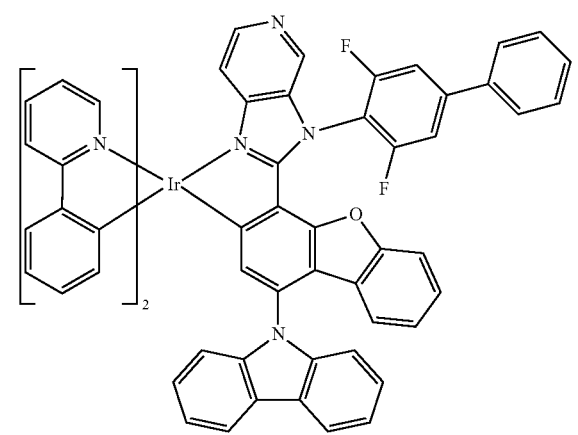
15
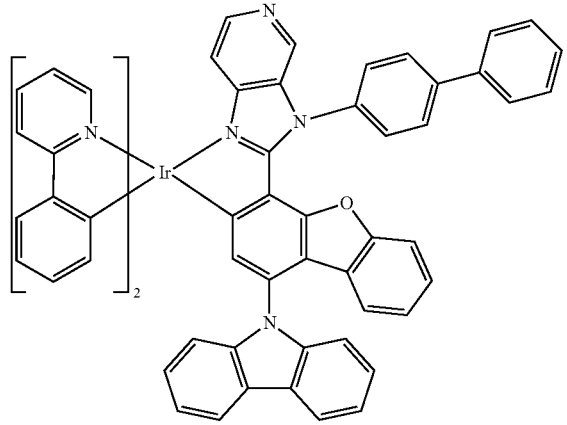

95
-continued
16
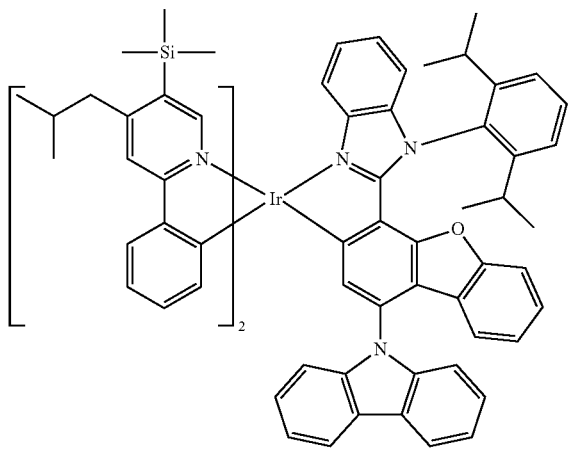
17
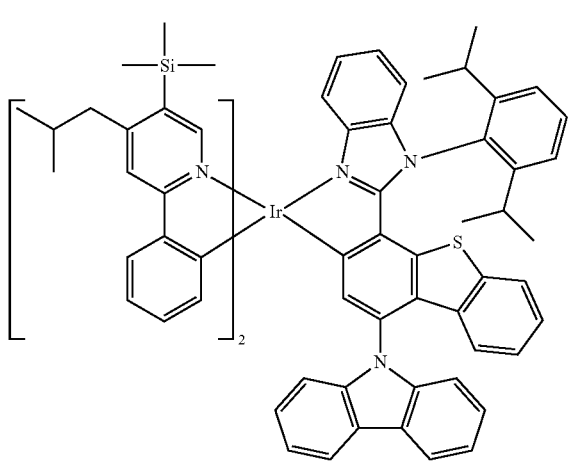
18
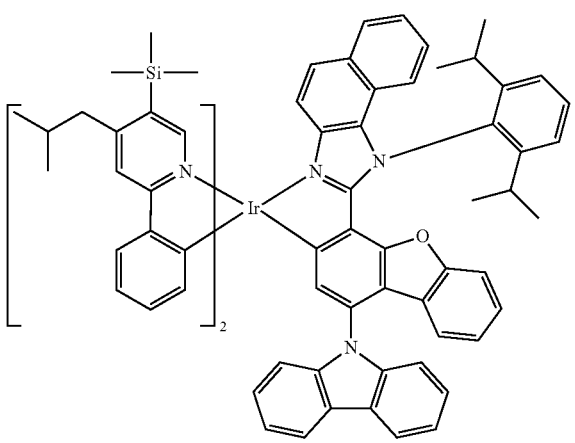
96
-continued
19
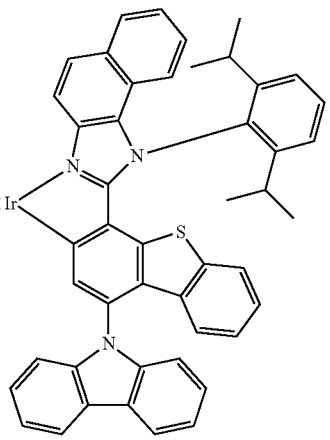
20
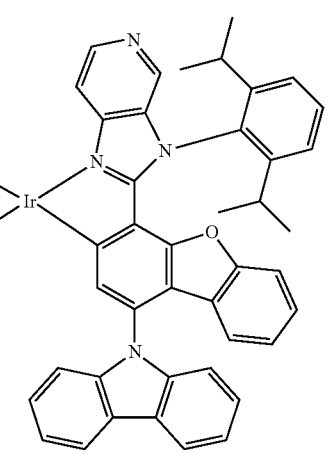
21
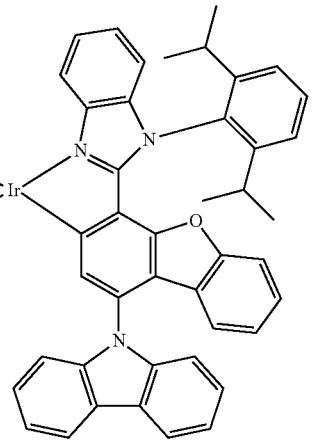

97
-continued
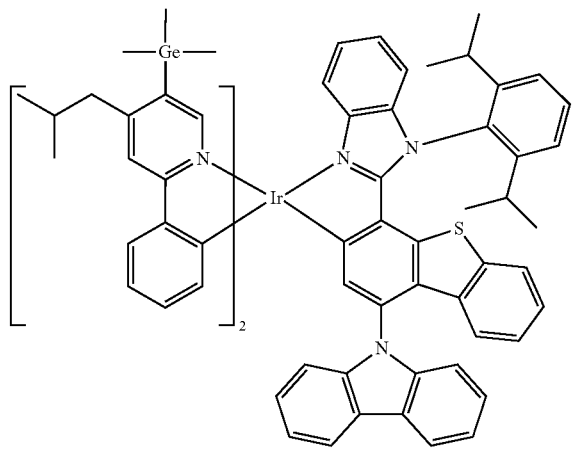
98
-continued
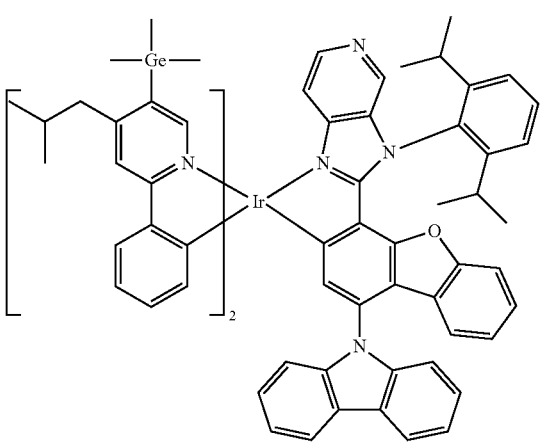
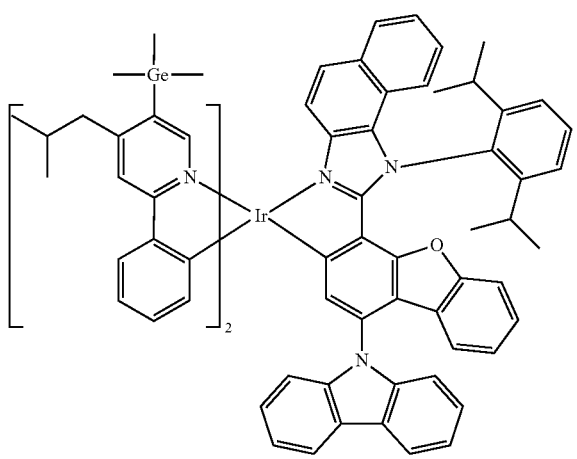
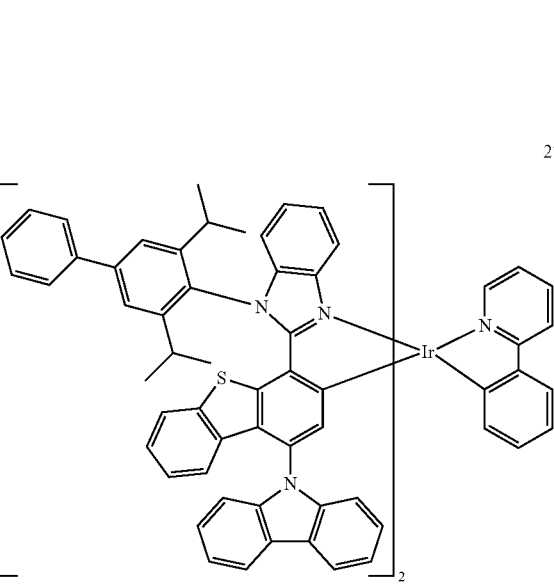
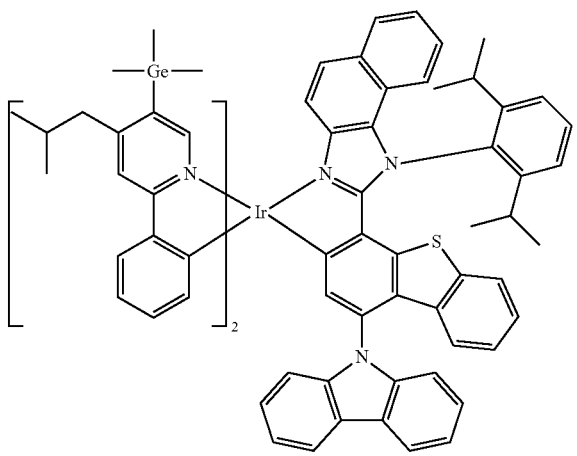

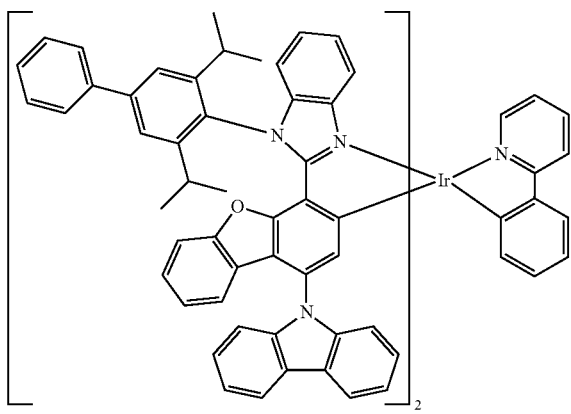
28
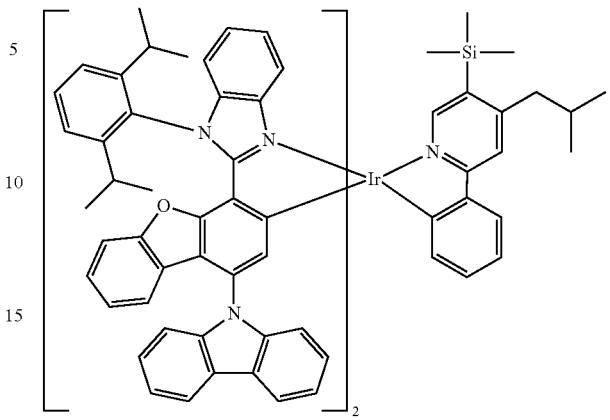
31
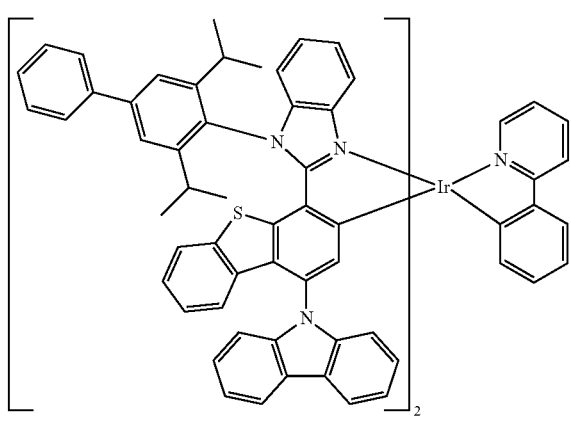
29
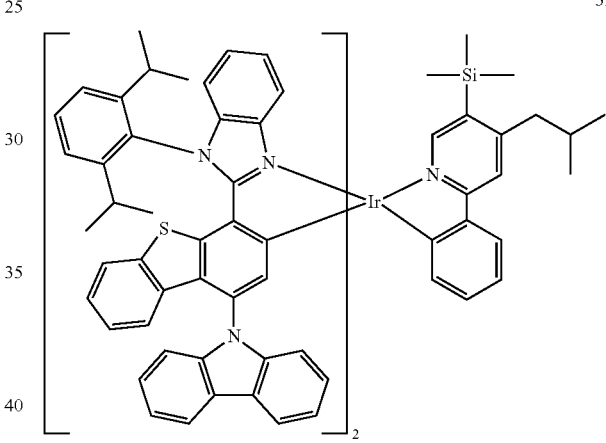
32
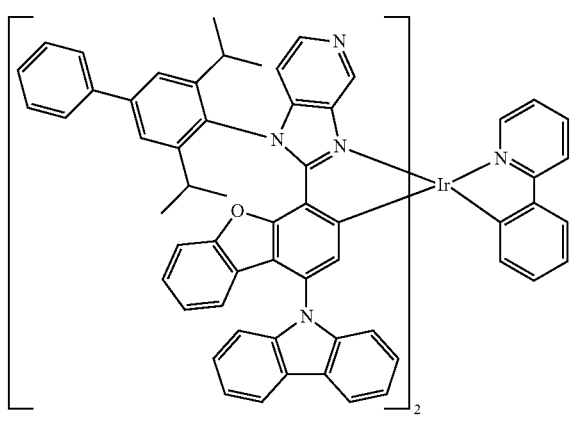
30
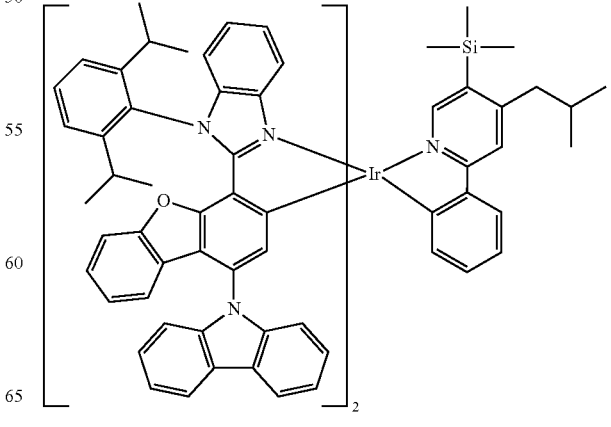
33

34
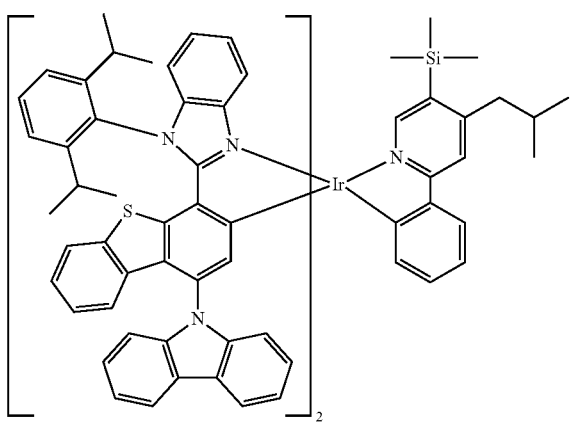
35
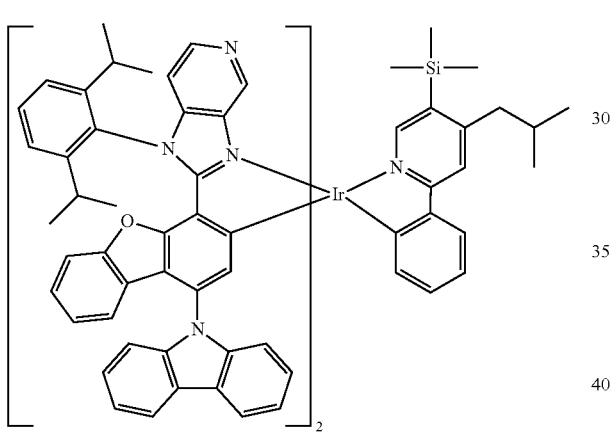
36
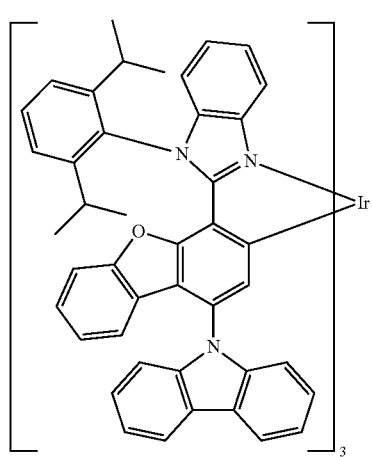
37
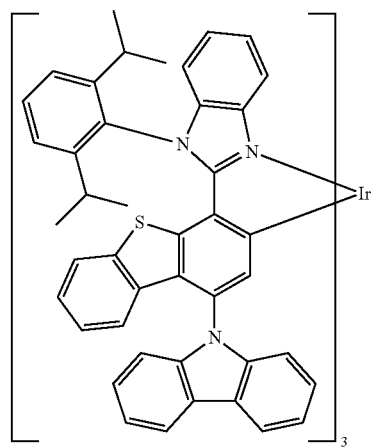
38
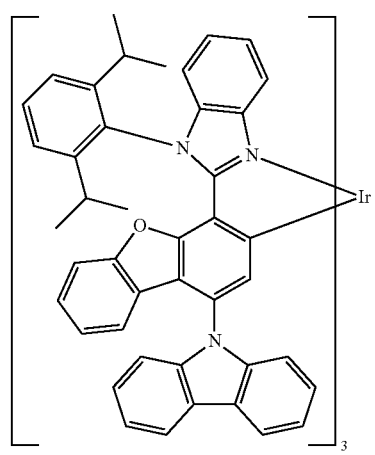
39
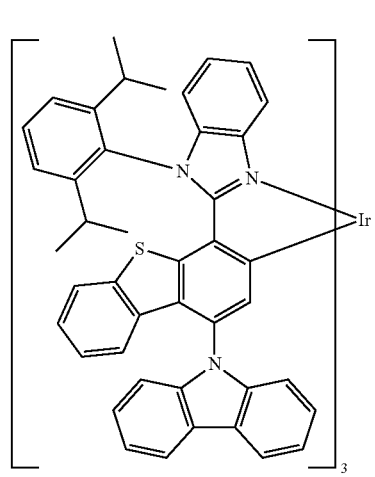

103
40
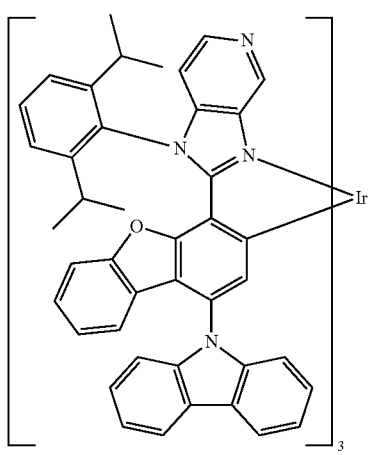
104
43
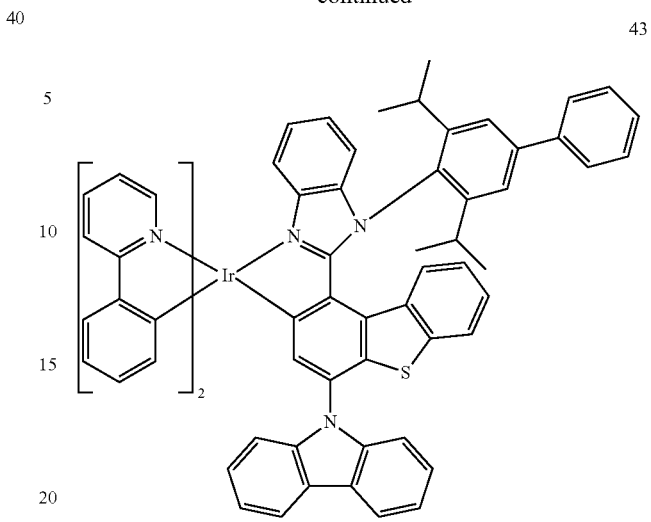
41
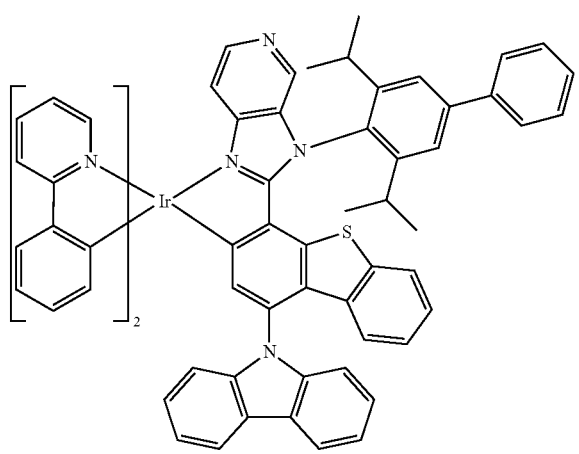
44
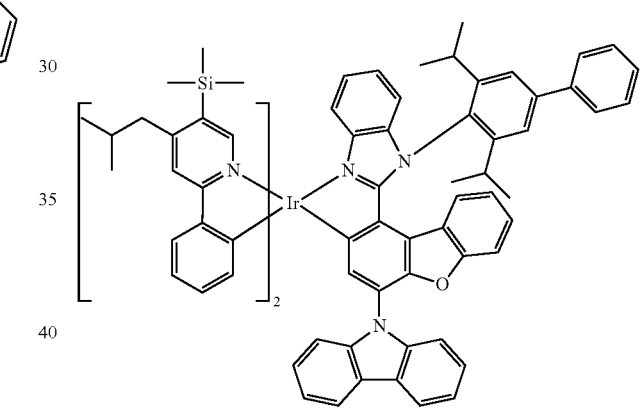
42
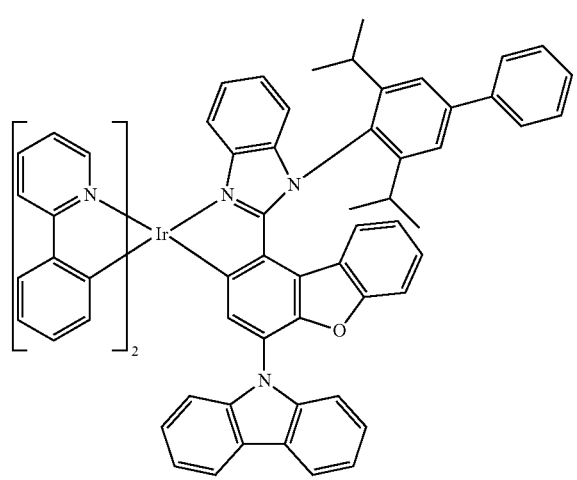
45

105
-continued
46
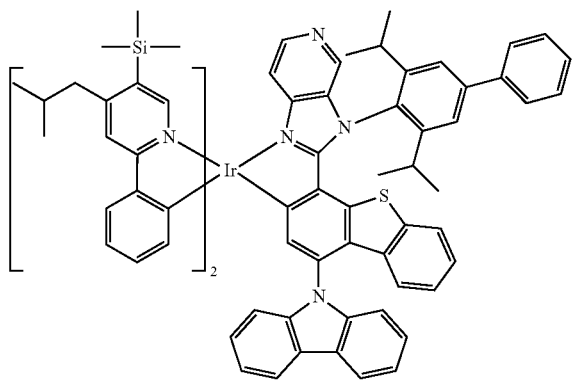
47
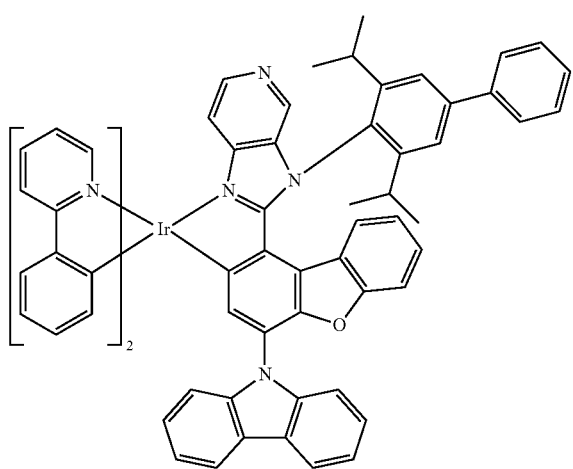
48
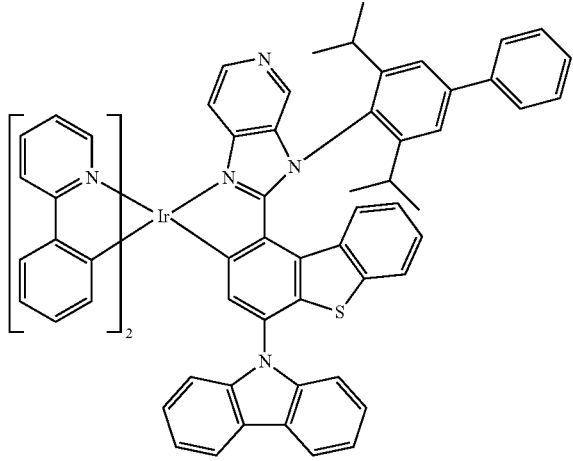
106
-continued
49
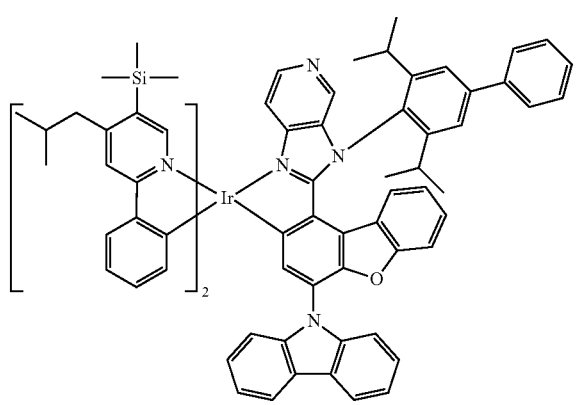
50
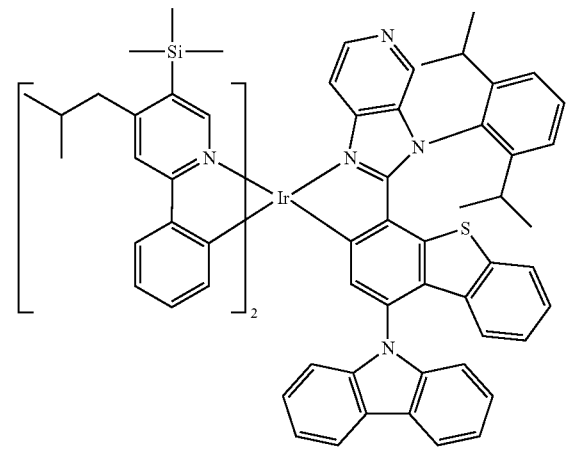
51

52
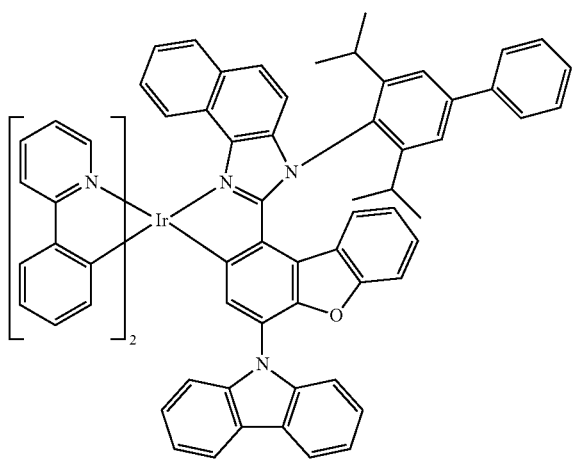
53
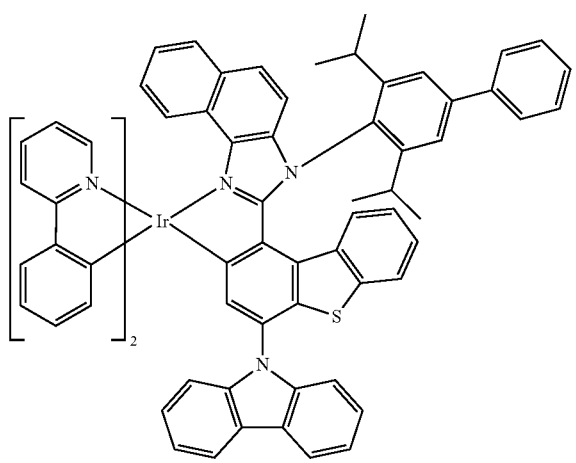
54
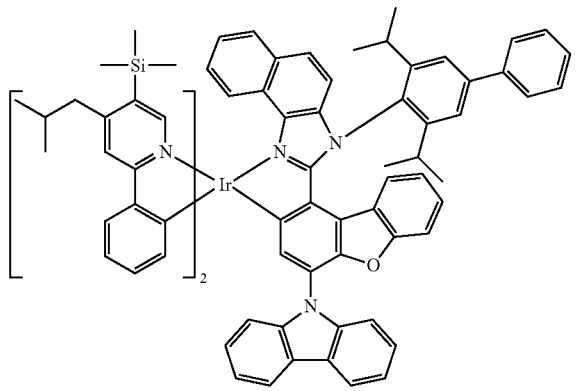
55
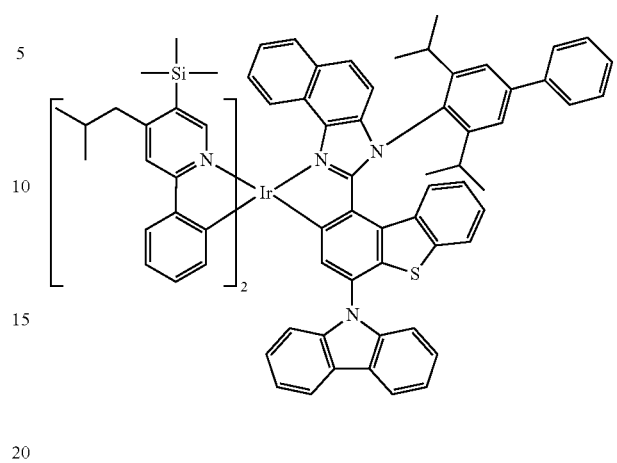
56
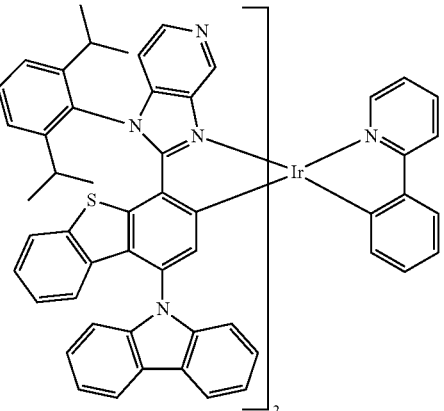
57
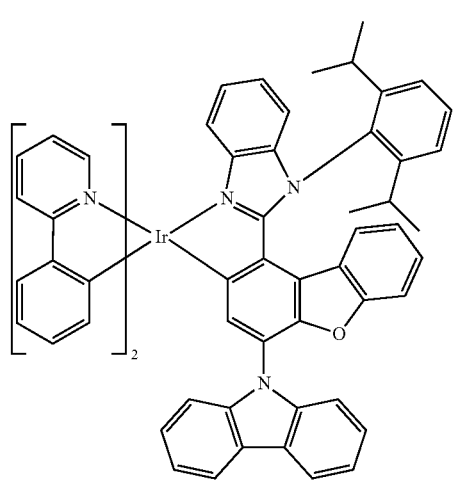

58
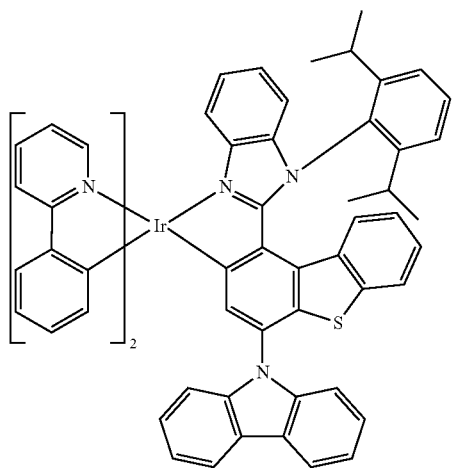
61
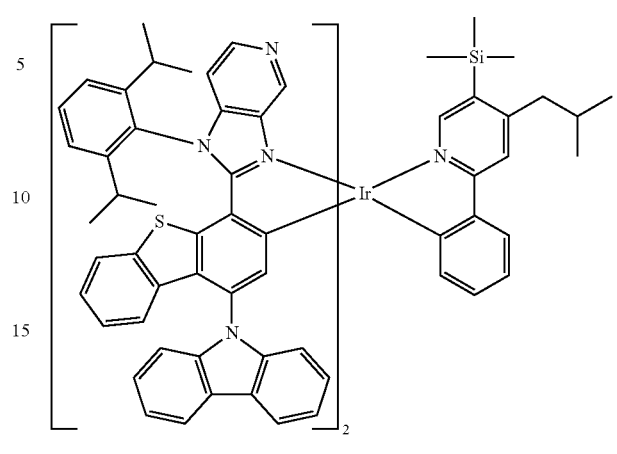
59
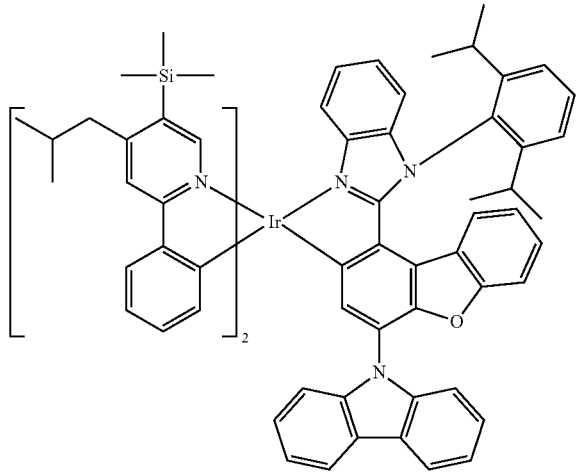
62
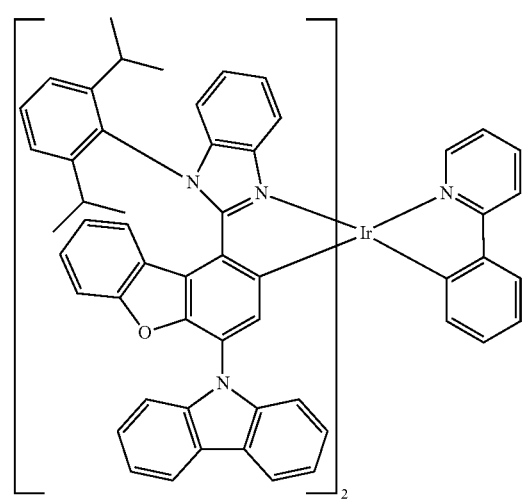
60
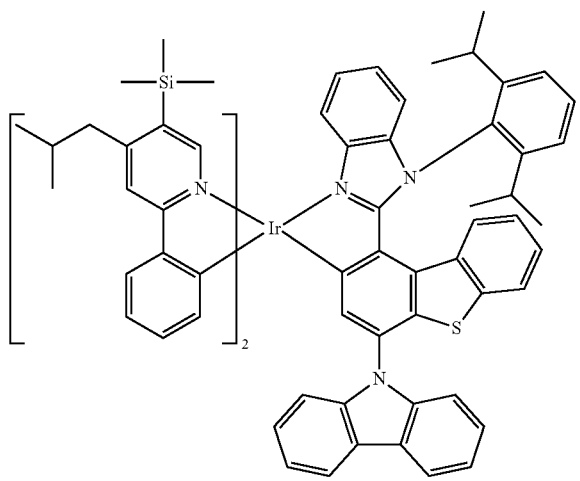
63
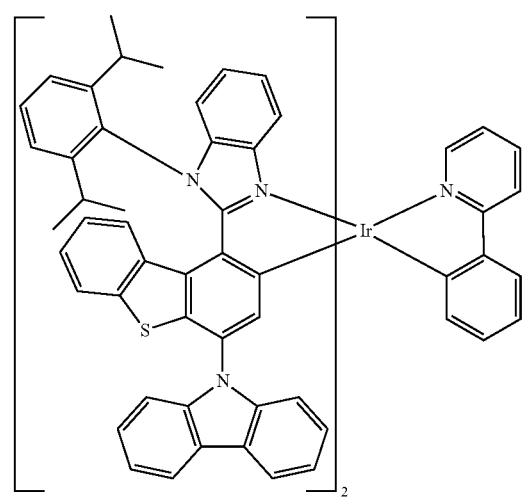

64
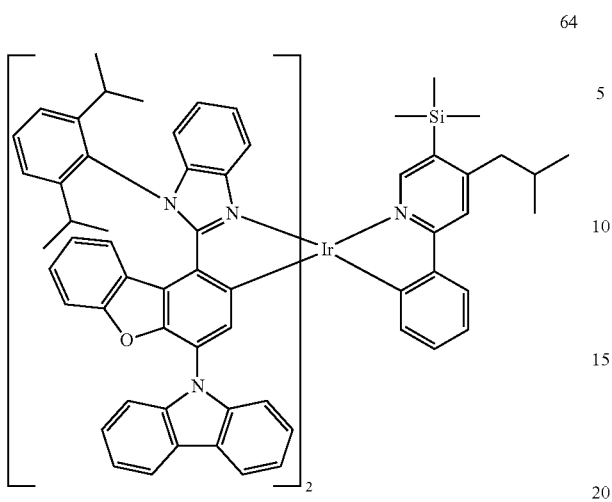
65
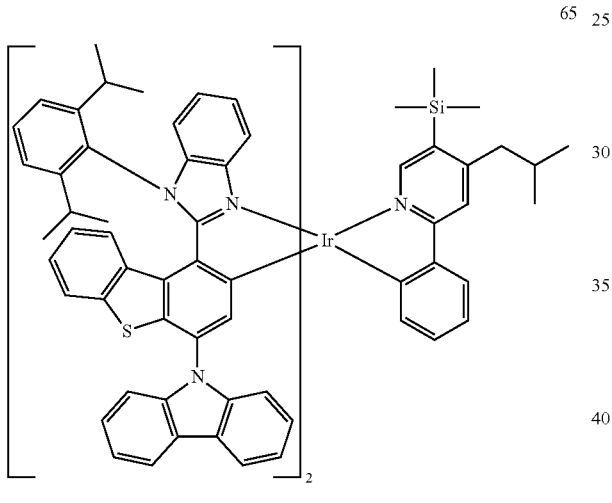
66
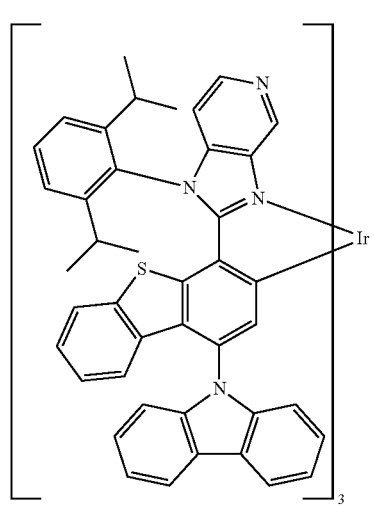
67
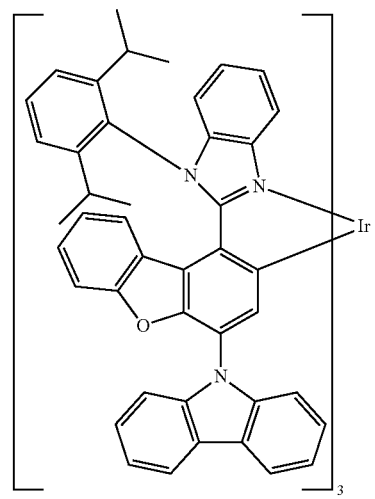
68
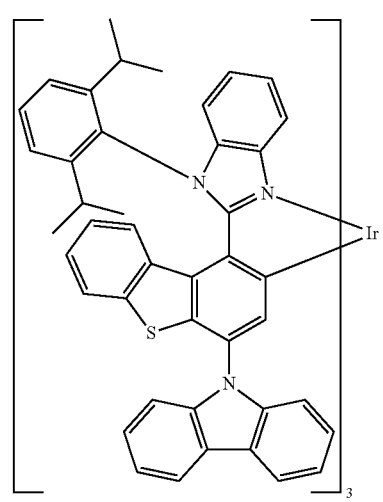
69
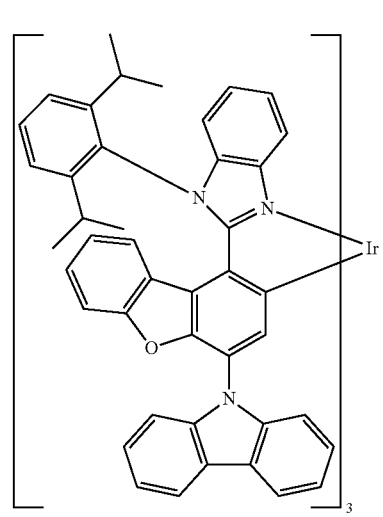

70
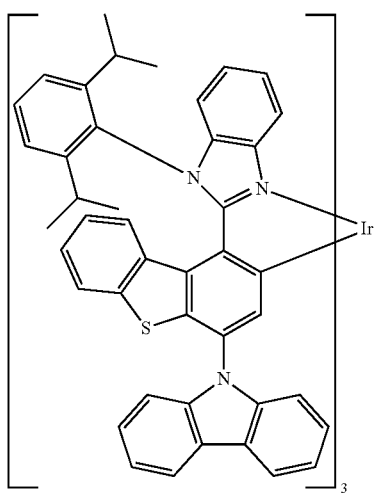
73
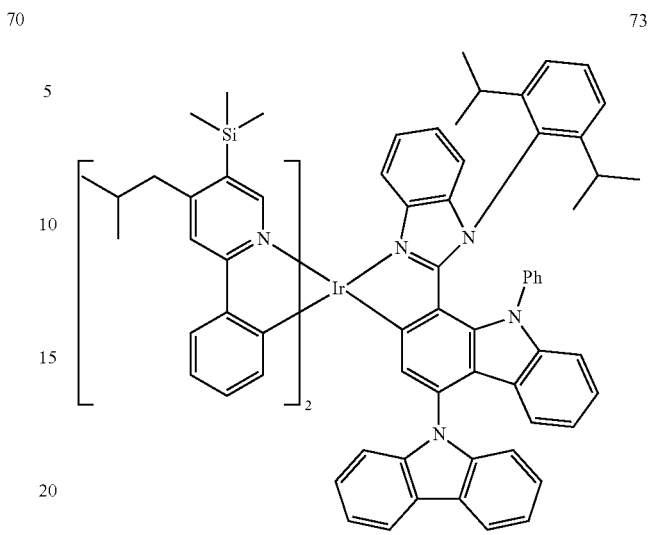
71
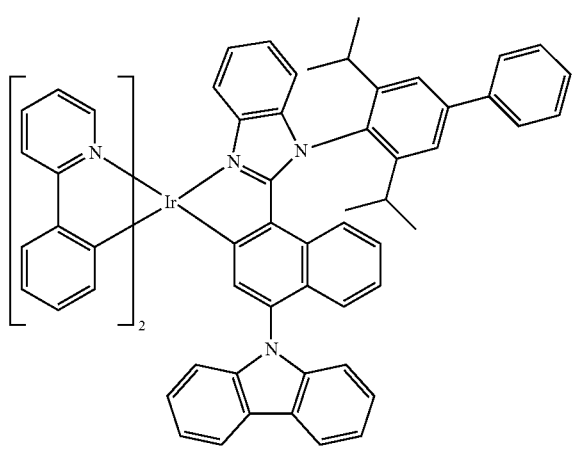
74
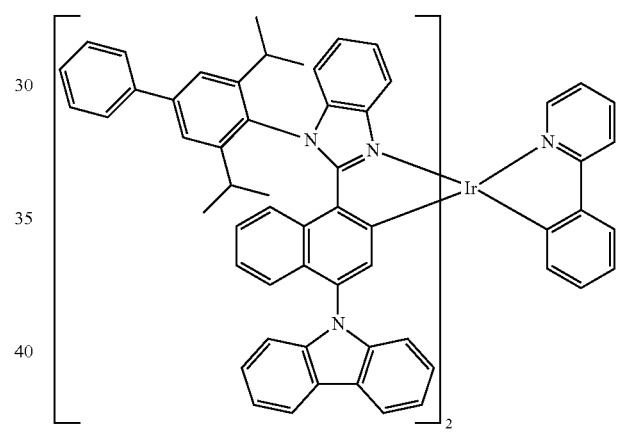
72
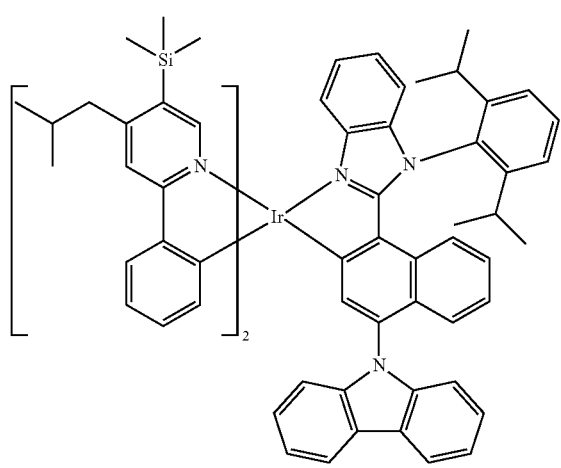
75
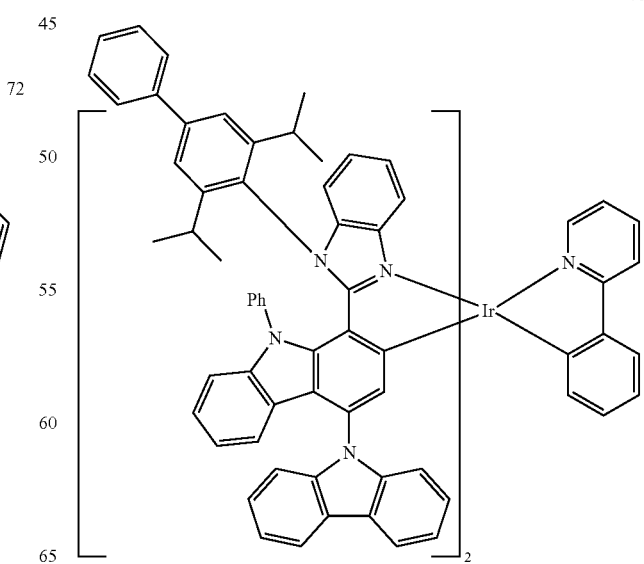

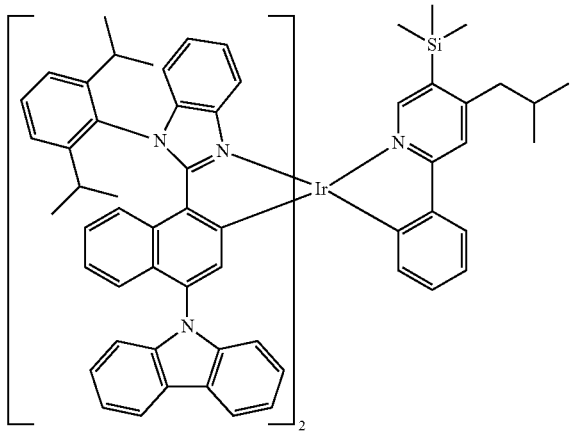

76

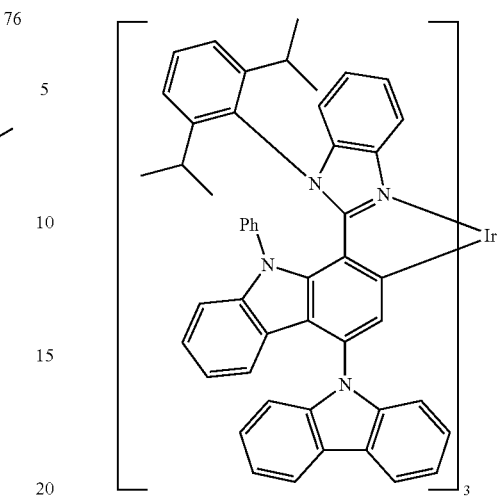

79

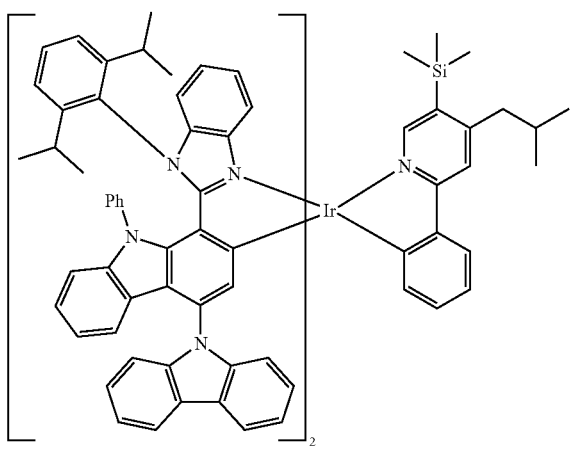

77

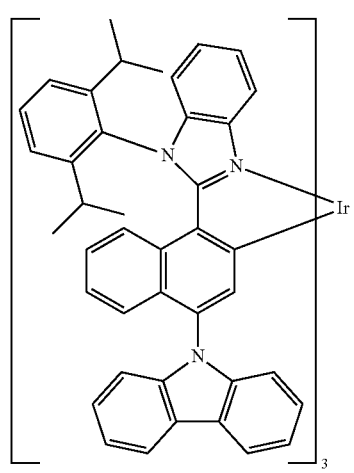

78

In the organometallic compound represented by Formula 1, $L_1$ is a ligand represented by Formula 2, and n1, which is the number of $L_1$(s) is 1, 2, or 3. In other words, the organometallic compound is a ligand bonded to metal M and essentially includes a ligand represented by at least one Formula 2.

ring $CY_1$ in Formula 2 may be a $C_5$-$C_{30}$ carbocyclic group or a $C_1$-$C_{30}$ heterocyclic group, wherein, when a) $A_{21}$ to $A_{24}$ are each C and b) $L_{11}$ is a single bond or a $C_5$-$C_{30}$ carbocyclic group that is unsubstituted or substituted with at least one $R_{10a}$, ring $CY_1$ may not be a benzene group. In one or more embodiments, in the ligand represented by Formula 2, ring $CY_1$ may be a condensed cyclic group in which two or more cyclic groups are condensed with each other. Also, in Formula 2, c1 is not 0, and $T_1$ is a carbazole group unsubstituted or substituted with at least one $R_{10a}$. Accordingly, it is possible to supply abundant pi-electrons to ring $CY_1$, and thus, an electronic device, for example, an organic light-emitting device, including the organometallic compound represented by Formula 1 may have high luminescence efficiency and excellent thermal stability.

The highest occupied molecular orbital (HOMO) energy level, lowest unoccupied molecular orbital (LUMO) energy level, $S_1$ energy level, and $T_1$ energy level (in electron volts, eV) of some compounds of the organometallic compound represented by Formula 1 were evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | $S_1$ (eV) | $T_1$ (eV) |
|---|---|---|---|---|
| 1 | −4.896 | −1.323 | 2.885 | 2.500 |
| 2 | −4.905 | −1.430 | 2.830 | 2.485 |

From Table 1, it is confirmed that the organometallic compound represented by Formula 1 has such electric characteristics that are suitable for use as a dopant in an emission layer of an electronic device, for example, an organic light-emitting device.

Synthesis methods of the organometallic compound represented by Formula 1 may be recognizable by one of ordinary skill in the art by referring to the Synthesis Examples provided below.

Accordingly, the organometallic compound represented by Formula 1 is suitable for use as a material for an organic layer of organic light-emitting device, for example, a dopant in an emission layer of the organic layer. Thus, according to another aspect, provided is an organic light-emitting device including: a first electrode; a second electrode; and an organic layer located between the first electrode and the second electrode and including an emission layer, wherein the organic layer includes at least one organometallic compound represented by Formula 1.

The organic light-emitting device includes an organic layer including the organometallic compound represented by Formula 1 as described above, and thus, may have low driving voltage, high external quantum efficiency, and low roll-off ratio.

The organometallic compound of Formula 1 may be used between a pair of electrodes of an organic light-emitting device. In one or more embodiments, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light or green light.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

In one or more embodiments, the organic layer may include, as the organometallic compound, only Compound 1. In this embodiment, Compound 1 may exist in the emission layer of the organic light-emitting device. In one or more embodiments, the organic layer may include, as the organometallic compound, both Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region between the first electrode and the emission layer and an electron transport region between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

The FIGURE is a schematic cross-sectional view of an organic light-emitting device 10 according to one or more embodiments. Hereinafter, a structure and a method of manufacturing an organic light-emitting device according to one or more embodiments of the present disclosure will be described with reference to the FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may be m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANT/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

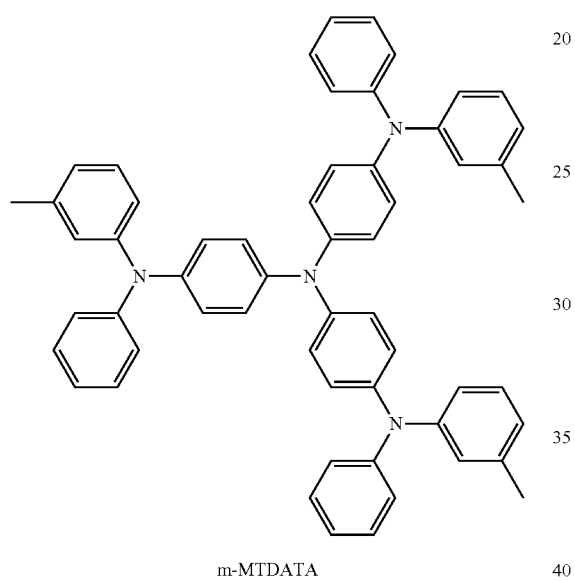

m-MTDATA

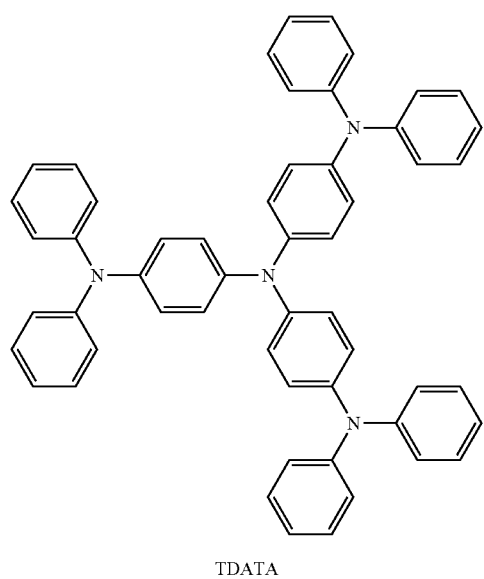

TDATA

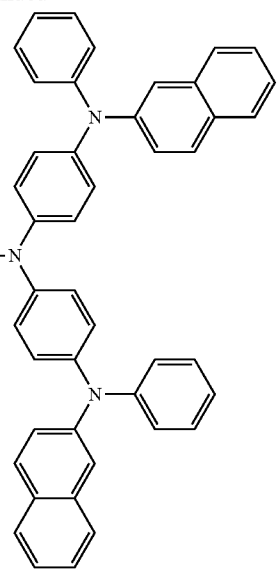

2-TNATA

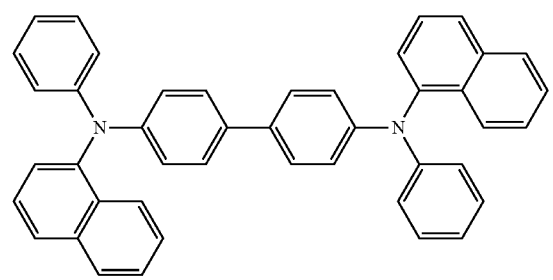

NPB

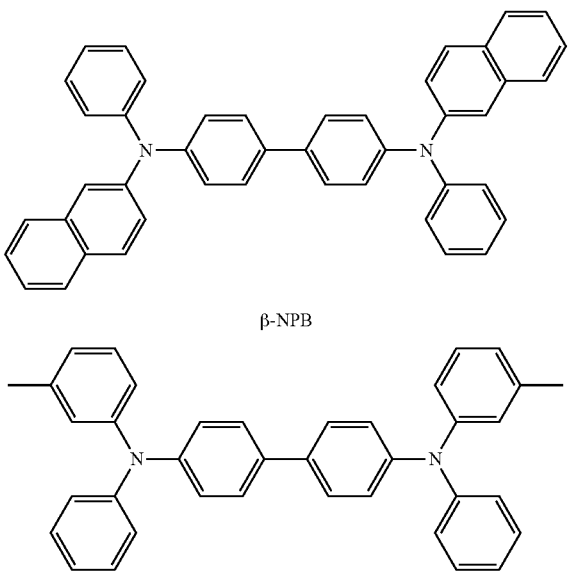

β-NPB

TPD

-continued

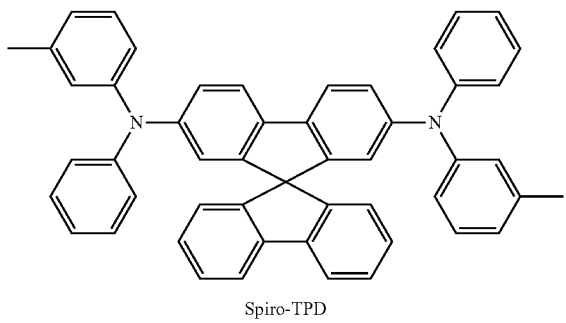

Spiro-TPD

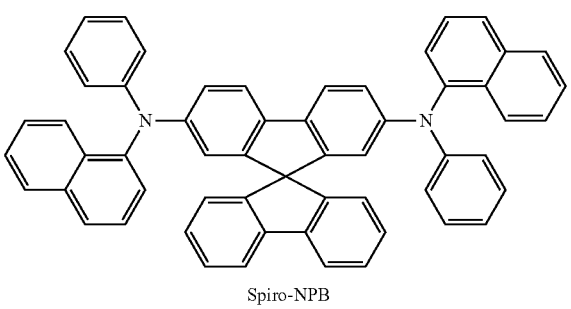

Spiro-NPB

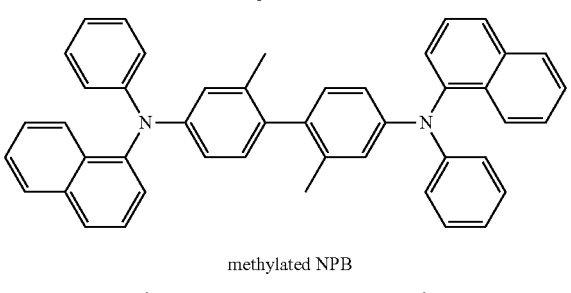

methylated NPB

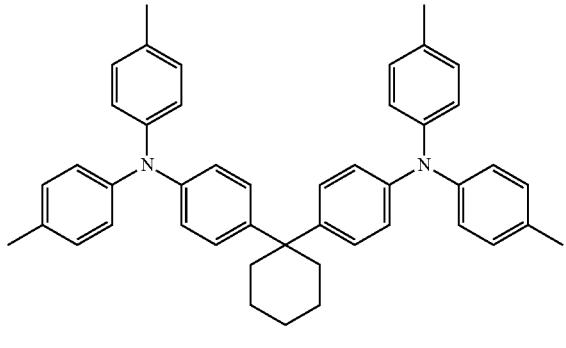

TAPC

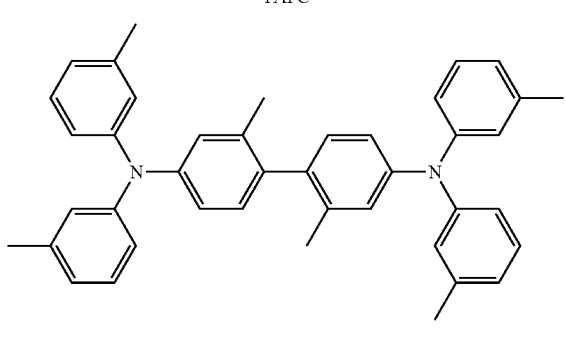

HMTPD

-continued

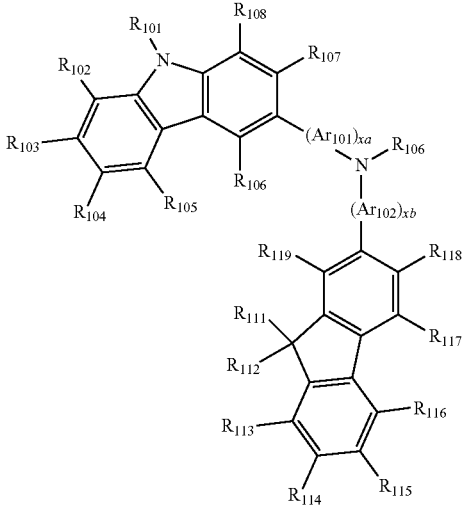

Formula 201

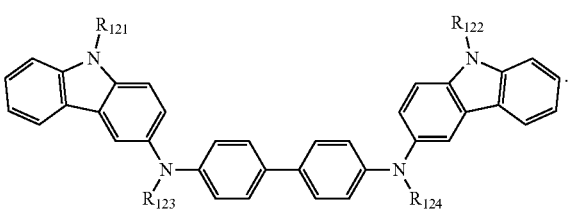

Formula 202

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, an $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

In Formula 201, xa and xb may each independently be an integer from 0 to 5, or 0, 1 or 2. In one or more embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a phenyl group, a naphthyl group, an anthracenyl group, a fluorenyl group, or a pyrenyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 201, $R_{109}$ may be a phenyl group, a naphthyl group, an anthracenyl group, or a pyridinyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In one or more embodiments, the compound represented by Formula 201 may be represented by Formula 201A:

Formula 201A

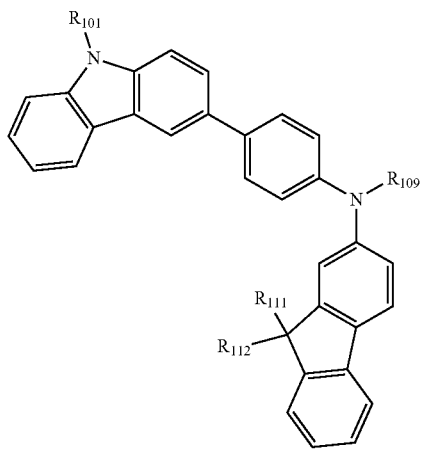

In Formula 201A, the detailed descriptions of $R_{101}$, $R_{111}$, $R_{112}$, and $R_{109}$ are the same as described herein.

In one or more embodiments, the compound represented by Formula 201 and the compound represented by Formula 202 may include Compounds HT1 to HT20 illustrated below:

HT1

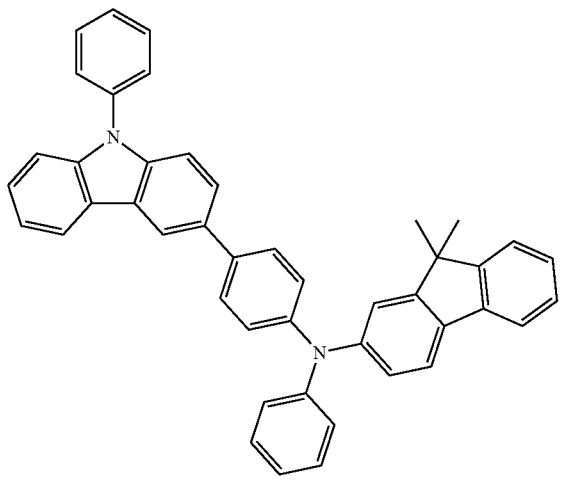

HT2

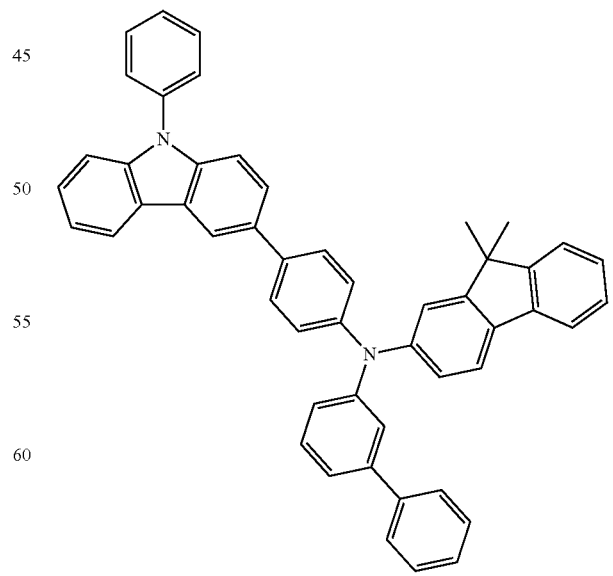

HT3
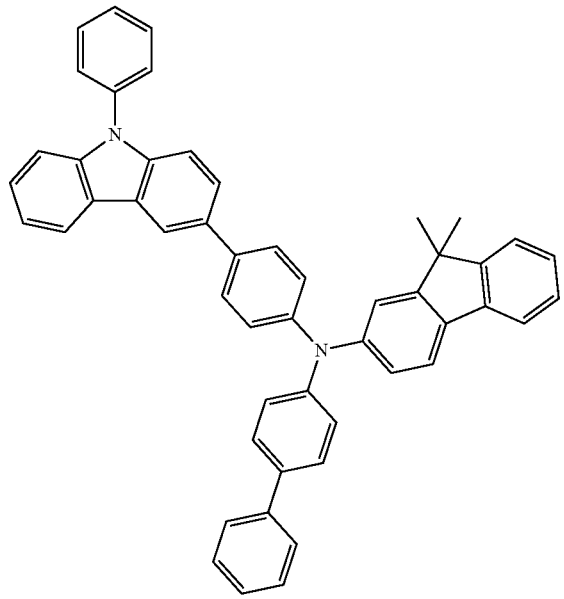
HT4
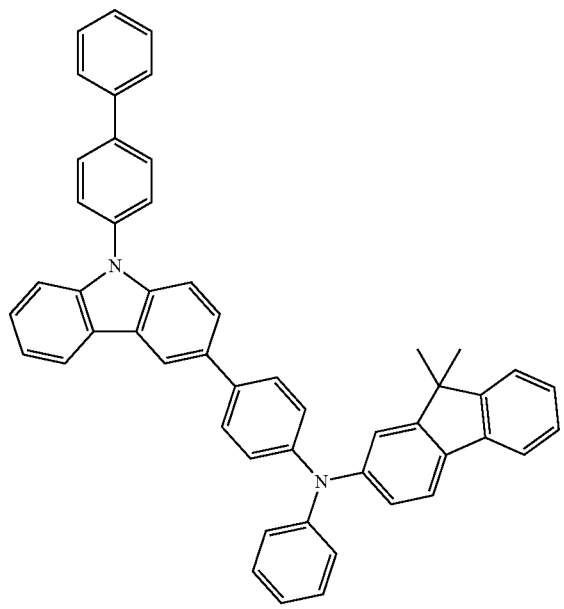
HT5
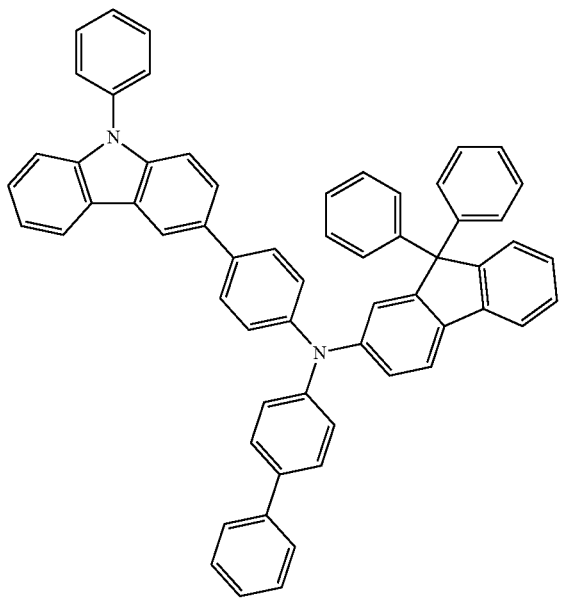
HT6
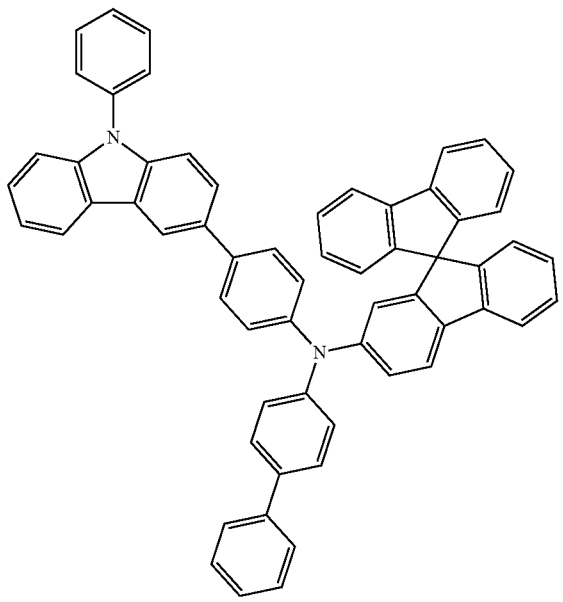

HT7
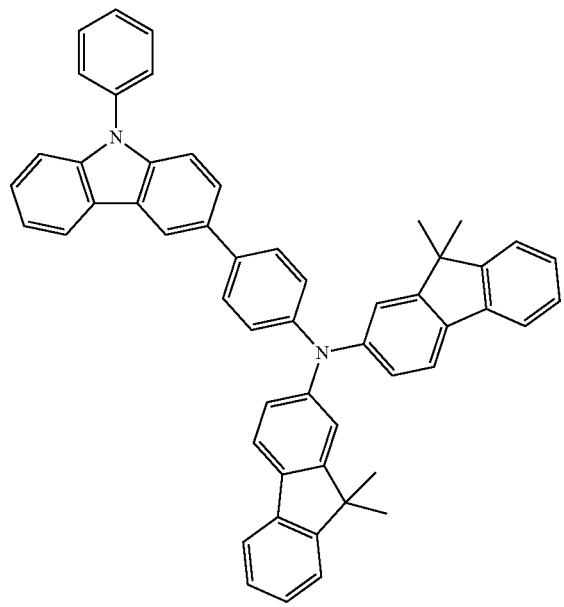
HT8
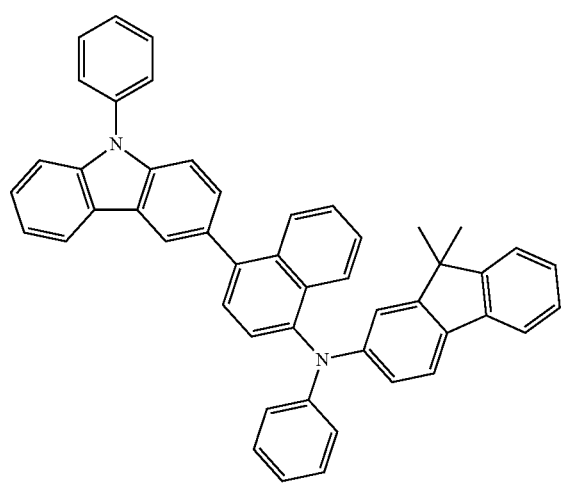
HT9
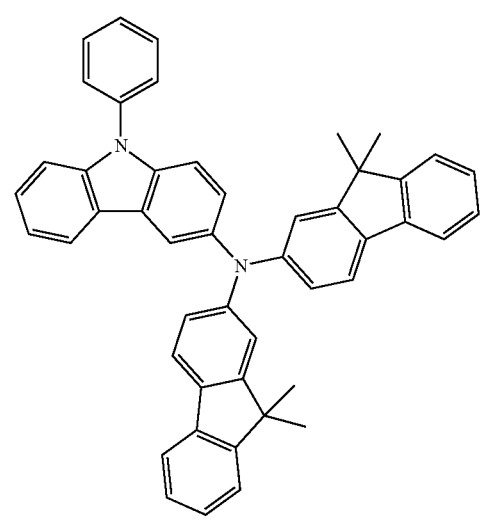
HT10
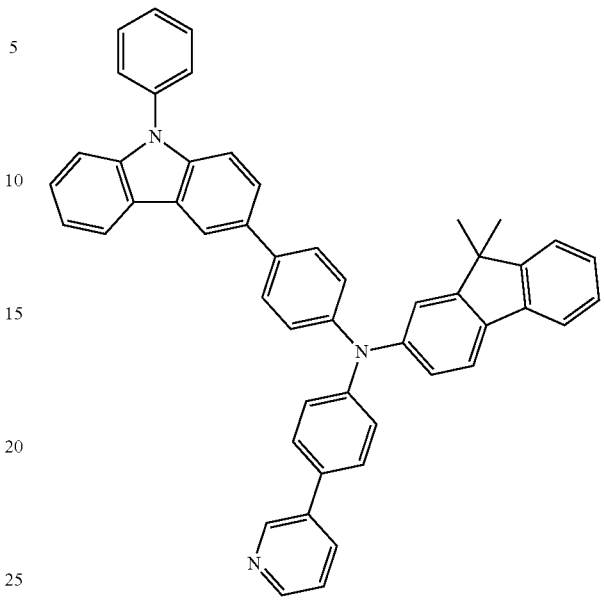
HT11
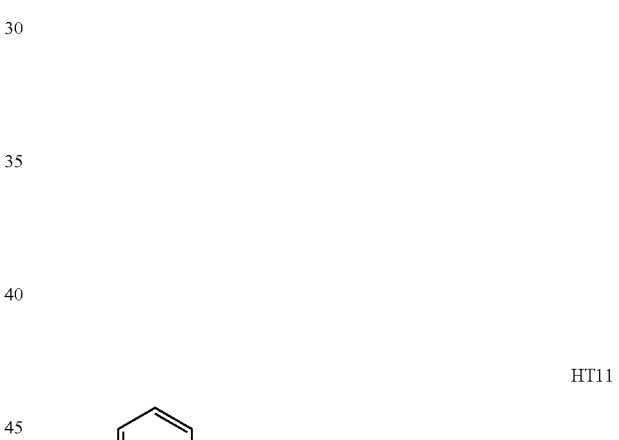

HT12
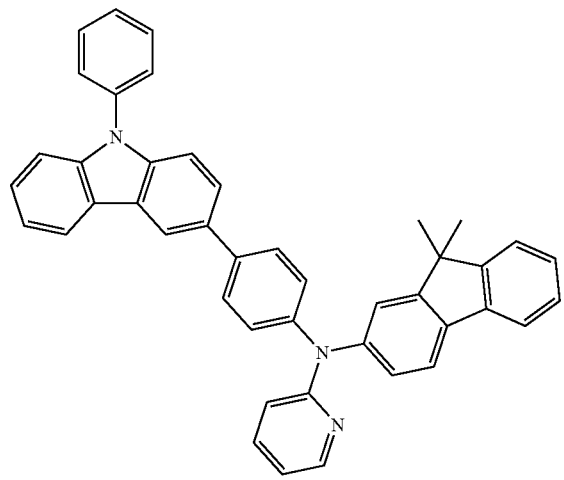
HT13
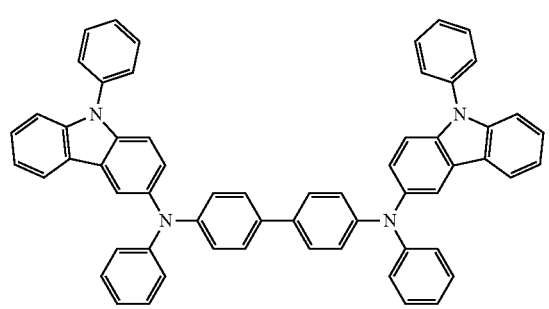
HT14
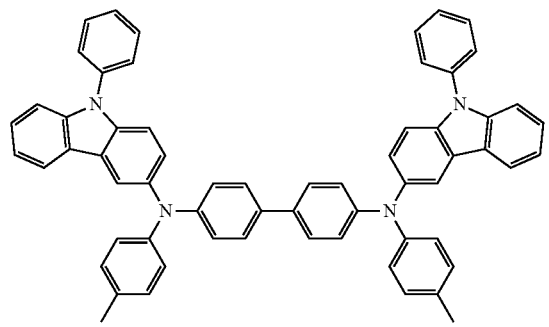
HT15
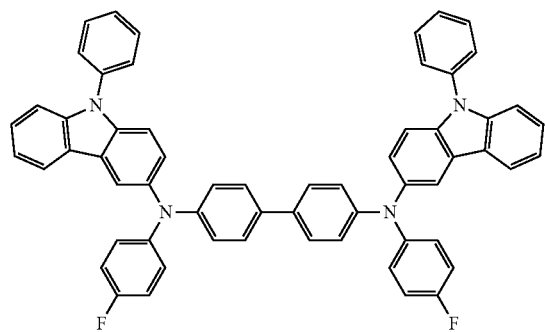
HT16
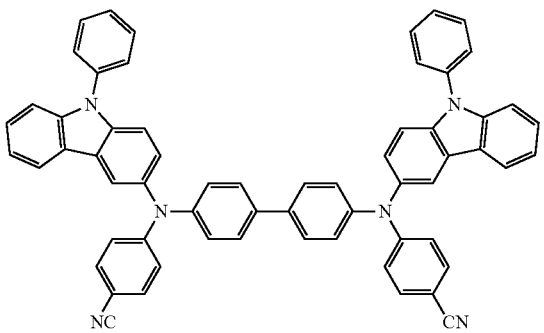
HT17
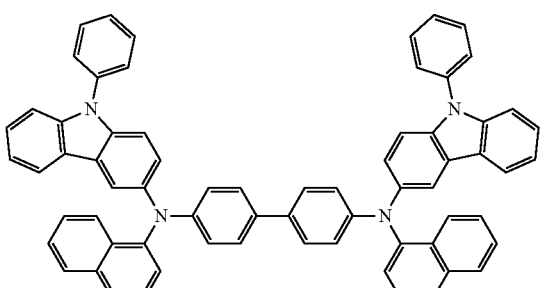
HT18
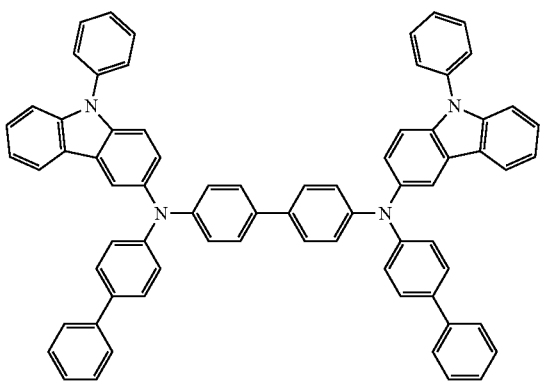
HT19
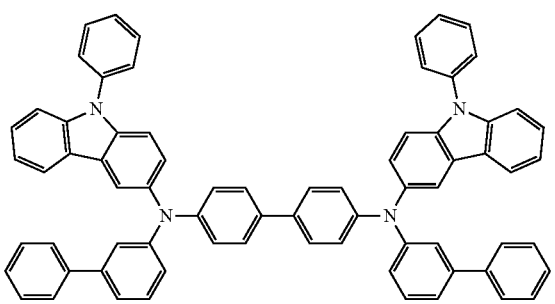

HT20

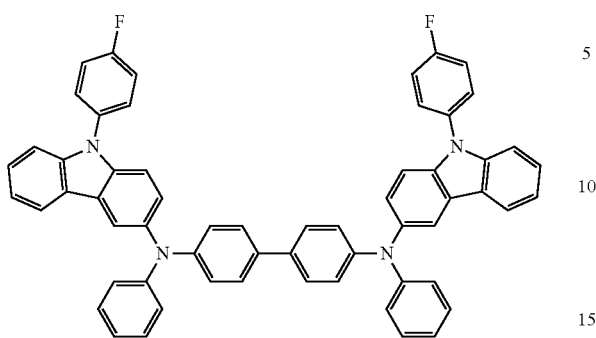

A thickness of the hole transport region may be in the range of about 100 angstrom (Å) to about 10,000 Å, for example, about 100 Å to about 1,000 Å. When the hole transport region includes a hole injection layer, a hole transport layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generating material may be, for example, a p-dopant. The p-dopant may be one of a quinone derivative, a metal oxide, and a cyano group-containing compound. In one or more embodiments, non-limiting examples of the p-dopant are a quinone derivative, such as tetracyanoquinodimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a cyano group-containing compound, such as Compound HT-D1 or Compound HT-D2 below.

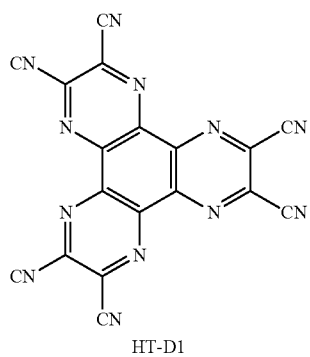

HT-D1

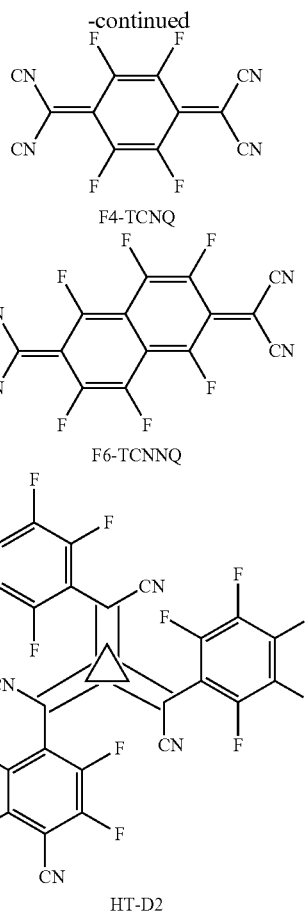

The hole transport region may further include a buffer layer.

Also, the buffer layer may compensate for an optical resonance distance according to a wavelength of light emitted from the emission layer, and thus, efficiency of a formed organic light-emitting device may be improved.

In one or more embodiments, when the hole transport region includes an electron blocking layer, a material for forming the electron blocking layer may include a material that is used in the hole transport region as described above, a host material described below, or any combination thereof. In one or more embodiments, when the hole transport region includes an electron blocking layer, a material for the electron blocking layer may be mCP, which will be explained later.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, Compound H52, or any combination thereof:

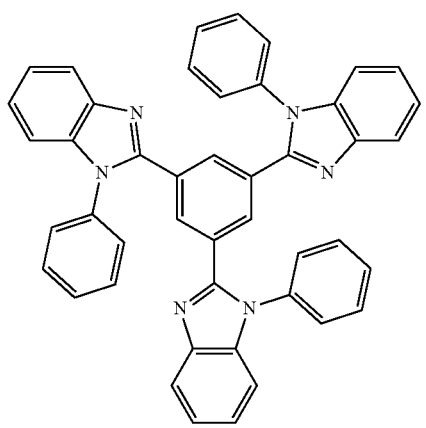

TPBi

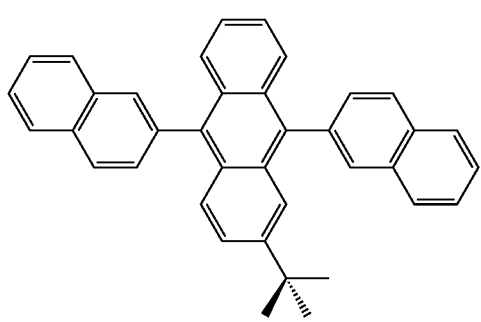

TBADN

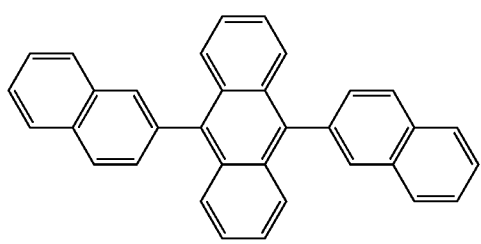

ADN

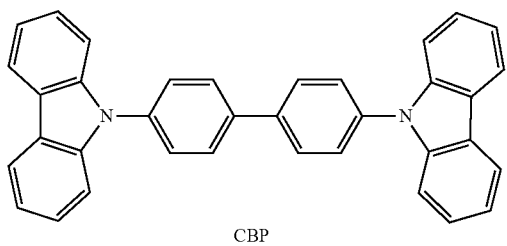

CBP

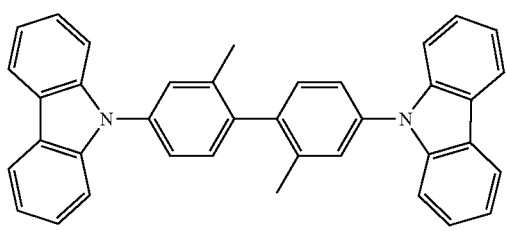

CDBP

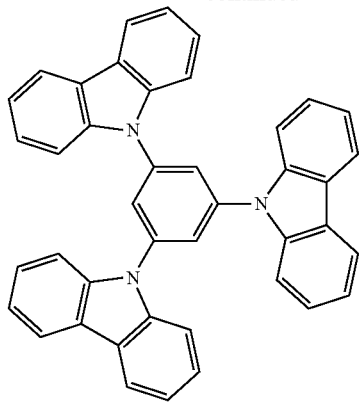

TCP

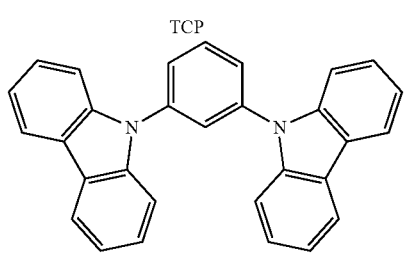

mCP

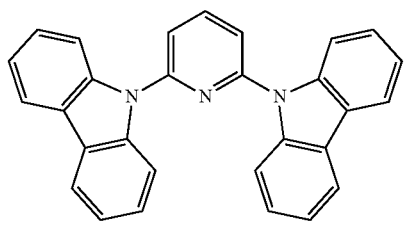

H50

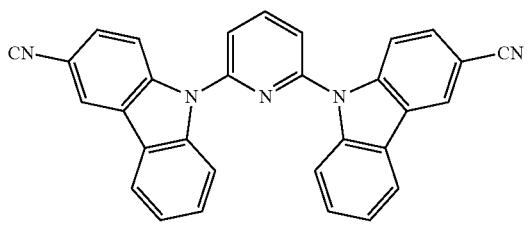

H51

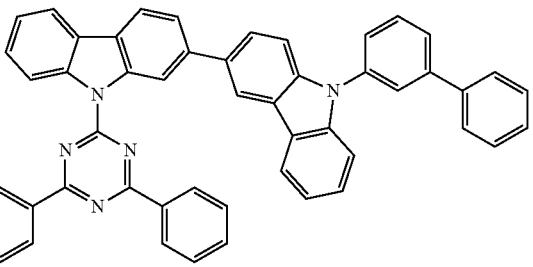

H52

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

The dopant may be the organometallic compound represented by Formula 1 in the present specification. In one or more embodiments, the dopant may be a green phosphorescent dopant.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

In one or more embodiments, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, BPhen, BAlq, or any combination thereof.

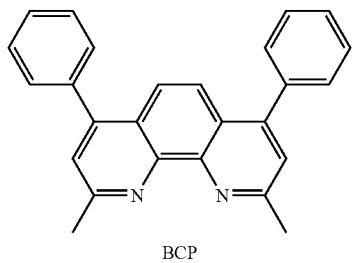

BCP

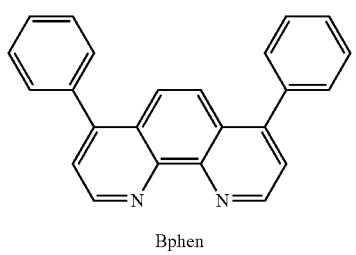

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, BPhen, Alq$_3$, BAlq, TAZ, NTAZ, or any combination thereof.

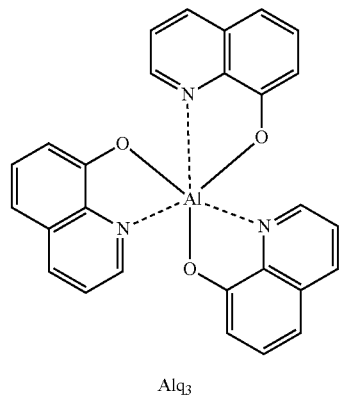

Alq$_3$

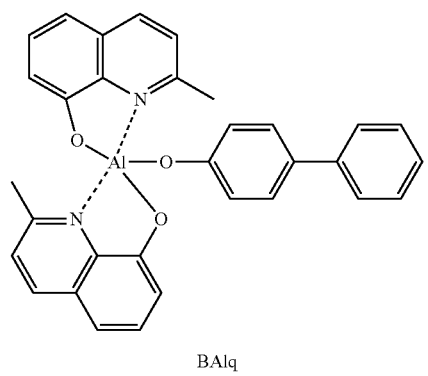

BAlq

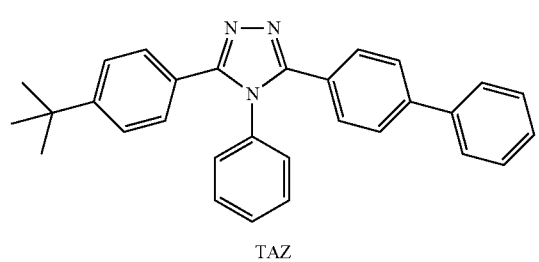

TAZ

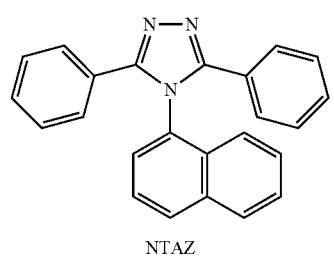

NTAZ

In one or more embodiments, the electron transport layer may include, one or more of Compounds ET1 to ET25:

ET1
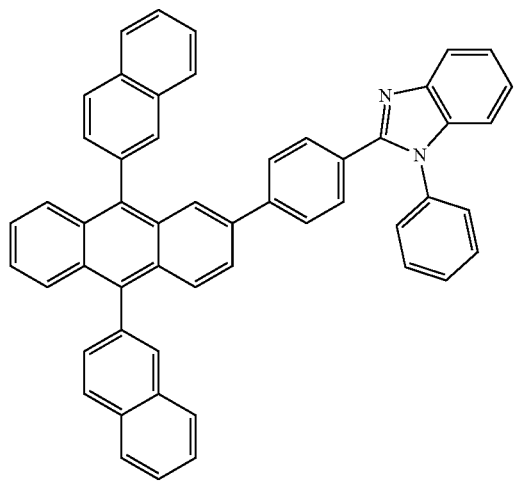
ET2
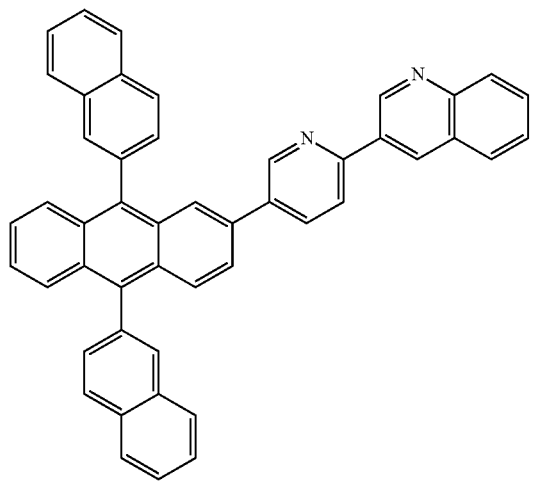
ET3
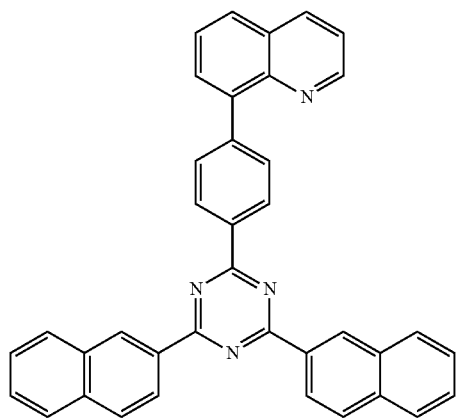
ET4
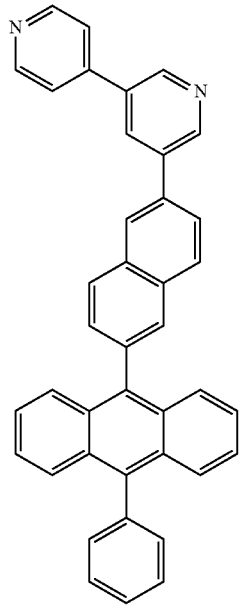
ET5
ET6
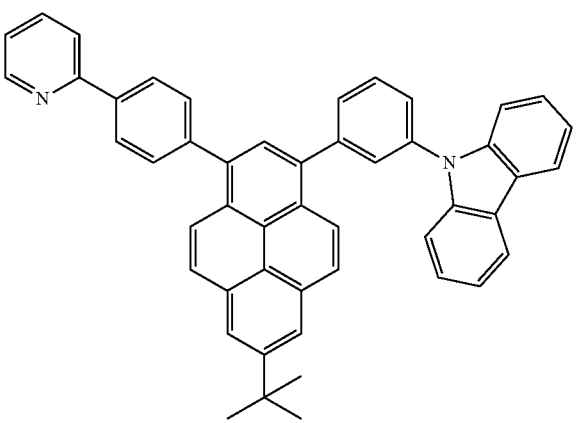

ET7
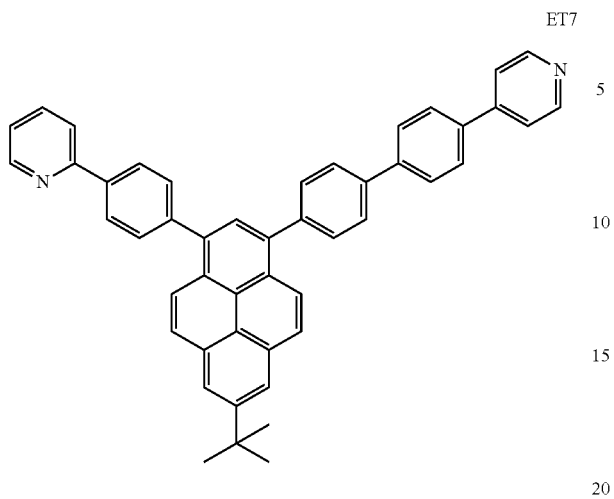
ET10
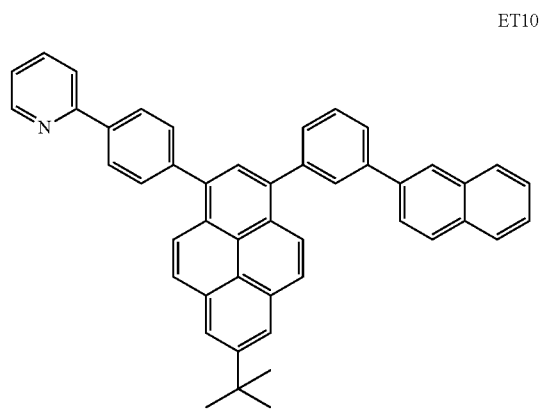
ET8
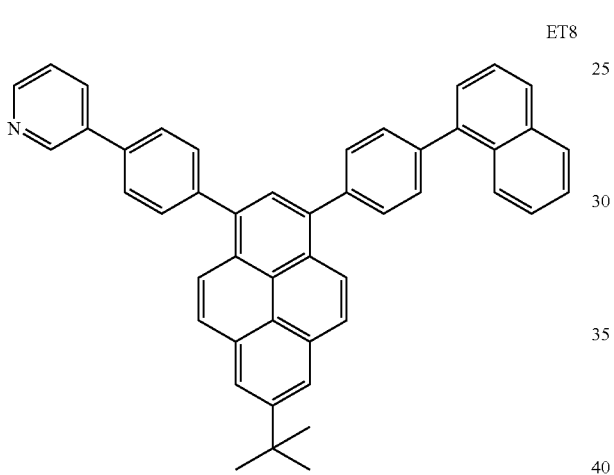
ET11
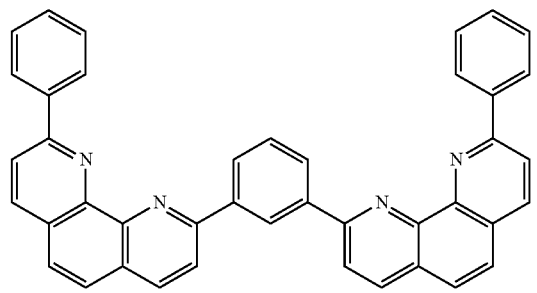
ET12
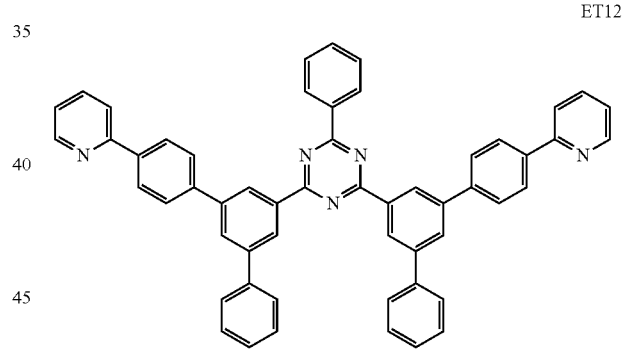
ET9
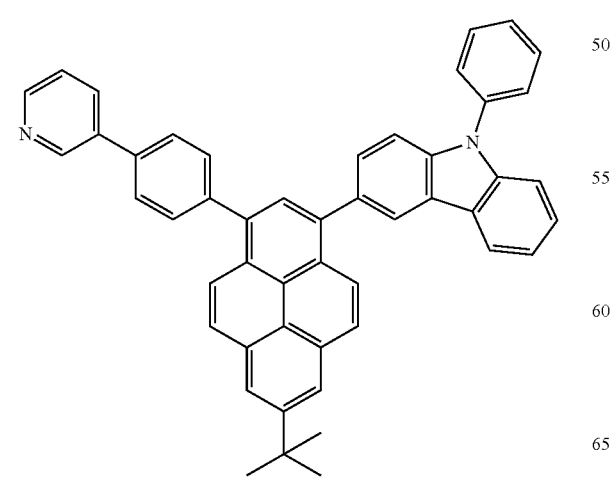
ET13
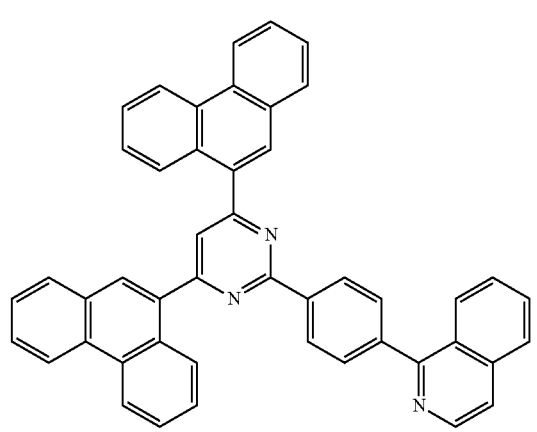

ET14
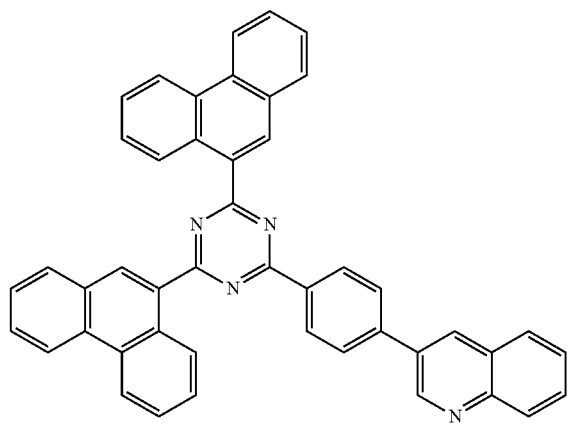
ET15
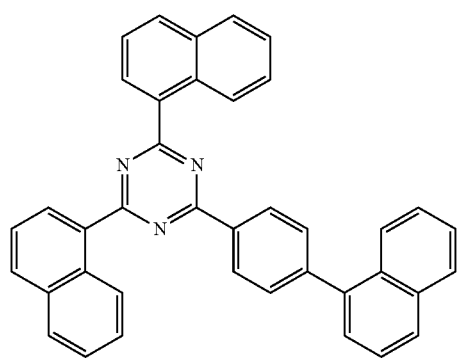
ET16
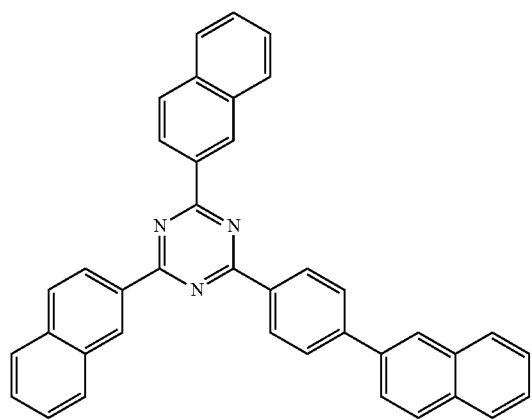
ET17
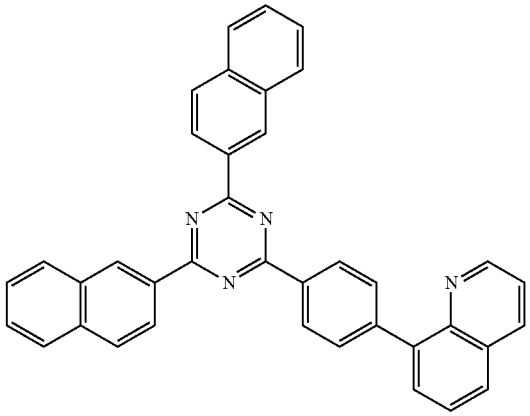
ET18
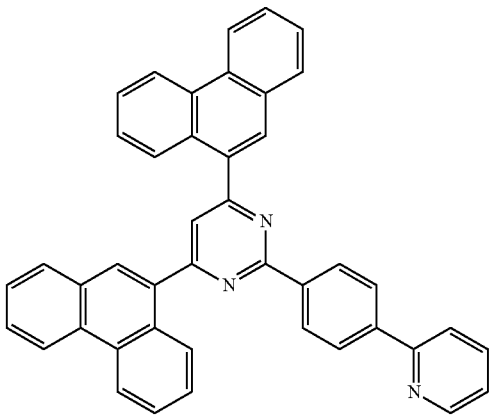
ET19
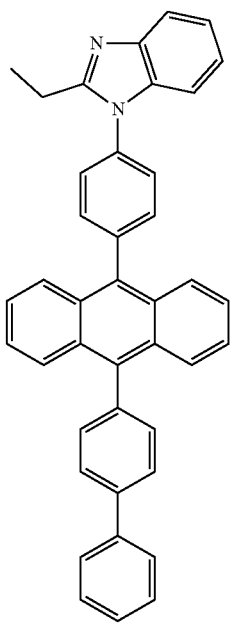

ET20
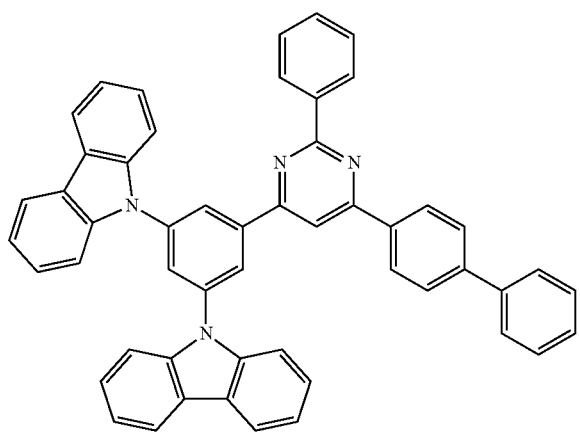
ET21
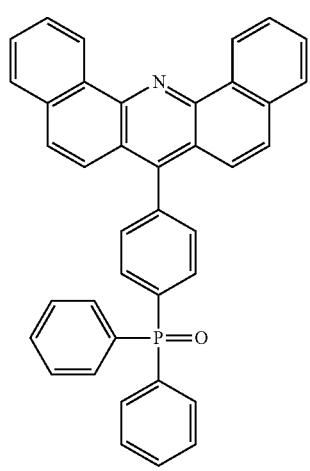
ET22
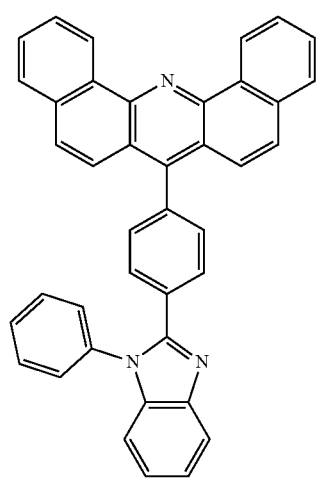
ET23
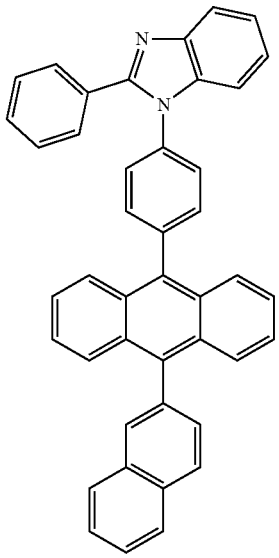
ET24
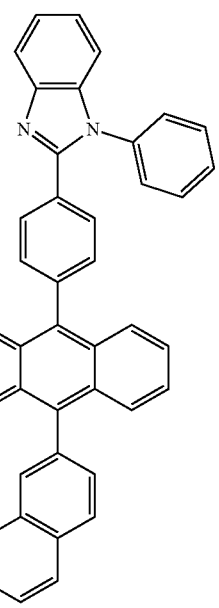
ET25
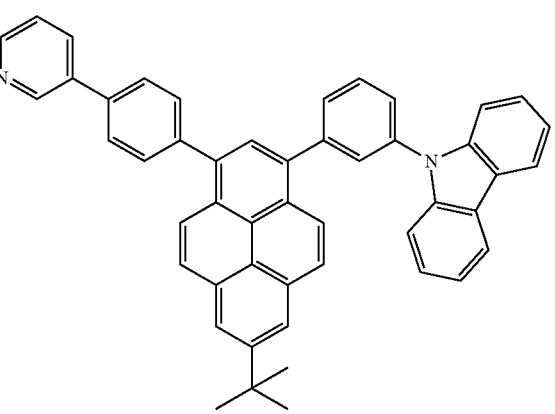
A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport layer may further include, in addition to the materials described above, a metal-containing material.

The metal-containing material may include a $L_1$ complex. The $L_1$ complex may include, for example, Compound ET-D1 (LiQ) or ET-D2.

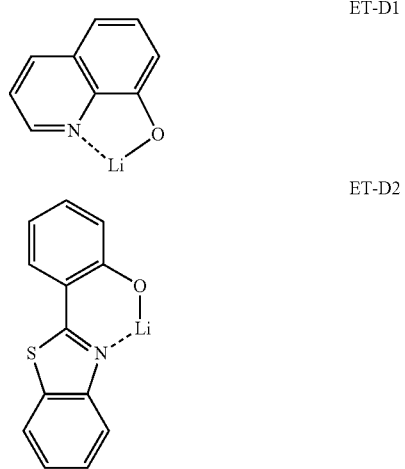

ET-D1

ET-D2

Also, the electron transport region may include an electron injection layer that promotes the flow of electrons from the second electrode 19 thereinto.

The electron injection layer may include LiF, NaCl, CsF, $Li_2O$, BaO, LiQ, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be a metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be utilized as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

According to another aspect, provided is an electronic apparatus including the organic light-emitting device. An electronic apparatus may be utilized for various purposes such as displays, lightings, and mobile phones.

According to another aspect, provided is a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. In one or more embodiments, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

Examples of the $C_1$-$C_{60}$ alkoxy group, the $C_1$-$C_{20}$ alkoxy group, or the $C_1$-$C_{10}$ alkoxy group may include a methoxy group, an ethoxy group, a propoxy group, a butoxy group, and a pentoxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms and the term "$C_3$-$C_{10}$ cycloalkylene group" as used herein refers to a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, a bicyclo[2.2.2]octyl group, and the like.

The term "$C_1$-$C_{10}$ heterocycloalkyl group" as used herein refers to a monovalent monocyclic group having at least one heteroatom selected from N, O, P, Si, S, Se, B, and Ge as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, B, and Ge as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_7$-$C_{60}$ arylalkyl group" as used herein refers to a monovalent alkyl group substituted with an aryl group.

The term "$C_1$-$C_{60}$ heteroaryl group" as used herein refers to a monovalent group having at least one hetero atom selected from N, O, P, Si, S, Se, B, and Ge as a ring-forming atom instead of a carbon atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, B, and Ge as a ring-forming atom instead of carbon and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The $C_2$-$C_{60}$ alkylheteroaryl group used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "$C_1$-$C_{60}$ heteroaryloxy group" as used herein indicates —$OA_{103}$ (wherein $A_{103}$ is the $C_6$-$C_{60}$ heteroaryl group). The term "$C_1$-$C_{60}$ heteroarylthio group" as used herein indicates —$SA_{104}$ (wherein $A_{104}$ is the $C_6$-$C_{60}$ heteroaryl group). The term "$C_2$-$C_{60}$ heteroarylalkyl group" as used herein indicates a monovalent alkyl group substituted with a heteroaryl group.

The term "monovalent non-aromatic condensed polycyclic group" as used herein refers to a monovalent group (for example, having 8 to 60 carbon atoms) having two or more rings condensed to each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, B, and Ge, other than carbon atoms, as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each unsubstituted or substituted with at least one $R_{10a}$.

The term "$C_1$-$C_{30}$ heterocyclic group" as used herein refers to a saturated or unsaturated cyclic group having, as a ring-forming atom, at least one heteroatom selected from N, O, P, Si, S, Se, B, and Ge other than 1 to 30 carbon atoms.

The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

The term "deuterated $C_1$-$C_{60}$ alkyl group (or a deuterated $C_1$-$C_{20}$ alkyl group, a deuterated $C_2$-$C_{20}$ alkyl group, etc.)" as used herein refers to a $C_1$-$C_{60}$ alkyl group substituted with at least one deuterium (or, a $C_1$-$C_{20}$ alkyl group substituted with at least one deuterium or a $C_2$-$C_{20}$ alkyl substituted with at least one deuterium). Examples of the "deuterated $C_1$ alkyl group (that is, a deuterated methyl group)" include —$CD_3$, —$CD_2H$, and —$CDH_2$.

The term "deuterated $C_3$-$C_{10}$ cycloalkyl group" as used herein refers to a $C_3$-$C_{10}$ cycloalkyl group substituted with at least one deuterium. Examples of the "deuterated $C_3$-$C_{10}$ cycloalkyl group" may refer to, for example, Formula 10-501 and the like.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$OF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", or "the fluorinated $C_1$-$C_{10}$ heterocycloalkyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, or a fully fluorinated $C_1$-$C_{10}$ heterocycloalkyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, or a partially fluorinated $C_1$-$C_{10}$ heterocycloalkyl group, wherein, in each group, all hydrogen included therein is not substituted with a fluoro group.

The term "($C_1$-$C_{20}$ alkyl) 'X' group" as used herein refers to a 'X' group that is substituted with at least one $C_1$-$C_{20}$ alkyl group. In one or more embodiments, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one ring-forming carbon atom is substituted with nitrogen.

Substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$), or —N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$).

$Q_1$ to $Q_9$, $Q_{11}$ to $Q_{19}$, $Q_{21}$ to $Q_{29}$, and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

Hereinafter, compounds and organic light-emitting devices according to exemplary embodiments are described in further detail with reference to Synthesis Examples and Examples. However, the organic light-emitting devices are not limited thereto. The wording "B was used instead of A" used in describing Synthesis Examples means that an amount of A used was identical to an amount of B used, in terms of a molar equivalent.

EXAMPLES

Synthesis Example 1 (Synthesis of Compound 1)

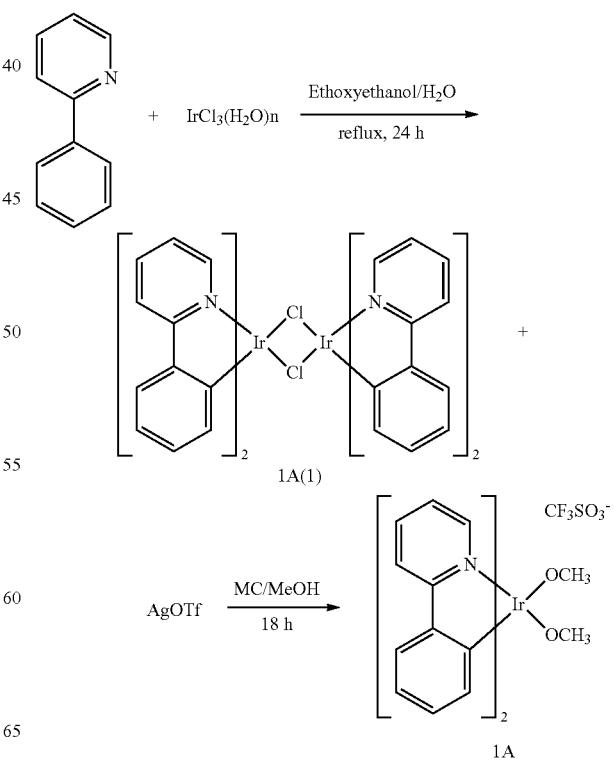

153
-continued

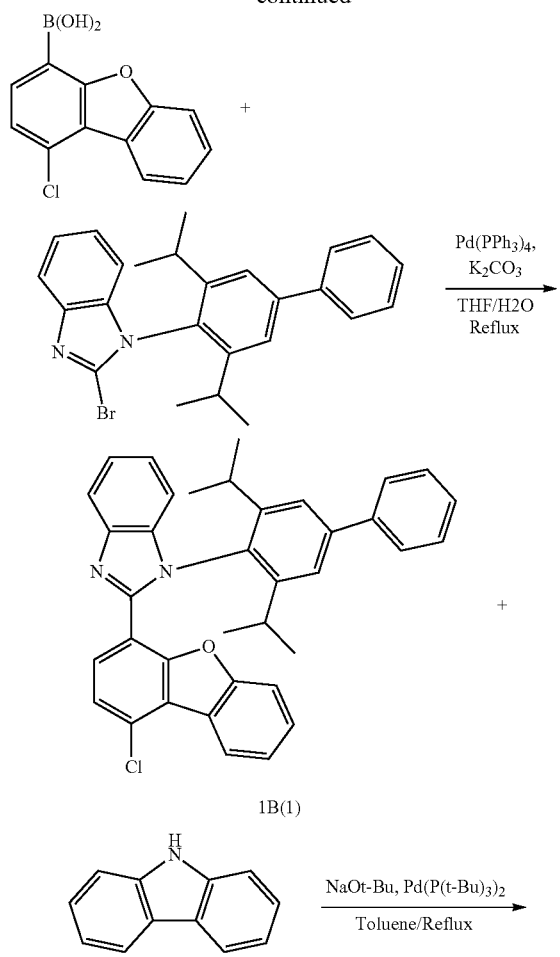

154
-continued

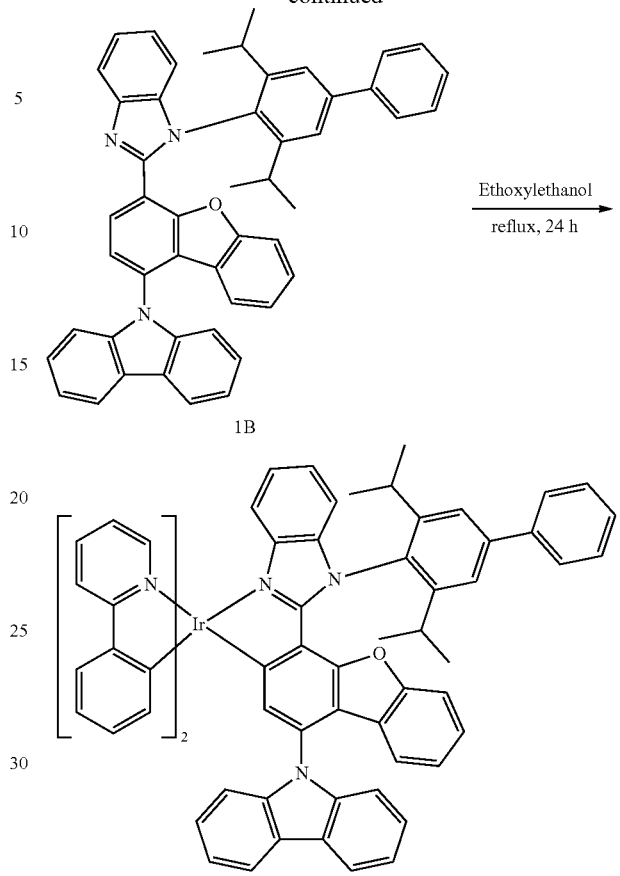

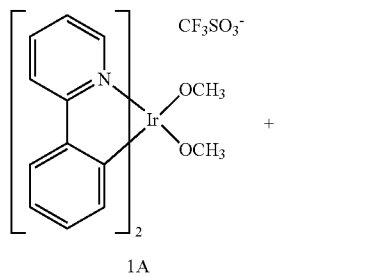

Synthesis of Compound 1A(1)

2-phenyl-pyridine (5.2 grams (g), 33.1 millimoles (mmol)) and iridium chloride (5.2 g, 14.7 mmol) were mixed with 120 mL of ethoxyethanol and 40 mL of distilled water (DI water), stirred while refluxing for 24 hours, and then cooled to room temperature. A solid material formed therefrom was separated by filtration and washed thoroughly with water, methanol, and hexane in the stated order to obtain a solid which was then dried in a vacuum oven to thereby obtain 8.2 g of Compound 1A (yield of 92%). The obtained Compound 1A(1) was utilized in the next reaction without further purification.

Synthesis of Compound 1A

Compound 1A(1) (1.6 g, 1.5 mmol) and 45 mL of methylene chloride were mixed, and silver triflate (AgOTf) (0.8 g, 3.1 mmol) was mixed with 15 mL of methanol and then added thereto. Next, the mixture was stirred for 18 hours at room temperature while being blocked from the light with aluminum foil, a solid formed by filtration using celite was removed therefrom, and filtrate was decompressed to obtain a solid (Compound 1A) which was then utilized for next reaction without further purification.

Synthesis of Compound 1B(1)

Under a nitrogen environment, (1-chlorodibenzo[b,d]furan-4-yl)boronic acid (1.3 g, 5.1 mmol) and 2-bromo-1-

(3,5-diisopropyl-[1,1'-biphenyl]-4-yl)-1H-benzo[d]imidazole (2.0 g, 4.6 mmol) were dissolved in 100 mL of tetrahydrofuran. Then, potassium carbonate (K$_2$CO$_3$) (1.5 g, 13.8 mmol) was dissolved in 25 mL of distilled water (DI water) and added to the reaction mixture, and palladium catalyst (Pd(PPh$_3$)$_4$) (0.53 g, 0.46 mmol) was added thereto. Next, the reaction mixture was stirred while refluxing at 100° C. After extraction, column chromatography (eluant: methylene chloride (MC) and hexane) was performed on an obtained solid to thereby obtain 2.3 g of Compound 1B(1) (2-(1-chlorodibenzo[b,d]furan-4-yl)-1-(3,5-diisopropyl-[1,1'-biphenyl]-4-yl)-1H-benzo[d]imidazole) (yield of 90%). A material was confirmed through Mass and HPLC analysis.

HRMS(MALDI) calcd for C$_{37}$H$_{31}$ClN$_2$O: m/z: 555.12 Found: 556.33.

Synthesis of Compound 1B

Under a nitrogen environment, Compound 1B(1) (2.0 g, 3.6 mmol), 9H-carbazole (1.3 g, 7.9 mmol), sodium tert-butoxide (1.7 g, 18.0 mmol), and bis(tri-tert-butylphosphine)palladium(0) (90 mg, 0.18 mmol) were added to 36 mL of toluene and then stirred while refluxing. When the reaction is complete, the mixture was cooled at room temperature and extracted with toluene and water, and then a water layer was removed therefrom. The resultant was treated using anhydrous magnesium sulfate, filtered, and then concentrated under reduced pressure. After extraction, column chromatography (eluent: methylene chloride (MC) and hexane) was performed on an obtained solid to thereby obtain 1.0 g of Compound 1B (9-(4-(1-(3,5-diisopropyl-[1,1'-biphenyl]-4-yl)-1H-benzo[d]imidazole-2-yl)dibenzo[b,d]furan-1-yl)-9H-carbazole) (yield of 40%). A material was confirmed through Mass and HPLC analysis.

HRMS(MALDI) calcd for C$_{49}$H$_{39}$N$_3$O: m/z: 685.87 Found: 686.64.

Synthesis of Compound 1

100 ml of 2-ethoxyethanol was mixed with Compound 1A (1.5 g, 2.1 mmol) and Compound 1B (1.6 g, 2.3 mmol) and then stirred while refluxing for 24 hours, and temperature was reduced. The mixture was extracted using methylene chloride and water, and then a water layer was removed therefrom. The resultant was treated using anhydrous magnesium sulfate, filtered, and then concentrated under reduced pressure. After extraction, column chromatography (eluent: methylene chloride (MC) and hexane) was performed on an obtained solid to thereby obtain 0.9 g of Compound 1 (yield of 33%). A material was confirmed through Mass and HPLC analysis.

HRMS(MALDI) calcd for C$_{71}$H$_{54}$IrN$_5$O: m/z: 1185.46 Found: 1186.73.

Synthesis Example 2 (Synthesis of Compound 2)

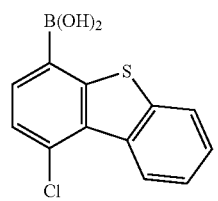

+

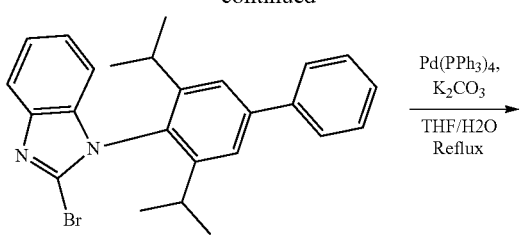

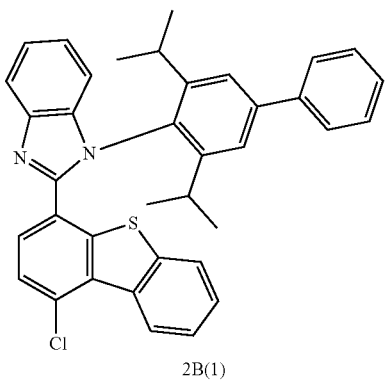

2B(1)

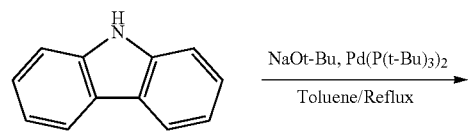

+

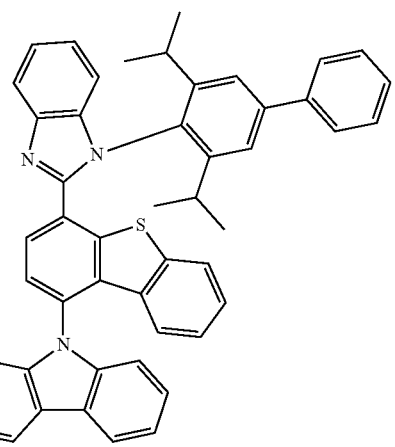

2B

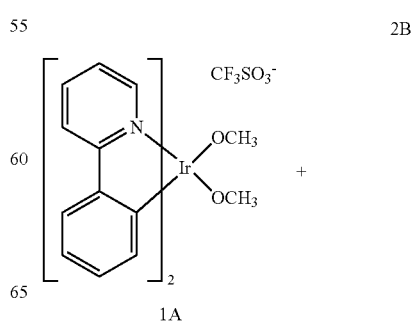

1A

-continued

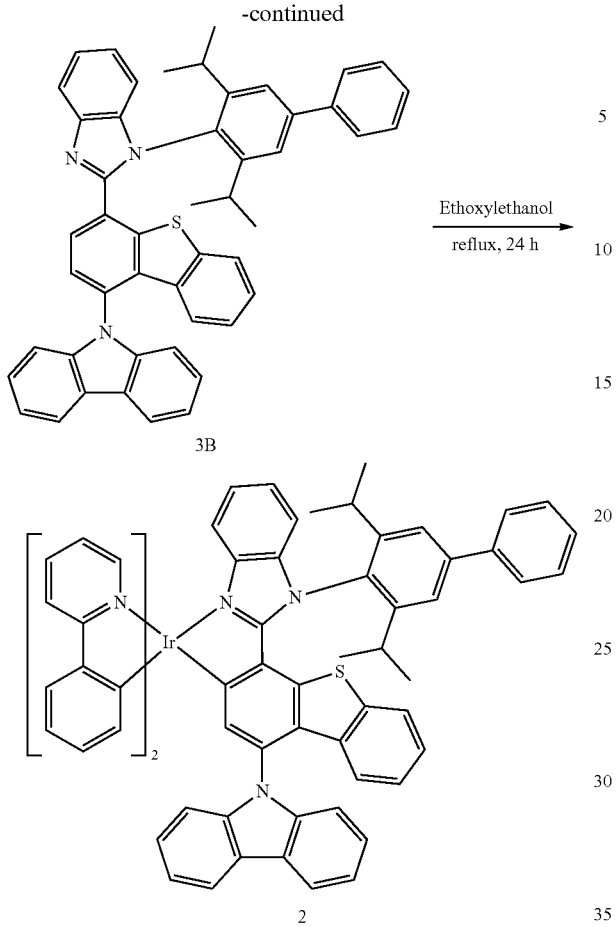

3B

2

Synthesis of Compound 2B(1)

2.2 g of Compound 2B(1) (2-(1-chlorodibenzo[b,d]thiophene-4-yl)-1-(3,5-diisopropyl-[1,1'-biphenyl]-4-yl)-1H-benzo[d]imidazole) (yield of 82%) was obtained in the same manner as the synthesis method of Compound 1B(1) of Synthesis Example 1, except that (1-chlorodibenzo[b,d]thiophene-4-yl)boronic acid (1.3 g, 5.1 mmol) was utilized instead of (1-chlorodibenzo[b,d]furan-4-yl)boronic acid. A material was confirmed through Mass and HPLC analysis.

HRMS(MALDI) calcd for $C_{37}H_{31}ClN_2S$: m/z: 571.18 Found: 572.25.

Synthesis of Compound 2B 0.98 g of Compound 2B (9-(4-(1-(3,5-diisopropyl-[1,1'-biphenyl]-4-yl)-1H-benzo[d]imidazole-2-yl)dibenzo[b,d]thiophene-1-yl)-9H-carbazole) (yield of 40%) was obtained in the same manner as the synthesis method of Compound 1B of Synthesis Example 1, except that Compound 2B(1) (2.0 g, 3.5 mmol) was utilized instead of Compound 1B(1). A material was confirmed through Mass and HPLC analysis.

HRMS(MALDI) calcd for $C_{49}H_{39}N_3S$: m/z: 701.93 Found: 702.45.

Synthesis of Compound 2

0.83 g of Compound 2 (yield of 30%) was obtained in the same manner as the synthesis method of Compound 1 of Synthesis Example 1, except that Compound 2B (1.6 g, 2.3 mmol) was utilized instead of Compound 1B. A material was confirmed through Mass and HPLC analysis.

HRMS(MALDI) calcd for $C_{71}H_{54}IrN_5S$: m/z: 1201.53 Found: 1202.69.

Synthesis Example 3 (Synthesis of Compound 3)

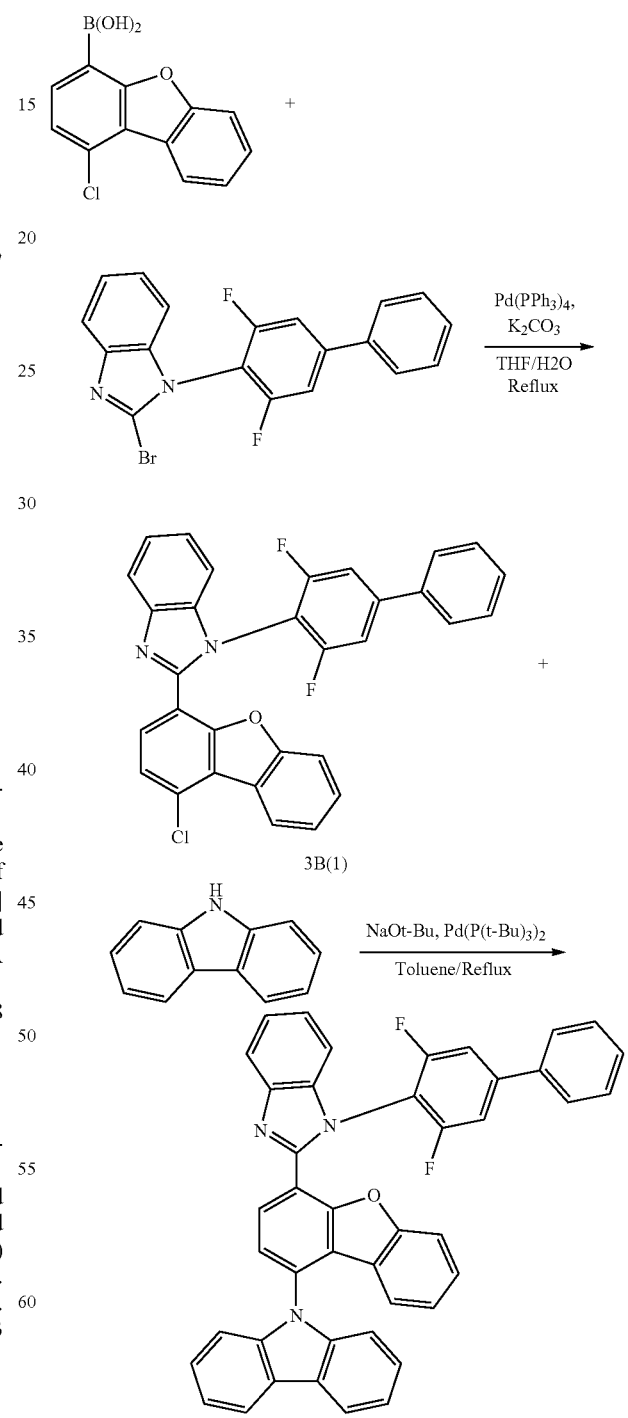

3B(1)

3B

-continued

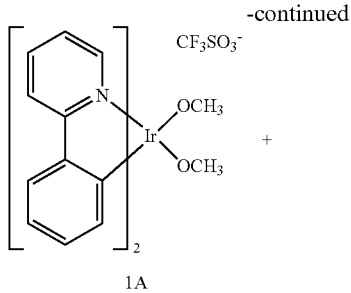

1A

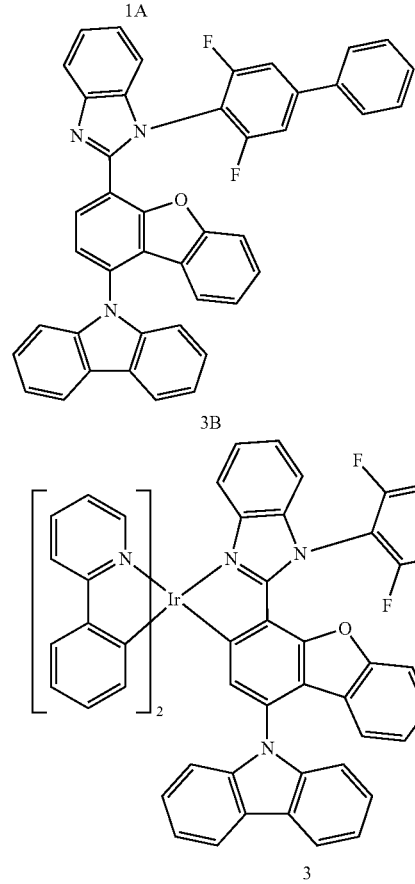

Synthesis of Compound 3B(1)

1.7 g of Compound 3B(1) (yield of 84%) was obtained in the same manner as the synthesis method of Compound 1B(1) of Synthesis Example 1, except that 2-bromo-1-(3,5-difluoro-[1,1'-biphenyl]-4-yl)-1H-benzo[d]imidazole (1.5 g, 3.9 mmol) was utilized instead of 2-bromo-1-(3,5-diisopropyl-[1,1'-biphenyl]-4-yl)-1H-benzo[d]imidazole. A material was confirmed through Mass and HPLC analysis.

HRMS(MALDI) calcd for $C_{31}H_{17}CF_2N_{20}$: m/z: 506.10 Found: 507.94.

Synthesis of Compound 3B 0.95 g of Compound 3B (yield of 50%) was obtained in the same manner as in the synthesis method of Compound 1B of Synthesis Example 1, except that Compound 31(1) (1.5 g, 3.0 mmol) was used instead of Compound 1B(1). A material was confirmed through Mass and HPLC analysis.

HRMS(MALDI) calcd for $C_{43}H_{25}F_2N_3O$: m/z: 637.20 Found: 638.69.

Synthesis of Compound 3

0.7 g of Compound 3 (yield of 29%) was obtained in the same manner as the synthesis method of Compound 1 of Synthesis Example 1, except that Compound 3B (1.5 g, 2.3 mmol) was utilized instead of Compound 1B. A material was confirmed through Mass and HPLC analysis.

HRMS(MALDI) calcd for $C_{65}H_{40}F_2IrN_5O$: m/z: 1137.28 Found: 1138.50.

Synthesis Example 4 (Synthesis of Compound 4)

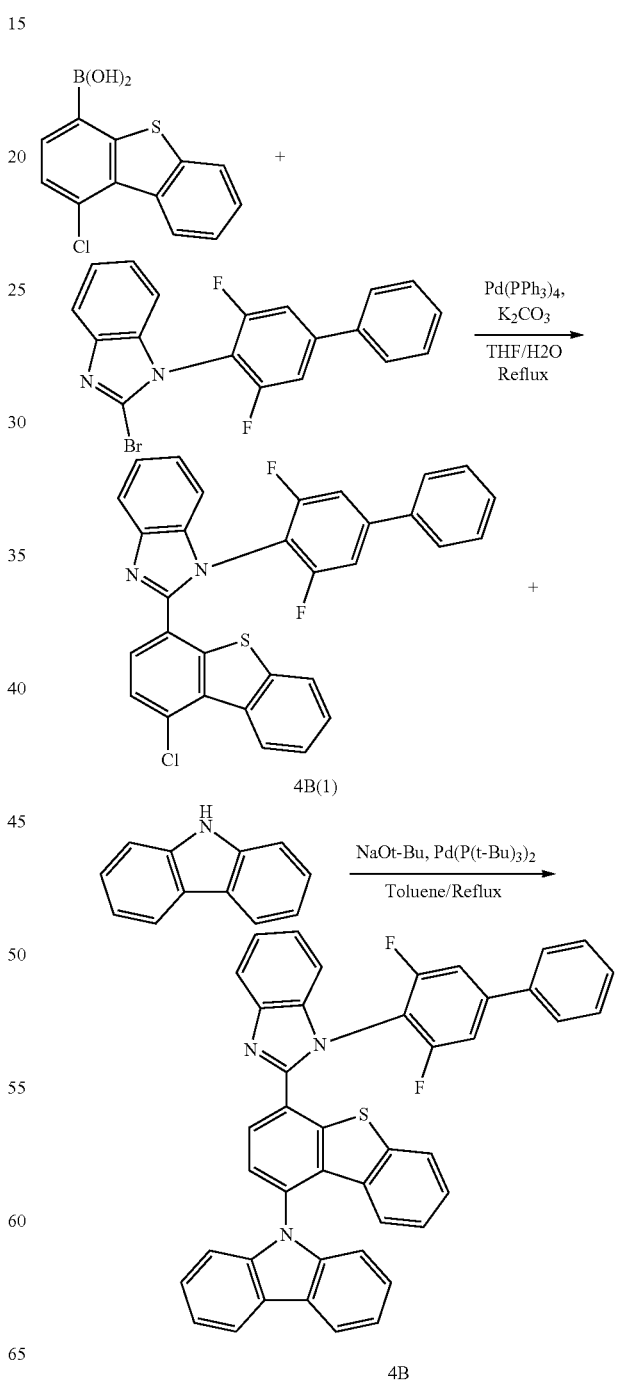

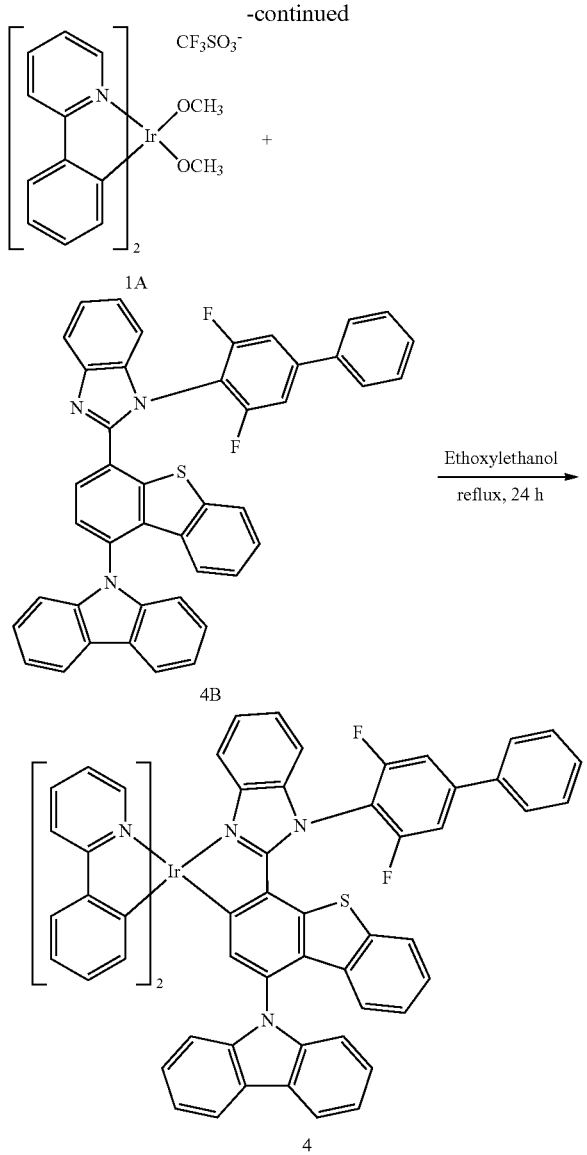

-continued

Synthesis of Compound 4B(1)

1.9 g of Compound 4B(1) (yield of 93%) was obtained in the same manner as the synthesis method of Compound 1B(1) of Synthesis Example 1, except that (1-chlorodibenzo[b,d]thiophene-4-yl)boronic acid (1.2 g, 4.7 mmol) and 2-bromo-1-(3,5-difluoro-[1,1'-biphenyl]-4-yl)-1H-benzo[d]imidazole (1.5 g, 3.9 mmol) were respectively utilized instead of (1-chlorodibenzo[b,d]furan-4-yl)boronic acid and 2-bromo-1-(3,5-diisopropyl-[1,1'-biphenyl]-4-yl)-1H-benzo[d]imidazole. A material was confirmed through Mass and HPLC analysis.

HRMS(MALDI) calcd for $C_{31}H_{17}ClF_2N_2S$: m/z: 522.08 Found: 523.10.

Synthesis of Compound 4B 0.87 g of Compound 4B (yield of 46%) was obtained in the same manner as the synthesis method of Compound 1B of Synthesis Example 1, except that Compound 4B(1) (1.5 g, 2.9 mmol) was utilized instead of Compound 1B(1). A material was confirmed through Mass and HPLC analysis.

HRMS(MALDI) calcd for $C_{43}H_{25}F_2N_3S$: m/z: 653.17 Found: 654.78.

Synthesis of Compound 4

0.65 g of Compound 4 (yield of 27%) was obtained in the same manner as the synthesis method of Compound 1 of Synthesis Example 1, except that Compound 4B (1.52 g, 2.3 mmol) was utilized instead of Compound 1B. A material was confirmed through Mass and HPLC analysis.

HRMS(MALDI) calcd for $C_{65}H_{40}F_2IrN_5S$: m/z: 1153.26 Found: 1154.35.

Synthesis Example 5 (Synthesis of Compound 5)

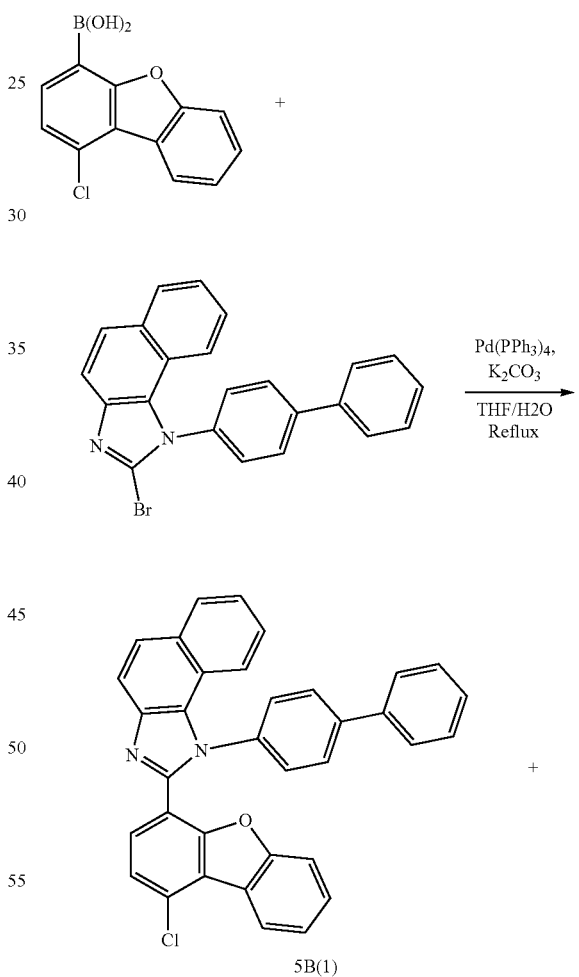

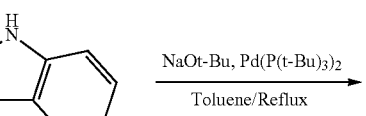

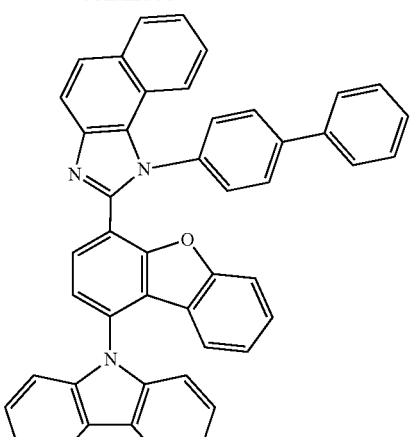

5B

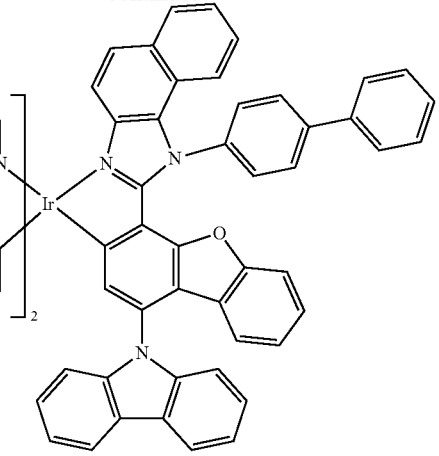

5

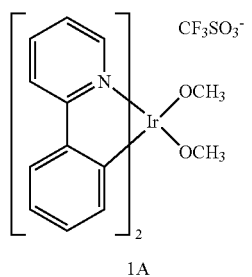

1A

Synthesis of Compound 5B(1)

2.4 g of Compound 5B(1) (yield of 92%) was obtained in the same manner as the synthesis method of Compound 1B(1) of Synthesis Example 1, except that 1-([1,1-biphenyl]-4-yl)-2-bromo-1H-naphtho[1,2-d]imidazole (2.0 g, 5.0 mmol) was utilized instead of 2-bromo-1-(3,5-diisopropyl-[1,1'-biphenyl]-4-yl)-1H-benzo[d]imidazole. A material was confirmed through Mass and HPLC analysis.

HRMS(MALDI) calcd for $C_{35}H_{21}ClN_2O$: m/z: 520.13 Found: 521.18.

Synthesis of Compound 5B 1.1 g of Compound 5B (yield of 44%) was obtained in the same manner as the synthesis method of Compound 1B of Synthesis Example 1, except that Compound 5B(1) (2.0 g, 3.8 mmol) was utilized instead of Compound 1B(1). A material was confirmed through Mass and HPLC analysis.

HRMS(MALDI) calcd for $C_{47}H_{29}N_3O$: m/z: 651.23 Found: 652.77.

Synthesis of Compound 5

0.71 of Compound 5 (yield of 31%) was obtained in the same manner as the synthesis method of Compound 1 of Synthesis Example 1, except that Compound 5B (1.5 g, 2.3 mmol) was utilized instead of Compound 1B. A material was confirmed through Mass and HPLC analysis.

HRMS(MALDI) calcd for $C_{65}H_{42}IrN_5O$: m/z: 1101.30 Found: 1102.44.

Synthesis Example 6 (synthesis of Compound 6)

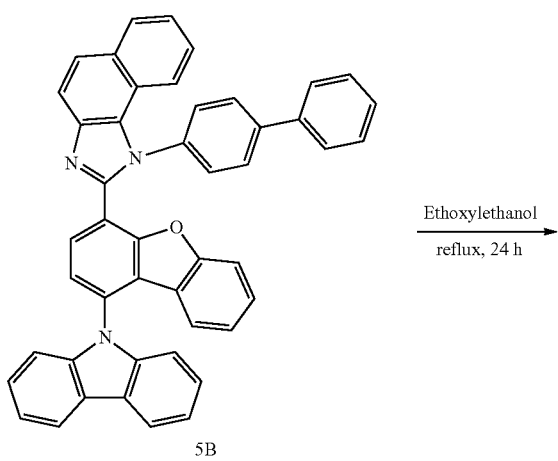

5B $\xrightarrow{\text{Ethoxylethanol}}_{\text{reflux, 24 h}}$

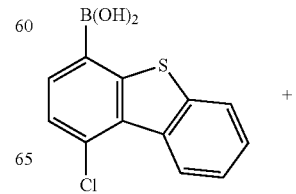

+

-continued

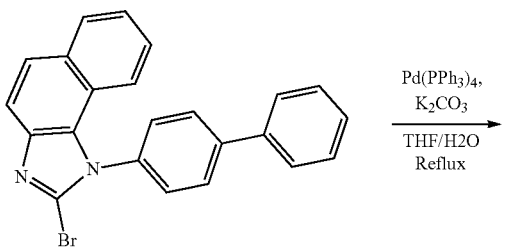

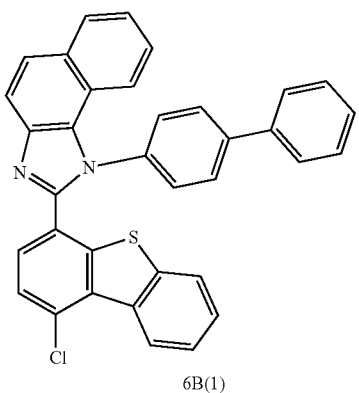

6B(1)

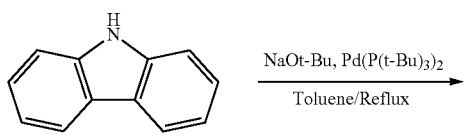

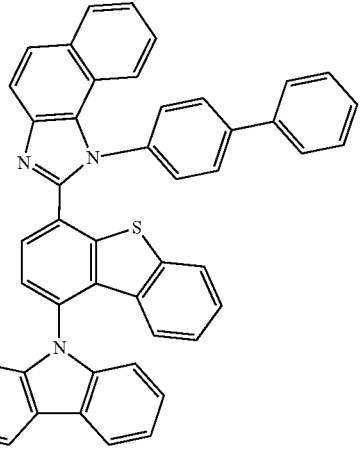

6B

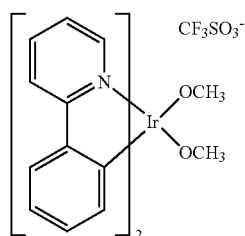

1A

-continued

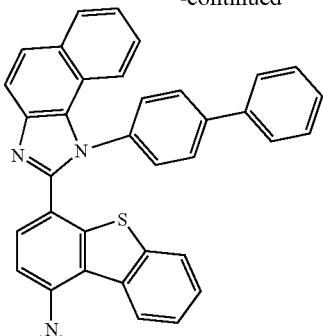

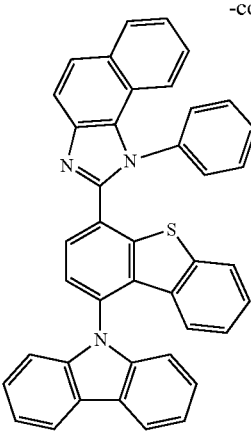

6B

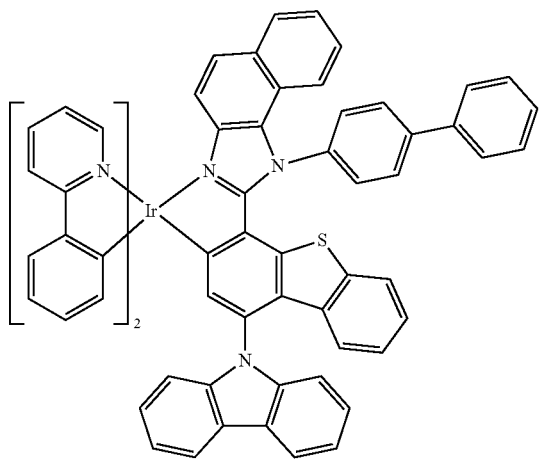

6

Synthesis of Compound 61(1)

2.4 g of Compound 61B(1) (yield of 89%) was obtained in the same manner as the synthesis method of Compound 11B(1) of Synthesis Example 1, except that (1-chlorodibenzo[b,d]thiophene-4-yl)boronic acid (1.6 g, 6.0 mmol) and 1-([1,1'-biphenyl]-4-yl)-2-bromo-1H-naphtho[1,2-d]imidazole (2.0 g, 5.0 mmol) were respectively utilized instead of (1-chlorodibenzo[b,d]furan-4-yl)boronic acid and 2-bromo-1-(3,5-diisopropyl-[1,1'-biphenyl]-4-yl)-1H-benzo[d]imidazole. A material was confirmed through Mass and HPLC analysis.

HRMS(MALDI) calcd for $C_{35}H_{21}ClN_2S$: m/z: 536.11 Found: 537.08.

Synthesis of Compound 6B 1.2 g of Compound 6B (yield of 48%) was obtained in the same manner as the synthesis method of Compound 1B of Synthesis Example 1, except that Compound 6B(1) (2.0 g, 3.7 mmol) was utilized instead of Compound 1B(1). A material was confirmed through Mass and HPLC analysis.

HRMS(MALDI) calcd for $C_{47}H_{29}N_3S$: m/z: 667.21 Found: 668.82.

Synthesis of Compound 6

0.69 g of Compound 6 (yield of 29%) was obtained in the same manner as the synthesis method of Compound 1 of Synthesis Example 1, except that Compound 6B (1.6 g, 2.3 mmol) was utilized instead of Compound 1B. A material was confirmed through Mass and HPLC analysis.

HRMS(MALDI) calcd for $C_{65}H_{42}IrN_5S$: m/z: 1117.28 Found: 1118.33.

Example 1

As an anode, an ITO-patterned glass substrate was cut to a size of 50 mm×50 mm×0.5 mm, sonicated with isopropyl alcohol and pure water each for 5 minutes, and then cleaned by irradiation of ultraviolet rays and exposure of ozone thereto for 30 minutes. Then, the resultant glass substrate was loaded onto a vacuum deposition apparatus.

Compounds HT3 and HT-D2 were vacuum-codeposited on the anode at the weight ratio of 98:2 to form a hole injection layer having a thickness of 100 Å, and Compound HT3 was vacuum deposited on the hole injection layer to form a hole transport layer having a thickness of 1,650 Å.

Subsequently, H52 (host) and Compound 1 (dopant) were co-deposited at a weight ratio of 92:8 on the hole transport layer to form an emission layer having a thickness of 400 Å.

Afterwards, Compound ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

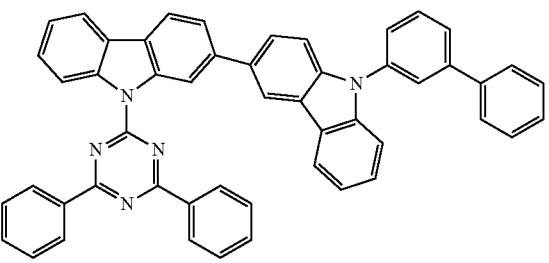

H52

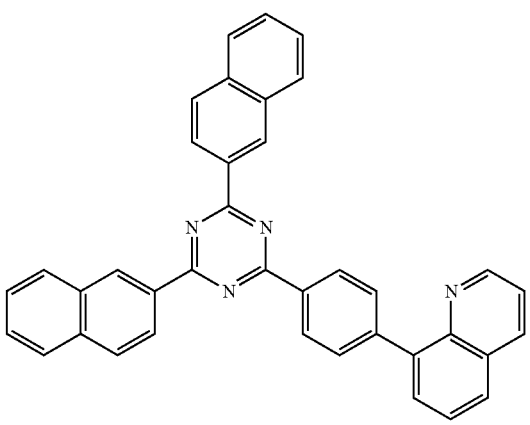

ET3

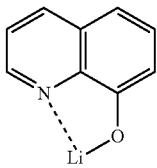

ET-D1

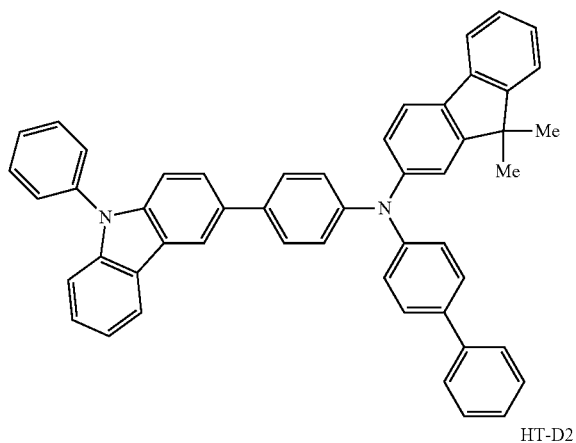

HT3

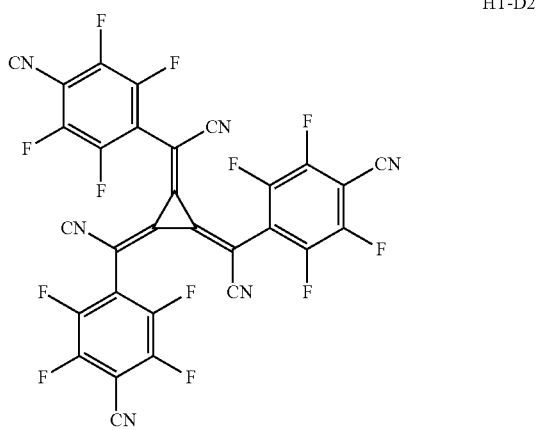

HT-D2

Examples 2 to 6 and Comparative Examples A and B

Organic light-emitting devices were manufactured in the same manner as in Example 1, except that Compounds shown in Table 2 were each used instead of Compound 1 as a dopant in forming an emission layer.

Evaluation Example 1

With respect to each of the organic light-emitting devices manufactured in Examples 1 to 6 and Comparative Examples A and B, a maximum value of external quantum efficiency (Max EQE, %), roll-off ratio (%), and driving voltage (volts, V) were evaluated, and the results thereof are shown in Table 2. As evaluation apparatuses, a current-voltage meter (Keithley 2400) and a luminance meter (Minolta Cs-1000A) were used. The roll-off ratio was calculated according to Equation 20 below.

Roll off ratio={1−(efficiency (at 6,000 nit)/maximum emission efficiency)}×100%     Equation 20

TABLE 2
| | Dopant compound No. in emission layer | Driving voltage (V) | Max EQE (%) | Roll-off ratio (%) |
|---|---|---|---|---|
| Example 1 | 1 | 4.1 | 23.0 | 12 |
| Example 2 | 2 | 4.1 | 23.0 | 12 |
| Example 3 | 3 | 4.1 | 22.5. | 13 |
| Example 4 | 4 | 4.1 | 22.5 | 13 |
| Example 5 | 5 | 4.1 | 23.0 | 13 |
| Example 6 | 6 | 4.1 | 22.5 | 13 |
| Comparative Example A | A | 4.8 | 20 | 15 |
| Comparative Example B | B | 4.3 | 21 | 12 |
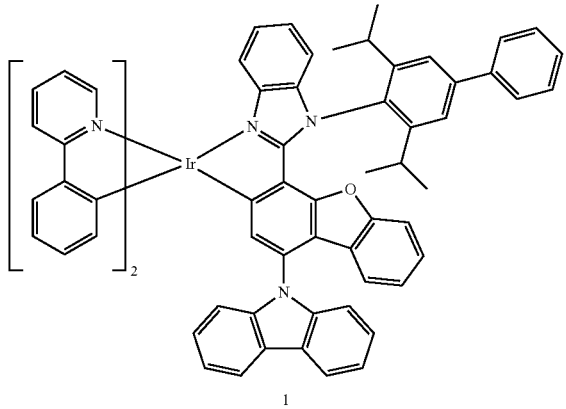
1
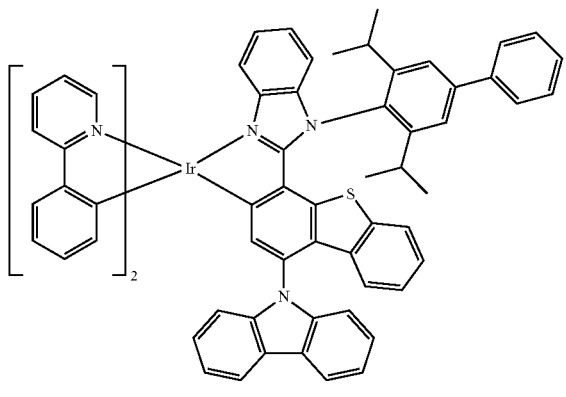
2
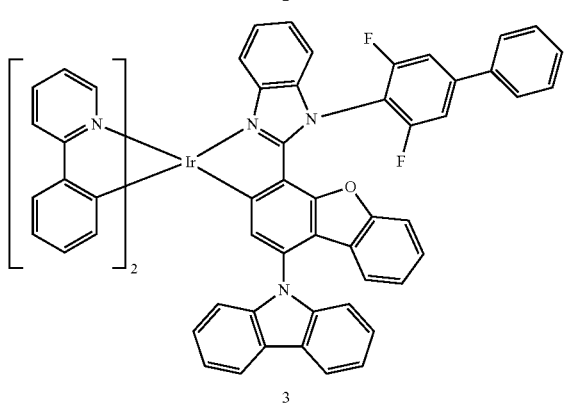
3
TABLE 2-continued
| | Dopant compound No. in emission layer | Driving voltage (V) | Max EQE (%) | Roll-off ratio (%) |
|---|---|---|---|---|
4
5
6

TABLE 2-continued

| Dopant compound No. in emission layer | Driving voltage (V) | Max EQE (%) | Roll-off ratio (%) |
|---|---|---|---|

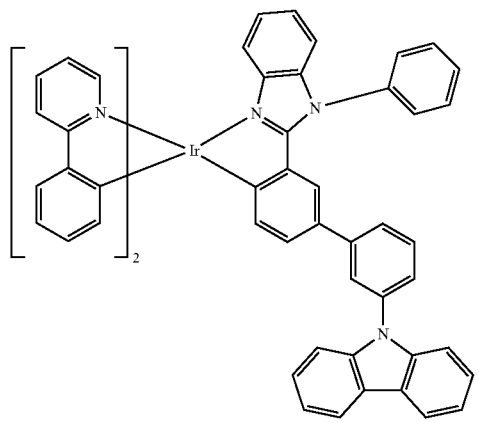

A

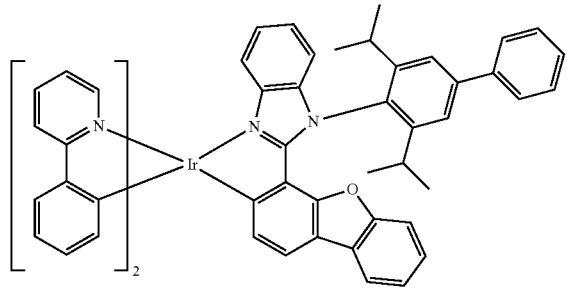

B

From Table 2, it was confirmed that, compared to the organic light-emitting devices of Comparative Examples A and B, the organic light-emitting devices of Examples 1 to 6 have improved external quantum efficiency, improved roll-off ratio, and equal or greater driving voltage.

The organometallic compound have excellent electrical characteristics, and thus, an electronic device, for example, an organic light-emitting device, including the organometallic compound may have improved characteristics in terms of driving voltage, current density, efficiency, power, color purity, and/or lifespan.

It should be understood that exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2} \quad \text{Formula 1}$$

wherein, in Formula 1,
M is a transition metal,
$L_1$ is a ligand represented by Formula 2,
n1 is 1, 2, or 3, and when n1 is 2 or more, two or more of $L_1$(s) are identical to or different from each other,
$L_2$ is a monodentate ligand, a bidentate ligand, a tridentate ligand, or a tetradentate ligand,
n2 is 0, 1, 2, 3, or 4, and when n2 is 2 or more, two or more of $L_2$(s) are identical to or different from each other, and
$L_1$ and $L_2$ are different from each other, Formula 2

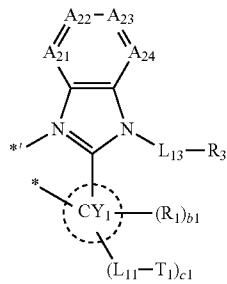

wherein, in Formula 2,
a group represented by

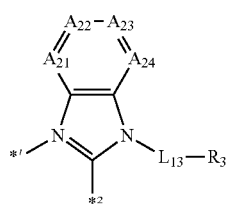

in Formula 2 is a group represented by one of Formulae 2-2 to 2-11:

2-2

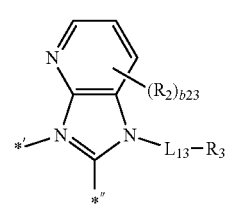

2-3

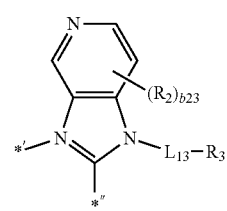

2-4

-continued 2-5 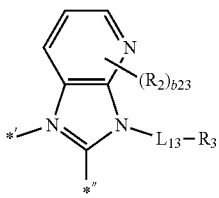

2-6 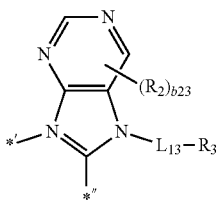

2-7 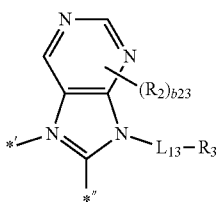

2-8 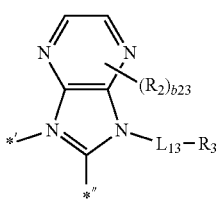

2-9 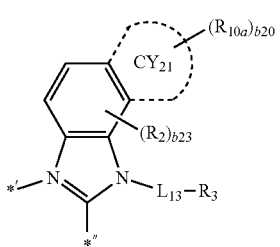

2-10 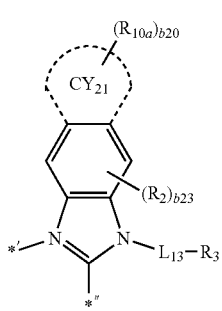

-continued 2-11 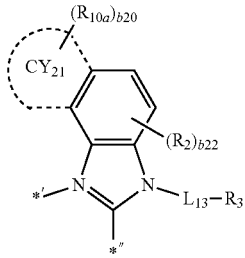

wherein, in Formulae 2-1 to 2-11,
ring $CY_{21}$ is a $C_5$-$C_{30}$ carbocyclic group or a $C_1$-$C_{30}$ heterocyclic group,
b24 is an integer from 0 to 4,
b23 is an integer from 0 to 3,
b22 is an integer from 0 to 2,
b20 is an integer from 0 to 20,
*' indicates a binding site to M in Formula 1, and
*" indicates a binding site to a neighboring atom,
$L_{11}$ and $L_{13}$ are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$,
$R_1$ to $R_3$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$,
b1 is an integer from 0 to 20,
b2 is an integer from 0 to 4,
$T_1$ is a carbazole group unsubstituted or substituted with at least one $R_{10a}$,
c1 is an integer from 1 to 5,
two or more of a plurality of $R_2$(s) are optionally linked to each other to form a $C_5$-$C_{30}$ carbocyclic group that is unsubstituted or substituted with at least one $R_{10a}$ or two or more of a plurality of $R_2$(s) are optionally linked to each other to form a $C_1$-$C_{30}$ heterocyclic group that is unsubstituted or substituted with at least one $R_{10a}$, two or more of $R_1$ to $R_3$ are optionally linked to each other to form a $C_5$-$C_{30}$ carbocyclic group that is unsubstituted or substituted with at least one $R_{10a}$ or two or more of $R_1$ to $R_3$ are optionally linked to each other to form a $C_1$-$C_{30}$ heterocyclic group that is unsubstituted or substituted with at least one $R_{10a}$, $R_{10a}$ is the same as described in connection with $R_1$,

*and *'' each indicate a binding site to M in Formula 1, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group are each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$); or —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); wherein $Q_1$ to $Q_9$, $Q_{11}$ to $Q_{19}$, $Q_{21}$ to $Q_{29}$, and $Q_{31}$ to $Q_{39}$ are each independently:

hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group, wherein the group represented by:

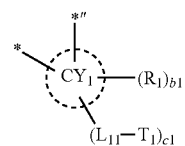

in Formula 2 is a group represented by one of Formulae CY1-11, CY1-12, CY1-17, CY1-18, CY1-23, CY1-24, CY1-29, CY1-30, CY1-35, CY1-36, CY1-41, or CY1-42:

CY1-11
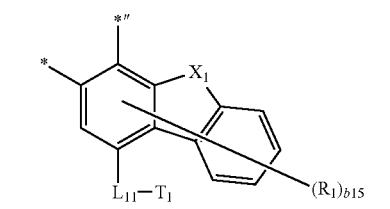
CY1-12
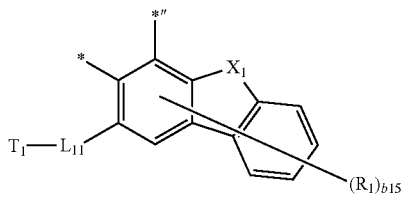
CY1-17
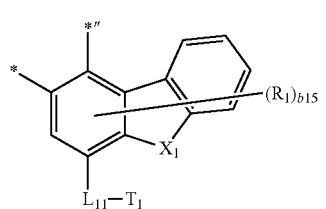
CY1-18
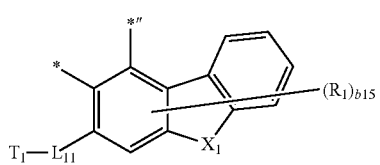
CY1-23
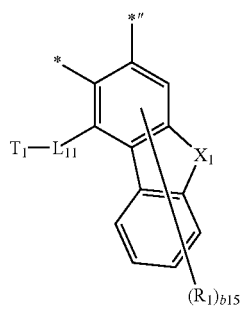
CY1-24
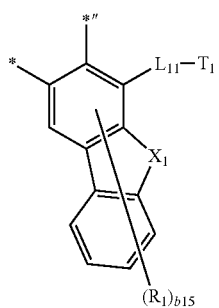
CY1-29
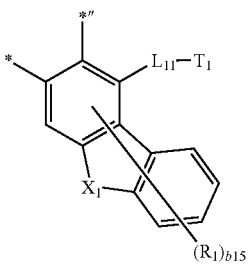
CY1-30
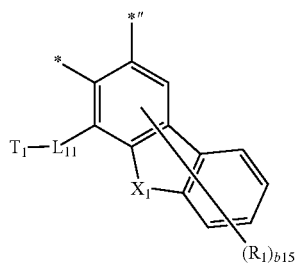
CY1-35
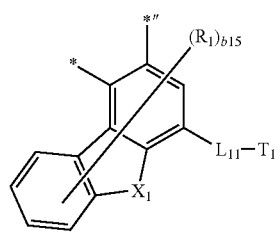
CY1-36
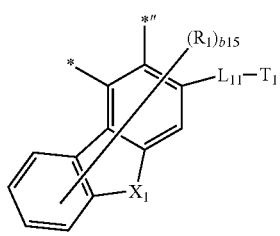
CY1-41
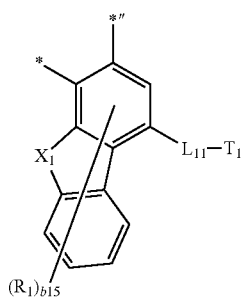
CY1-42
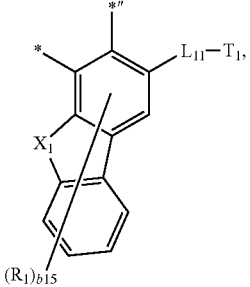

wherein $X_1$ is O, S, $N(R_{18})$, $C(R_{18})(R_{19})$, or $Si(R_{18})(R_{19})$, and $R_{18}$ and $R_{19}$ are each the same as described in connection with $R_1$.

2. The organometallic compound of claim 1, wherein $L_{11}$ and $L_{13}$ are each independently:
a single bond; or
a benzene group, a naphthalene group, a pyridine group, a dibenzofuran group, a dibenzothiophene group, or a carbazole group, each unsubstituted or substituted with at least one $R_{10a}$.

3. The organometallic compound of claim 1, wherein ring $CY_1$ is one of Formulae CY1-11 or CY1-12.

4. The organometallic compound of claim 1, wherein
$R_2$ is hydrogen, deuterium, —F, a cyano group, a substituted or unsubstituted $C_1$-$C_{60}$ alkyl group, a substituted or unsubstituted $C_3$-$C_{10}$ cycloalkyl group, —$Si(Q_3)(Q_4)(Q_5)$, or —$Ge(Q_3)(Q_4)(Q_5)$, and
$R_3$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

5. The organometallic compound of claim 1, wherein $T_1$ is a group represented by Formula 3:

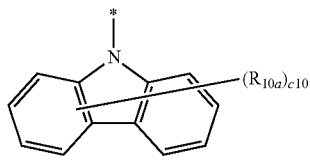

Formula 3 wherein, in Formula 3,
c10 is an integer from 0 to 8, and
* indicates a binding site to a neighboring atom.

6. The organometallic compound of claim 1, wherein $L_2$ in Formula 1 is a bidentate ligand of which two atoms are each bonded to M in Formula 1 via O, S, Se, N, C, P, Si, or As.

7. The organometallic compound of claim 1, wherein $L_2$ in Formula 1 may be a bidentate ligand of which two atoms are each bonded to M in Formula 1 via N and C or a bidentate ligand of which two atoms are each bonded to M in Formula 1 via two O(s).

8. The organometallic compound of claim 1, wherein $L_2$ in Formula 1 is a group represented by one of Formulae 3A to 3F:

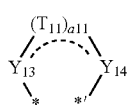

3A

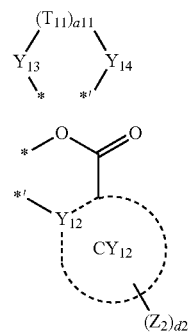

3B

3C

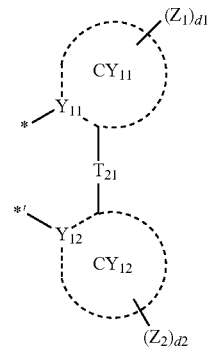

3D

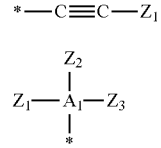

3E

*—C≡C—$Z_1$

3F $Z_1$—$A_1$—$Z_3$ with $Z_2$ above and * below wherein, in Formulae 3A to 3F,
$Y_{13}$ is O, N, $N(Z_1)$, $P(Z_1)(Z_2)$, or $As(Z_1)(Z_2)$,
$Y_{14}$ is O, N, $N(Z_3)$, $P(Z_3)(Z_4)$, or $As(Z_3)(Z_4)$,
$T_{11}$ is a single bond, a double bond, —$C(Z_{11})(Z_{12})$—, —$C(Z_{11})$=$C(Z_{12})$—, =$C(Z_{11})$—, —$C(Z_{11})$=, =$C(Z_{11})$—$C(Z_{12})$=$C(Z_{13})$—, —$C(Z_{11})$=$C(Z_{12})$—$C(Z_{13})$=, —$N(Z_{11})$—', or a $C_5$-$C_{30}$ carbocyclic group unsubstituted or substituted with at least one $Z_{11}$,
a11 is an integer from 1 to 10, and when a11 is 2 or more, two or more of $T_{11}$(s) are identical to or different from each other,
$Y_{11}$ and $Y_{12}$ are each independently C or N,
$T_{21}$ is a single bond, a double bond, O, S, $C(Z_{11})(Z_{12})$, $Si(Z_{11})(Z_{12})$, or $N(Z_{11})$,
ring $CY_{11}$ and ring $CY_{12}$ are each independently a $C_5$-$C_{30}$ carbocyclic group or a $C_1$-$C_{30}$ heterocyclic group,
$A_1$ is P or As,
$Z_1$ to $Z_4$ and $Z_{11}$ to $Z_{13}$ are as described in connection with $R_1$,
d1 and d2 are each independently an integer from 0 to 20, and
* and *' each indicate a binding site to M in Formula 1.

9. The organometallic compound of claim 8, wherein $L_2$ is a ligand represented by Formula 3D, and
at least one of $Z_1$ or $Z_2$ in Formula 3D is each independently: deuterium; —$Si(Q_3)(Q_4)(Q_5)$; —$Ge(Q_3)(Q_4)(Q_5)$; or a $C_1$-$C_{60}$ alkyl group substituted with at least one deuterium.

10. The organometallic compound of claim 8, wherein $L_2$ is a group represented by one of Formulae 3-1 or 3-101 to 3-112:

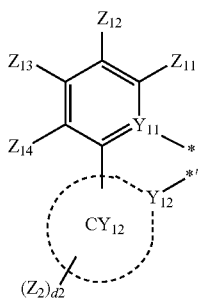
3-1

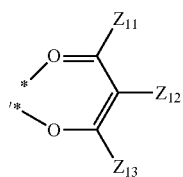
3-101

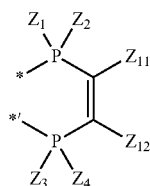
3-102

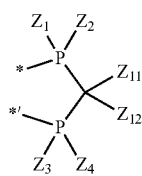
3-103

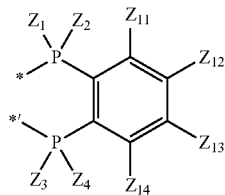
3-104

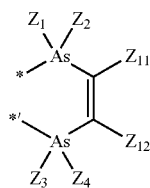
3-105

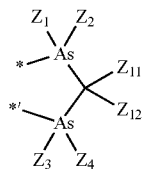
3-106

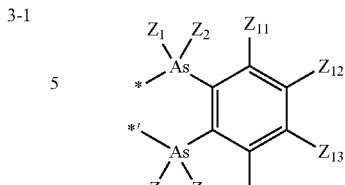
3-107

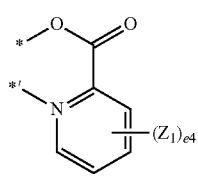
3-108

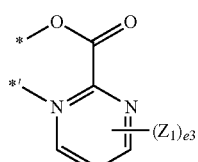
3-109

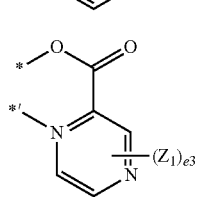
3-110

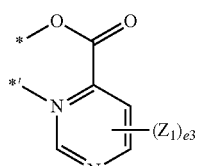
3-111

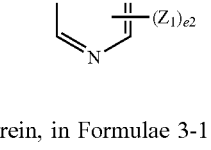
3-112 wherein, in Formulae 3-1 and 3-101 to 3-112, $Z_{14}$ is the same as described in connection with $Z_1$, e2 is an integer from 0 to 2, e3 is an integer from 0 to 3, e4 is an integer from 0 to 4, and

* and *' each indicate a binding site to M in Formula 1.

11. The organometallic compound of claim 10, wherein $Z_{12}$ in Formula 3-1 is:

—Si($Q_3$)($Q_4$)($Q_5$); —Ge($Q_3$)($Q_4$)($Q_5$); or a $C_1$-$C_{60}$ alkyl group substituted with at least one deuterium.

12. The organometallic compound of claim 10, wherein $Z_{12}$ in Formula 3-1 is:

—Si($Q_3$)($Q_4$)($Q_5$) or —Ge($Q_3$)($Q_4$)($Q_5$), and $Z_{13}$ is not hydrogen or a methyl group.

13. The organometallic compound of claim 10, wherein a group represented by:

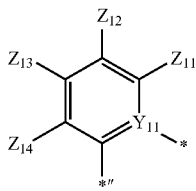
in Formula 3-1 is a group represented by one of Formulae 3-1-1 to 3-1-16, and
a group represented by:
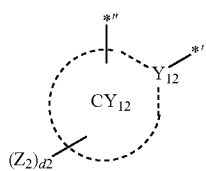
in Formula 3-1 is a group represented by one of Formulae 3-1(1) to 3-1(16):
3-1-1
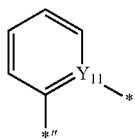
3-1-2
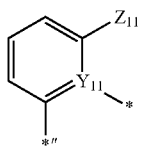
3-1-3
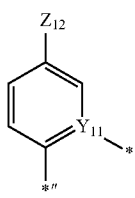
3-1-4
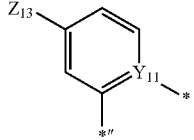
3-1-5
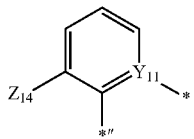
3-1-6
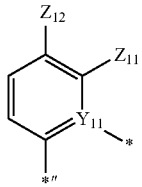
3-1-7
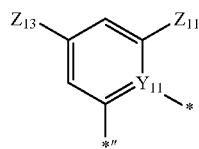
3-1-8
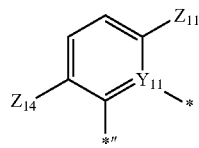
3-1-9
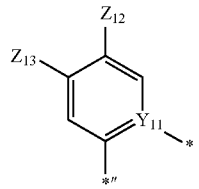
3-1-10
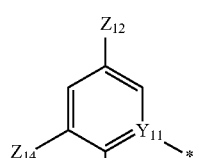
3-1-11
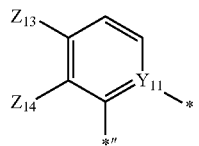
3-1-12
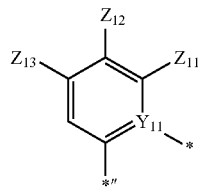
3-1-13
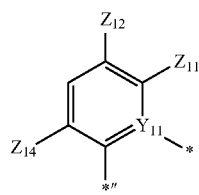
3-1-14
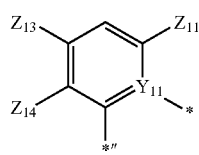
3-1-15
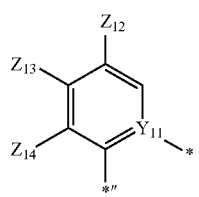

-continued
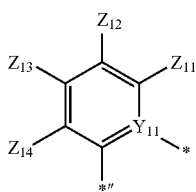
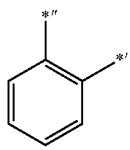
3-1(1)
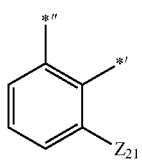
3-1(2)
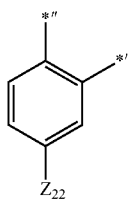
3-1(3)
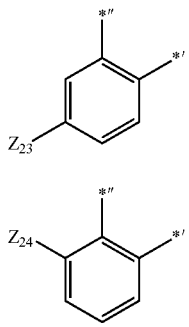
3-1(4)
3-1(5)
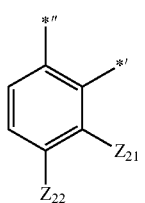
3-1(6)
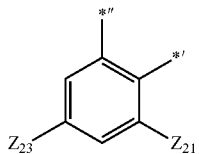
3-1(7)
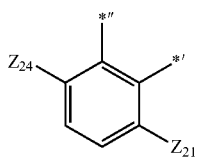
3-1(8)
-continued
3-1-16
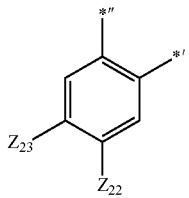
3-1(9)
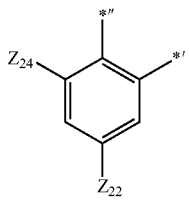
3-1(10)
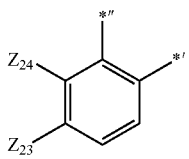
3-1(11)
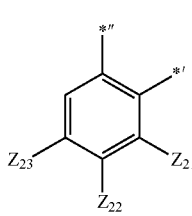
3-1(12)
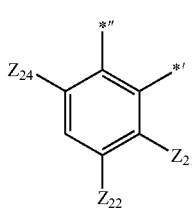
3-1(13)
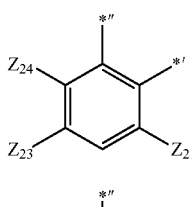
3-1(14)
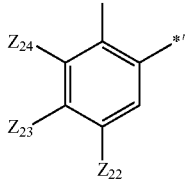
3-1(15)
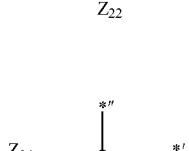
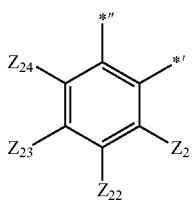
3-1(16)

wherein, in Formulae 3-1-1 to 3-1-16 and 3-1(1) to 3-1(16),
$Z_{21}$ to $Z_{24}$ are each as described in connection with $Z_2$,
wherein $Z_{11}$ to $Z_{14}$ and $Z_{21}$ to $Z_{24}$ are each not hydrogen,
* and *' each indicate a binding site to M in Formula 1, and
*'' indicates a binding site to a neighboring atom.

14. An organic light-emitting device comprising:
a first electrode;
a second electrode; and
an organic layer located between the first electrode and the second electrode and comprising an emission layer,
wherein the organic layer comprises at least one organometallic compound of claim 1.

15. The organic light-emitting device of claim 14, wherein
the first electrode is an anode,
the second electrode is a cathode,
the organic layer further comprises a hole transport region located between the first electrode and the emission layer and an electron transport region located between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.

16. The organic light-emitting device of claim 14, wherein the emission layer comprises the at least one organometallic compound.

17. An electronic apparatus, comprising the organic light-emitting device of claim 14.

* * * * *